United States Patent
Shiraishi

(10) Patent No.: US 8,525,971 B2
(45) Date of Patent: *Sep. 3, 2013

(54) LITHOGRAPHIC APPARATUS WITH CLEANING OF SUBSTRATE TABLE

(75) Inventor: Kenichi Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/767,441

(22) Filed: Jun. 22, 2007

(65) Prior Publication Data

US 2007/0242247 A1   Oct. 18, 2007

Related U.S. Application Data

(62) Division of application No. 11/570,219, filed as application No. PCT/JP2005/010412 on Jun. 7, 2005.

(30) Foreign Application Priority Data

Jun. 9, 2004   (JP) .................................. 2004-171115

(51) Int. Cl.
   *G03B 27/52*   (2006.01)

(52) U.S. Cl.
   USPC .......................................................... 355/30

(58) Field of Classification Search
   USPC ................... 355/30, 53, 72, 73; 359/509
   See application file for complete search history.

(56) References Cited

U.S. PATENT DOCUMENTS

| 3,139,101 A | 6/1964 | Wyczalek et al. |
|---|---|---|
| 3,648,587 A | 3/1972 | Stevens |
| 4,346,164 A | 8/1982 | Tabarelli et al. |
| 4,465,368 A | 8/1984 | Matsuura et al. |
| 4,480,910 A | 11/1984 | Takanashi et al. |
| 4,509,852 A | 4/1985 | Tabarelli et al. |
| 4,780,747 A | 10/1988 | Suzuki et al. |
| RE32,795 E | 12/1988 | Matsuura et al. |
| 4,825,453 A | 4/1989 | Kembo et al. |
| 5,368,649 A | 11/1994 | Tsukazaki |
| 5,493,403 A | 2/1996 | Nishi |
| 5,528,118 A | 6/1996 | Lee |

(Continued)

FOREIGN PATENT DOCUMENTS

| CN | 1867865 A | 11/2006 |
|---|---|---|
| DE | 221563 A1 | 4/1985 |

(Continued)

OTHER PUBLICATIONS

May 31, 2007 Office Action in U.S. Appl. No. 11/284,187.

(Continued)

*Primary Examiner* — Toan Ton
*Assistant Examiner* — Chia-how Michael Liu
(74) *Attorney, Agent, or Firm* — Oliff & Berridge, PLC

(57) ABSTRACT

There is provided an exposure apparatus capable of accurately performing an exposure process and a measurement process based on a liquid immersion method. The exposure apparatus (EX), which forms a liquid immersion area (AR2) of a liquid (LQ) on an image surface side of a projection optical system (PL), and exposes a substrate (P) via the projection optical system (PL) and the liquid (LQ) of the immersion area (AR2), is provided with a measuring device (60) which measures at least one of a property and composition of the liquid (LQ) for forming the liquid immersion area (AR2).

25 Claims, 10 Drawing Sheets

(56) References Cited

U.S. PATENT DOCUMENTS

| | | | |
|---|---|---|---|
| 5,610,683 | A | 3/1997 | Takahashi |
| 5,623,853 | A | 4/1997 | Novak et al. |
| 5,646,413 | A | 7/1997 | Nishi |
| 5,657,129 | A | 8/1997 | Nishi |
| 5,715,039 | A | 2/1998 | Fukuda et al. |
| 5,744,924 | A | 4/1998 | Lee |
| 5,774,575 | A | 6/1998 | Tanaka et al. |
| 5,815,246 | A | 9/1998 | Sperling et al. |
| 5,825,043 | A | 10/1998 | Suwa |
| 5,844,247 | A | 12/1998 | Nishi |
| 5,874,820 | A | 2/1999 | Lee |
| 5,942,871 | A | 8/1999 | Lee |
| 5,958,143 | A | 9/1999 | Weber et al. |
| 5,969,441 | A | 10/1999 | Loopstra et al. |
| 5,980,647 | A | 11/1999 | Buker et al. |
| 5,982,128 | A | 11/1999 | Lee |
| 5,995,234 | A | 11/1999 | Nishi |
| 6,008,500 | A | 12/1999 | Lee |
| 6,020,710 | A | 2/2000 | Lee |
| 6,033,478 | A | 3/2000 | Kholodenko |
| 6,049,186 | A | 4/2000 | Lee |
| 6,051,843 | A | 4/2000 | Nishi |
| 6,087,797 | A | 7/2000 | Lee |
| 6,150,787 | A | 11/2000 | Lee |
| 6,151,105 | A | 11/2000 | Lee |
| 6,175,404 | B1 | 1/2001 | Lee |
| 6,178,974 | B1 | 1/2001 | Kobayashi et al. |
| 6,188,195 | B1 | 2/2001 | Lee |
| 6,191,429 | B1 | 2/2001 | Suwa |
| 6,195,154 | B1 | 2/2001 | Imai |
| 6,208,407 | B1 | 3/2001 | Loopstra |
| 6,246,202 | B1 | 6/2001 | Lee |
| 6,262,796 | B1 | 7/2001 | Loopstra et al. |
| 6,268,904 | B1 | 7/2001 | Mori et al. |
| 6,271,640 | B1 | 8/2001 | Lee |
| 6,279,881 | B1 | 8/2001 | Nishi |
| 6,281,654 | B1 | 8/2001 | Lee |
| 6,307,620 | B1 | 10/2001 | Takabayashi et al. |
| 6,316,901 | B2 | 11/2001 | Lee |
| 6,327,025 | B1 | 12/2001 | Imai |
| 6,341,007 | B1 | 1/2002 | Nishi et al. |
| 6,400,441 | B1 | 6/2002 | Nishi et al. |
| 6,446,365 | B1 | 9/2002 | Sullivan et al. |
| 6,459,472 | B1 | 10/2002 | De Jager et al. |
| 6,459,672 | B1 | 10/2002 | Asoma |
| 6,466,365 | B1 | 10/2002 | Maier et al. |
| 6,496,257 | B1 | 12/2002 | Taniguchi et al. |
| 6,496,259 | B2 | 12/2002 | Barish |
| 6,498,352 | B1 | 12/2002 | Nishi |
| 6,549,269 | B1 | 4/2003 | Nishi et al. |
| 6,590,634 | B1 | 7/2003 | Nishi et al. |
| 6,683,433 | B2 | 1/2004 | Lee |
| 6,721,674 | B2 | 4/2004 | Borzsonyi |
| 6,747,732 | B1 | 6/2004 | Lee |
| 6,778,257 | B2 | 8/2004 | Bleeker et al. |
| 6,781,670 | B2 | 8/2004 | Krautschik |
| 6,788,477 | B2 | 9/2004 | Lin |
| 6,798,491 | B2 | 9/2004 | Nishi et al. |
| 6,841,965 | B2 | 1/2005 | Lee |
| 6,844,206 | B1 | 1/2005 | Phan et al. |
| 6,853,794 | B2 | 2/2005 | Lu et al. |
| 6,878,916 | B2 | 4/2005 | Schuster |
| 6,891,596 | B2 | 5/2005 | Rostalski et al. |
| 6,891,683 | B2 | 5/2005 | Schuster |
| 6,914,665 | B2 | 7/2005 | Ishikawa |
| 6,927,840 | B2 | 8/2005 | Lee |
| 6,952,253 | B2 | 10/2005 | Lof et al. |
| 6,989,647 | B1 | 1/2006 | Lee |
| 7,029,832 | B2 | 4/2006 | Rolland et al. |
| 7,061,573 | B2 | 6/2006 | Tsukamoto |
| 7,061,575 | B2 | 6/2006 | Taniguchi et al. |
| 7,070,915 | B2 | 7/2006 | Ho et al. |
| 7,075,616 | B2 | 7/2006 | Derksen et al. |
| 7,092,069 | B2 | 8/2006 | Schuster |
| 7,145,641 | B2 | 12/2006 | Kroon et al. |
| 7,145,671 | B2 | 12/2006 | Phillips et al. |
| 7,154,676 | B2 | 12/2006 | Schuster |
| 7,177,008 | B2 | 2/2007 | Nishi et al. |
| 7,190,527 | B2 | 3/2007 | Rostalski et al. |
| 7,199,858 | B2 * | 4/2007 | Lof et al. .................. 355/30 |
| 7,203,008 | B2 | 4/2007 | Schuster |
| 7,224,427 | B2 | 5/2007 | Chang et al. |
| 7,256,869 | B2 | 8/2007 | Nishi |
| 7,262,422 | B2 | 8/2007 | Subramanian et al. |
| 7,312,847 | B2 | 12/2007 | Rostalski et al. |
| 7,317,504 | B2 * | 1/2008 | De Smit et al. ............ 355/30 |
| RE40,043 | E | 2/2008 | Kwan et al. |
| 7,339,743 | B2 | 3/2008 | Schuster |
| 7,365,513 | B1 | 4/2008 | Lee |
| 7,379,158 | B2 | 5/2008 | Mizutani et al. |
| 7,382,540 | B2 | 6/2008 | Rostalski et al. |
| 7,388,649 | B2 | 6/2008 | Kobayashi et al. |
| 7,433,015 | B2 | 10/2008 | Mulkens et al. |
| 7,433,019 | B2 | 10/2008 | Kiuchi et al. |
| 7,436,486 | B2 | 10/2008 | Hirukawa |
| 7,436,487 | B2 | 10/2008 | Mizutani et al. |
| 7,442,908 | B2 | 10/2008 | Schuster |
| 7,446,851 | B2 | 11/2008 | Hirukawa |
| 7,460,207 | B2 | 12/2008 | Mizutani et al. |
| 7,463,330 | B2 | 12/2008 | Streefkerk et al. |
| 7,483,117 | B2 | 1/2009 | Hirukawa |
| 7,495,840 | B2 | 2/2009 | Schuster |
| 7,505,111 | B2 | 3/2009 | Hirukawa et al. |
| 7,522,259 | B2 | 4/2009 | Hazelton et al. |
| 7,589,820 | B2 | 9/2009 | Nei et al. |
| 7,589,821 | B2 | 9/2009 | Hirukawa |
| 7,639,343 | B2 | 12/2009 | Hirukawa |
| 2001/0015021 | A1 | 8/2001 | Gommori et al. |
| 2001/0019250 | A1 | 9/2001 | Lee |
| 2001/0019399 | A1 | 9/2001 | Hagiwara |
| 2001/0030522 | A1 | 10/2001 | Lee |
| 2001/0043320 | A1 | 11/2001 | Kato et al. |
| 2002/0017889 | A1 | 2/2002 | Lee |
| 2002/0041377 | A1 | 4/2002 | Hagiwara et al. |
| 2002/0061469 | A1 | 5/2002 | Tanaka |
| 2002/0163629 | A1 | 11/2002 | Switkes et al. |
| 2003/0011763 | A1 | 1/2003 | Taniguchi et al. |
| 2003/0030916 | A1 | 2/2003 | Suenaga |
| 2003/0066975 | A1 | 4/2003 | Okada |
| 2003/0157538 | A1 | 8/2003 | Krull et al. |
| 2003/0174408 | A1 | 9/2003 | Rostalski et al. |
| 2004/0000627 | A1 | 1/2004 | Schuster |
| 2004/0004757 | A1 | 1/2004 | Schuster |
| 2004/0021061 | A1 | 2/2004 | Bijkerk |
| 2004/0032575 | A1 | 2/2004 | Nishi et al. |
| 2004/0041377 | A1 | 3/2004 | Kumakiri et al. |
| 2004/0075895 | A1 | 4/2004 | Lin |
| 2004/0090606 | A1 | 5/2004 | Ishikawa |
| 2004/0095085 | A1 | 5/2004 | Lee |
| 2004/0109237 | A1 | 6/2004 | Epple et al. |
| 2004/0114117 | A1 | 6/2004 | Bleeker |
| 2004/0118184 | A1 | 6/2004 | Violette |
| 2004/0119954 | A1 | 6/2004 | Kawashima et al. |
| 2004/0120051 | A1 | 6/2004 | Schuster |
| 2004/0125351 | A1 | 7/2004 | Krautschik |
| 2004/0136494 | A1 | 7/2004 | Lof et al. |
| 2004/0160582 | A1 | 8/2004 | Lof et al. |
| 2004/0165159 | A1 | 8/2004 | Lof et al. |
| 2004/0169834 | A1 | 9/2004 | Richter et al. |
| 2004/0169924 | A1 | 9/2004 | Flagello et al. |
| 2004/0180294 | A1 | 9/2004 | Baba-Ali et al. |
| 2004/0180299 | A1 | 9/2004 | Rolland et al. |
| 2004/0207824 | A1 | 10/2004 | Lof et al. |
| 2004/0211920 | A1 | 10/2004 | Maria Derksen et al. |
| 2004/0224265 | A1 | 11/2004 | Endo et al. |
| 2004/0224525 | A1 | 11/2004 | Endo et al. |
| 2004/0227923 | A1 | 11/2004 | Flagello et al. |
| 2004/0233405 | A1 | 11/2004 | Kato et al. |
| 2004/0233407 | A1 | 11/2004 | Nishi et al. |
| 2004/0238005 | A1 | 12/2004 | Takayama |
| 2004/0253547 | A1 | 12/2004 | Endo et al. |
| 2004/0253548 | A1 | 12/2004 | Endo et al. |
| 2004/0257544 | A1 | 12/2004 | Vogel et al. |
| 2004/0259008 | A1 | 12/2004 | Endo et al. |

| | | |
|---|---|---|
| 2004/0259040 A1 | 12/2004 | Endo et al. |
| 2004/0263808 A1 | 12/2004 | Sewell |
| 2005/0002009 A1 | 1/2005 | Lee |
| 2005/0007569 A1 | 1/2005 | Streefkerk et al. |
| 2005/0018208 A1 | 1/2005 | Levinson |
| 2005/0024609 A1 | 2/2005 | De Smit et al. |
| 2005/0025108 A1 | 2/2005 | Dillinger et al. |
| 2005/0028314 A1* | 2/2005 | Hickman et al. ............. 15/302 |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0078286 A1 | 4/2005 | Dierichs et al. |
| 2005/0084794 A1 | 4/2005 | Meagley et al. |
| 2005/0094115 A1 | 5/2005 | Taniguchi et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0111108 A1 | 5/2005 | Schuster |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0178944 A1 | 8/2005 | Schuster |
| 2005/0179877 A1 | 8/2005 | Mulkens et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219488 A1 | 10/2005 | Nei et al. |
| 2005/0219499 A1 | 10/2005 | Maria Zaal et al. |
| 2005/0225735 A1 | 10/2005 | Magome et al. |
| 2005/0225737 A1 | 10/2005 | Weissenrieder et al. |
| 2005/0231694 A1 | 10/2005 | Kolesnychenko et al. |
| 2005/0231813 A1 | 10/2005 | Rostalski et al. |
| 2005/0231814 A1 | 10/2005 | Rostalski et al. |
| 2005/0237501 A1 | 10/2005 | Furukawa et al. |
| 2005/0243292 A1 | 11/2005 | Baselmans et al. |
| 2005/0243293 A1 | 11/2005 | Hara et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259234 A1 | 11/2005 | Hirukawa et al. |
| 2005/0264774 A1 | 12/2005 | Mizutani et al. |
| 2005/0270505 A1 | 12/2005 | Smith |
| 2006/0023182 A1 | 2/2006 | Novak |
| 2006/0023185 A1 | 2/2006 | Hazelton et al. |
| 2006/0028626 A1 | 2/2006 | Chang et al. |
| 2006/0028628 A1 | 2/2006 | Lin et al. |
| 2006/0050257 A1 | 3/2006 | Honda |
| 2006/0077367 A1 | 4/2006 | Kobayashi et al. |
| 2006/0082744 A1 | 4/2006 | Hirukawa |
| 2006/0098179 A1 | 5/2006 | Hirukawa |
| 2006/0119813 A1 | 6/2006 | Hultermans et al. |
| 2006/0119816 A1 | 6/2006 | Baselmans et al. |
| 2006/0119820 A1 | 6/2006 | Hirukawa |
| 2006/0126043 A1 | 6/2006 | Mizutani et al. |
| 2006/0126044 A1 | 6/2006 | Mizutani et al. |
| 2006/0132731 A1 | 6/2006 | Jansen et al. |
| 2006/0132738 A1 | 6/2006 | Hirukawa |
| 2006/0139594 A1 | 6/2006 | Hara et al. |
| 2006/0152696 A1 | 7/2006 | Boogaard et al. |
| 2006/0154183 A1 | 7/2006 | Magome |
| 2006/0164615 A1 | 7/2006 | Hirukawa |
| 2006/0209278 A1 | 9/2006 | Kiuchi et al. |
| 2006/0232757 A1 | 10/2006 | Tani et al. |
| 2006/0238730 A1 | 10/2006 | Nei et al. |
| 2007/0019301 A1 | 1/2007 | Schuster |
| 2007/0064210 A1 | 3/2007 | Kobayashi et al. |
| 2007/0076183 A1 | 4/2007 | Hara et al. |
| 2007/0109515 A1 | 5/2007 | Nishi |
| 2007/0115447 A1 | 5/2007 | Hirukawa et al. |
| 2007/0115448 A1 | 5/2007 | Hirukawa et al. |
| 2007/0127001 A1 | 6/2007 | Van Der Hoeven |
| 2007/0132968 A1 | 6/2007 | Kobayashi et al. |
| 2007/0159610 A1 | 7/2007 | Shiraishi |
| 2007/0171390 A1 | 7/2007 | Hazelton et al. |
| 2007/0171391 A1 | 7/2007 | Magome et al. |
| 2007/0188880 A1 | 8/2007 | Schuster |
| 2007/0242247 A1 | 10/2007 | Shiraishi |
| 2007/0247600 A1 | 10/2007 | Kobayashi et al. |
| 2007/0247601 A1 | 10/2007 | Hazelton et al. |
| 2007/0247722 A1 | 10/2007 | Rostalski et al. |
| 2007/0252960 A1 | 11/2007 | Kida |
| 2007/0258064 A1 | 11/2007 | Hirukawa |
| 2007/0263196 A1 | 11/2007 | Hirukawa et al. |
| 2008/0018867 A1 | 1/2008 | Fujiwara et al. |
| 2008/0030695 A1 | 2/2008 | Kobayashi et al. |
| 2008/0030696 A1 | 2/2008 | Kobayashi et al. |
| 2008/0151203 A1 | 6/2008 | Hirukawa et al. |
| 2008/0180053 A1 | 7/2008 | Lee |
| 2008/0225249 A1 | 9/2008 | Kobayashi et al. |
| 2008/0225250 A1 | 9/2008 | Kobayashi et al. |
| 2008/0231825 A1 | 9/2008 | Kobayashi et al. |
| 2008/0309896 A1 | 12/2008 | Hirukawa |
| 2009/0002660 A1 | 1/2009 | Kiuchi |
| 2009/0015807 A1 | 1/2009 | Hirukawa et al. |
| 2009/0021707 A1 | 1/2009 | Mulkens et al. |
| 2009/0027636 A1 | 1/2009 | Leenders et al. |
| 2009/0104568 A1 | 4/2009 | Hirukawa |
| 2009/0128793 A1 | 5/2009 | Hara et al. |
| 2009/0180089 A1 | 7/2009 | Nei et al. |

FOREIGN PATENT DOCUMENTS

| | | |
|---|---|---|
| DE | 224448 A1 | 7/1985 |
| EP | 0 023 231 A1 | 2/1981 |
| EP | 0 605 103 A1 | 7/1994 |
| EP | 0 834 773 A2 | 4/1998 |
| EP | 0 874 283 A2 | 10/1998 |
| EP | 1 329 773 A2 | 7/2003 |
| EP | 1 420 298 A2 | 5/2004 |
| EP | 1 420 299 A2 | 5/2004 |
| EP | 1 429 188 A2 | 6/2004 |
| EP | 1 486 827 A2 | 12/2004 |
| EP | 1 522 894 A2 | 4/2005 |
| EP | 1 524 558 A1 | 4/2005 |
| EP | 1 571 694 A1 | 9/2005 |
| EP | 1 571 695 A1 | 9/2005 |
| EP | 1 571 699 A1 | 9/2005 |
| EP | 1571697 A1 | 9/2005 |
| EP | 1 624 481 A1 | 2/2006 |
| EP | 1 628 161 A2 | 2/2006 |
| EP | 1 628 330 A1 | 2/2006 |
| EP | 1628329 A1 | 2/2006 |
| EP | 1 632 991 A1 | 3/2006 |
| EP | 1 670 039 A1 | 6/2006 |
| EP | 1667211 A1 | 6/2006 |
| EP | 1 699 073 A1 | 9/2006 |
| EP | 1 727 188 A1 | 11/2006 |
| EP | 1 821 337 A1 | 8/2007 |
| JP | 57-117238 | 7/1982 |
| JP | A-57-177238 | 7/1982 |
| JP | A-57-153433 | 9/1982 |

| | | | | | | | |
|---|---|---|---|---|---|---|---|
| JP | 58-202448 A | 11/1983 | | JP | A-2005-72404 | 3/2005 | |
| JP | A-58-202448 | 11/1983 | | JP | A-2005-79222 | 3/2005 | |
| JP | 59-19912 A | 2/1984 | | JP | A-2005-79584 | 3/2005 | |
| JP | A-59-19912 | 2/1984 | | JP | A-2005-101487 | 4/2005 | |
| JP | 62-65326 A | 3/1987 | | JP | 2005/136404 | 5/2005 | |
| JP | A-62-65326 | 3/1987 | | JP | A-2005-136404 | 5/2005 | |
| JP | A-62-183522 | 8/1987 | | JP | A-2005-183693 | 7/2005 | |
| JP | A-63-73628 | 4/1988 | | JP | A-2005-277363 | 10/2005 | |
| JP | 63-157419 A | 6/1988 | | JP | A-2006-190997 | 7/2006 | |
| JP | A-63-157419 | 6/1988 | | WO | WO 98/24115 | 6/1998 | |
| JP | 04-065603 | 2/1992 | | WO | WO 98/28665 | 7/1998 | |
| JP | A-4-065603 | 3/1992 | | WO | WO 98/58079 | 12/1998 | |
| JP | 4-305915 A | 10/1992 | | WO | WO 98/59364 | 12/1998 | |
| JP | 4-305917 A | 10/1992 | | WO | WO 99/27568 A1 | 6/1999 | |
| JP | A-4-305915 | 10/1992 | | WO | WO 99/32940 | 7/1999 | |
| JP | A-4-305917 | 10/1992 | | WO | WO 99/49504 A1 | 9/1999 | |
| JP | 5-62877 A | 3/1993 | | WO | WO 01/35168 | 5/2001 | |
| JP | A-5-62877 | 3/1993 | | WO | WO 02/063664 A1 | 8/2002 | |
| JP | A-05-100182 | 4/1993 | | WO | WO 02/091078 A1 | 11/2002 | |
| JP | A-5-304072 | 11/1993 | | WO | WO 03/077036 A1 | 9/2003 | |
| JP | 06-053120 | 2/1994 | | WO | WO 03/077037 A1 | 9/2003 | |
| JP | A-6-53120 | 2/1994 | | WO | WO 2004/019128 A2 | 3/2004 | |
| JP | 6-124873 A | 5/1994 | | WO | WO 2004/051717 | 6/2004 | |
| JP | A-6-124873 | 5/1994 | | WO | WO 2004/053952 A1 | 6/2004 | |
| JP | A-6-168866 | 6/1994 | | WO | WO 2004/053953 A1 | 6/2004 | |
| JP | A-6-181157 | 6/1994 | | WO | WO 2004/053955 A1 | 6/2004 | |
| JP | 06-188169 | 7/1994 | | WO | WO 2004/053958 A1 | 6/2004 | |
| JP | A-6-188169 | 7/1994 | | WO | WO 2004/055803 A1 | 7/2004 | |
| JP | A-7-132262 | 5/1995 | | WO | WO 2004/057589 A1 | 7/2004 | |
| JP | 07-176468 | 7/1995 | | WO | WO 2004/057590 A1 | 7/2004 | |
| JP | A-7-176468 | 7/1995 | | WO | WO 2004/077154 A2 | 9/2004 | |
| JP | 07-220990 A | 8/1995 | | WO | WO 2004/081666 A1 | 9/2004 | |
| JP | A-7-220990 | 8/1995 | | WO | WO 2004/090577 A2 | 10/2004 | |
| JP | A-8-037149 | 2/1996 | | WO | WO 2004/090633 A1 | 10/2004 | |
| JP | 08-115868 A1 | 5/1996 | | WO | WO 2004/090634 A2 | 10/2004 | |
| JP | 08-037149 | 6/1996 | | WO | WO 2004/092830 A2 | 10/2004 | |
| JP | 08-166475 A | 6/1996 | | WO | WO 2004/092833 A2 | 10/2004 | |
| JP | A-8-166475 | 6/1996 | | WO | WO 2004/093130 A2 | 10/2004 | |
| JP | A-8-195375 | 7/1996 | | WO | WO 2004/093159 A2 | 10/2004 | |
| JP | 08-316125 A | 11/1996 | | WO | WO 2004/093160 A2 | 10/2004 | |
| JP | A-8-316125 | 11/1996 | | WO | WO 2004/095135 A2 | 11/2004 | |
| JP | 08-330224 A | 12/1996 | | WO | WO 2004-105107 | 12/2004 | |
| JP | A-8-330224 | 12/1996 | | WO | WO 2004/105107 A1 | 12/2004 | |
| JP | A-10-116760 | 5/1998 | | WO | WO 2004/107417 A2 | 12/2004 | |
| JP | 10-163099 | 6/1998 | | WO | WO 2005/001432 A2 | 1/2005 | |
| JP | A-10-154659 | 6/1998 | | WO | WO 2005/003864 A2 | 1/2005 | |
| JP | A-10-163099 | 6/1998 | | WO | WO 2005/006026 A2 | 1/2005 | |
| JP | 10-214783 A | 8/1998 | | WO | WO 2005/006417 A1 | 1/2005 | |
| JP | A-10-214783 | 8/1998 | | WO | WO 2005/008339 A2 | 1/2005 | |
| JP | A-10-255319 | 9/1998 | | WO | WO 2005/013008 A2 | 2/2005 | |
| JP | 10-303114 | * 11/1998 | | WO | WO 2005/015283 A1 | 2/2005 | |
| JP | 10-303114 A | 11/1998 | | WO | WO 2005/017625 A2 | 2/2005 | |
| JP | A-10-303114 | 11/1998 | | WO | WO 2005/019935 A2 | 3/2005 | |
| JP | 10-340846 A | 12/1998 | | WO | WO 2005/022266 A2 | 3/2005 | |
| JP | A-10-340846 | 12/1998 | | WO | WO 2005-022615 | 3/2005 | |
| JP | A-11-16816 | 1/1999 | | WO | WO 2005/022615 A1 | 3/2005 | |
| JP | 11-016816 | 2/1999 | | WO | WO 2005/024325 A2 | 3/2005 | |
| JP | A-11-135400 | 5/1999 | | WO | WO 2005/024517 A2 | 3/2005 | |
| JP | A-11-162831 | 6/1999 | | WO | WO 2005/031820 A1 | 4/2005 | |
| JP | A-11-166990 | 6/1999 | | WO | WO 2005/034174 A2 | 4/2005 | |
| JP | 11-176727 A | 7/1999 | | WO | WO 2005/050324 A2 | 6/2005 | |
| JP | A-11-176727 | 7/1999 | | WO | WO 2005/054953 A2 | 6/2005 | |
| JP | A-11-238680 | 8/1999 | | WO | WO 2005/054955 A2 | 6/2005 | |
| JP | A-11-283903 | 10/1999 | | WO | WO 2005/059617 A2 | 6/2005 | |
| JP | 2000-058436 A | 2/2000 | | WO | WO 2005/059618 A2 | 6/2005 | |
| JP | A-2000-58436 | 2/2000 | | WO | WO 2005/059645 A2 | 6/2005 | |
| JP | A-2000-91207 | 3/2000 | | WO | WO 2005/059654 A1 | 6/2005 | |
| JP | A-2000-97616 | 4/2000 | | WO | WO 2005/062128 A2 | 7/2005 | |
| JP | 2000-505958 A | 5/2000 | | WO | WO 2005/064400 A2 | 7/2005 | |
| JP | A-2001-284304 | 10/2001 | | WO | WO 2005/064405 A2 | 7/2005 | |
| JP | A-2001-291855 | 10/2001 | | WO | WO 2005/069055 A2 | 7/2005 | |
| JP | 2002-014005 | 1/2002 | | WO | WO 2005/069078 A1 | 7/2005 | |
| JP | A-2002-14005 | 1/2002 | | WO | WO 2005/069081 A2 | 7/2005 | |
| JP | 2004-007417 | 1/2004 | | WO | WO 2005/071491 A2 | 8/2005 | |
| JP | A-2004-7417 | 1/2004 | | WO | WO 2005/074606 A2 | 8/2005 | |
| JP | A-2005-5713 | 1/2005 | | WO | WO 2005/076084 A1 | 8/2005 | |
| JP | 2005-79222 A | 3/2005 | | WO | WO 2005/076323 A1 | 8/2005 | |
| JP | 2005-079584 | 3/2005 | | WO | WO 2005/081030 A1 | 9/2005 | |
| JP | A-2005-072404 | 3/2005 | | WO | WO 2005/081067 A1 | 9/2005 | |

| | | | |
|---|---|---|---|
| WO | WO 2005/098504 A1 | 10/2005 | |
| WO | WO 2005/098505 A1 | 10/2005 | |
| WO | WO 2005/098506 A1 | 10/2005 | |
| WO | WO 2005/106589 A1 | 11/2005 | |
| WO | WO 2005/111689 A2 | 11/2005 | |
| WO | WO 2005/111722 A2 | 11/2005 | |
| WO | WO 2005/119368 A2 | 12/2005 | |
| WO | WO 2006/062065 A1 | 6/2006 | |

OTHER PUBLICATIONS

Feb. 14, 2008 Notice of Allowance in U.S. Appl. No. 11/284,187.
Jan. 14, 2010 Office Action in U.S. Appl. No. 11/704,340.
May 13, 2009 Office Action in U.S. Appl. No. 11/704,340.
Oct. 8, 2008 Office Action in U.S. Appl. No. 11/808,231.
May 29, 2009 Notice of Allowance in U.S. Appl. No. 11/808,231.
Oct. 21, 2009 Notice of Allowance in U.S. Appl. No. 11/808,231.
Jan. 30, 2008 Office Action in U.S. Appl. No. 11/767,425.
Oct. 31, 2008 Office Action in U.S. Appl. No. 11/767,425.
Jul. 15, 2009 Office Action in U.S. Appl. No. 11/767,425.
Dec. 23, 2008 Office Action in U.S. Appl. No. 12/153,354.
Oct. 21, 2009 Office Action in U.S. Appl. No. 12/153,354.
Jun. 4, 2009 Office Action in U.S. Appl. No. 12/153,357.
Oct. 19, 2009 Office Action in U.S. Appl. No. 11/603,078.
Jan. 13, 2010 Office Action in U.S. Appl. No. 11/808,230.
Feb. 27, 2007 Office Action in U.S. Appl. No. 11/015,767.
Aug. 15, 2007 Office Action in U.S. Appl. No. 11/015,767.
Mar. 17, 2008 Office Action in U.S. Appl. No. 11/015,767.
Nov. 4, 2008 Office Action in U.S. Appl. No. 11/015,767.
Mar. 9, 2009 Office Action in U.S. Appl. No. 11/015,767.
Jun. 29, 2009 Office Action in U.S. Appl. No. 11/015,767.
Dec. 12, 2009 Office Action in U.S. Appl. No. 11/015,767.
Feb. 9, 2007 Office Action in U.S. Appl. No. 11/237,651.
Oct. 10, 2007 Office Action in U.S. Appl. No. 11/237,651.
Nov. 16, 2007 Office Action in U.S. Appl. No. 11/237,651.
Jul. 2, 2008 Office Action in U.S. Appl. No. 11/237,651.
Dec. 9, 2008 Notice of Allowance in U.S. Appl. No. 11/237,651.
Jun. 29, 2007 Office Action in U.S. Appl. No. 11/703,802.
Apr. 10, 2008 Office Action in U.S. Appl. No. 11/812,924.
Nov. 14, 2008 Office Action in U.S. Appl. No. 11/812,924.
Jan. 8, 2010 Office Action in U.S. Appl. No. 12/003,038.
Nov. 17, 2008 Office Action in U.S. Appl. No. 11/570,219.
Apr. 1, 2008 Office Action in U.S. Appl. No. 11/570,219.
Jun. 24, 2009 Office Action in U.S. Appl. No. 11/570,219.
Apr. 4, 2007 Supplementary European Search Report in European Application No. 04 75 9103.
Sep. 14, 2004 International Search Report and Written Opinion in Application No. PCT/JP2004/007417.
Aug. 13, 2009 Supplemental European Search Report in Related Application No. EP 04 73 4624.
Jul. 10, 2009 Office Action in Chinese Application No. 200480009691.6 and English Translation.
Aug. 22, 2008 Office Action in Chinese Application No. 200480009691.6 and English Translation.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Nikon Corporation, Litho Forum, Jan. 28, 2004, "Update on 193 nm immersion exposure tool", S. Owa et al., 51 pages (slides 1-51).
Nikon Corporation, Immersion Lithography Workshop, Dec. 11, 2002, 24 pages (slides 1-24).
Nikon Corporation, Immersion Workshop, Jan. 27, 2004, "Update on 193 nm immersion exposure tool", S. Owa et al., 38 pages (slides 1-38).
Nikon Corporation, $3^{rd}$ 157 nm symposium, Sep. 4, 2002, "Nikon F2 Exposure Tool", Soichi Owa et al., 25 pages (slides 1-25).
Optical Microlithography XVI, Proceedings of SPIE vol. 5040 (2003), "Immersion lithography; its potential performance and issues", Soichi Owa et al., pp. 724-733.
Nikon Corporation, NGL Workshop, Jul. 10, 2003, "Potential performance and feasibility of immersion lithography", Soichi Owa et al., 33 pages, slides 1-33.
M. Switkes, R.R. Kunz, R.F. Sinta, M. Rothschild; P.m. Gallagher-Wetmore, V.J. Krukonis and K. Williams, Immersion Liquids for Lithography in the Deep Ultraviolet, 2003, SPIE, Optical Microlithography XVI, vol. 5040, pp. 690-699.
Mar. 3, 2010 Office Action in U.S. Appl. No. 11/570,219.
Jul. 12, 2007 Office Action in U.S. Appl. No. 11/704,241.
Mar. 17, 2008 Office Action in U.S. Appl. No. 11/704,241.
Sep. 17, 2008 Office Action in U.S. Appl. No. 11/704,241.
Mar. 30, 2009 Office Action in U.S. Appl. No. 11/704,241.
Jul. 8, 2009 Office Action in U.S. Appl. No. 11/704,241.
Mar. 17, 2010 Office Action in U.S. Appl. No. 11/704,241.
Jan. 15, 2010 Office Action in U.S. Appl. No. 12/382,162.
Apr. 8, 2010 Notice of Allowance in U.S. Appl. No. 11/767,425.
Feb. 19, 2010 Notice of Allowance in U.S. Appl. No. 11/808,231.
Dec. 10, 2009 Office Action in U.S. Appl. No. 11/015,767.
Mar. 2, 2010 Office Action in U.S. Appl. No. 12/134,950.
Mar. 23, 2010 Office Action in U.S. Appl. No. 11/630,110.
Aug. 12, 2009 Office Action in U.S. Appl. No. 11/822,964.
Nov. 7, 2008 Office Action in U.S. Appl. No. 11/822,964.
Dec. 5, 2007 Office Action in U.S. Appl. No. 11/822,964.
Dec. 10, 2009 Office Action in U.S. Appl. No. 11/630,110.
Jul. 12, 2010 Notice of Allowance in U.S. Appl. No. 11/767,425.
Jun. 21, 2010 Office Action in U.S. Appl. No. 11/603,078.
Jun. 15, 2010 Notice of Allowance in U.S. Appl. No. 11/808,231.
Aug. 3, 2010 Office Action in U.S. Appl. No. 12/153,357.
U.S. Appl. No. 12/656,456, filed Jan. 29, 2010.
Aug. 21, 2007 European Office Action in European Application No. 04 759 103.7.
Jun. 11, 2008 European Summos to Attend Oral Proceedings in European Application No. 04 759 103.7.
Nov. 21, 2008 European Result of Consultation in European Application No. 04 759 103.7.
Dec. 5, 2008 European Result of Consultation in European Application No. 04 759 103.7.
Jan. 9, 2009 European Rule 71(3) Allowance in European Application No. 04 759 103.7.
Jan. 9, 2009 European Result of Consultation in European Application No. 04 759 103.7.
Feb. 4, 2010 European Search Report in European Application No. 09176909.1.
Feb. 4, 2010 European Search Report in European Application No. 09176910.9.
Feb. 8, 2010 European Search Report in European Application No. 09176911.7.
Feb. 23, 2010 European Search Report in European Application No. 09176913.3.
Mar. 8, 2010 European Search Report in European Application No. 09176912.5.
Mar. 19, 2008 Austrian Invitation to Respond to Written Opinion in Singapore Application No. 200506413-4.
Jan. 21, 2009 Austrian Examination Report in Singapore Application No. 200506413-4.
Mar. 9, 2010 Japanese Office Action in Japanese Application No. 2004-151714, with translation.
Mar. 9, 2010 Japanese Office Action in Japanese Application No. 2006-274330, with translation.
Sep. 20, 2005 International Search Report and Written Opinion in Application No. PCT/JP2005/010412, with translation.
Jun. 9, 2009 Supplementary European Search Report in European Application No. 05749073.2.
Jul. 4, 2008 Chinese Office Action in Chinese Application No. 200580018359.0, with translation.
Jul. 10, 2009 Chinese Office Action in Chinese Application No. 200580018359.0, with translation.
Nov. 24, 2009 Japanese Office Action in Japanese Application No. 2006-509667, with translation.

Mar. 2, 2010 Japanese Office Action in Japanese Application No. 2006-509667, with translation.
Nov. 20, 2009 Chinese Notice of Allowance in Chinese Application No. 200480009691.6, with translation.
Sep. 16, 2005 International Search Report and Written Opinion in Application No. PCT/US04/10309.
Oct. 4, 2005 International Search Report cited in PCT/JP2005/011305.
Feb. 3, 2010 Communication Pursuant to Article 94(3) in European Application No. 04734624.2.
Apr. 16, 2007 Supplemental European Search Report in European Application No. 04759103.7.
Hancock, "Enhance Your Cleaning Process with Ultrasonics", pfonline.com/articles/040003.html, Jan. 21, 2001.
Aug. 27, 2010 Office Action in U.S. Appl. No. 12/382,078.
Sep. 1, 2010 Office Action in U.S. Appl. No. 12/382,162.
Aug. 27, 2010 Office Action in U.S. Appl. No. 12/003,038.
Aug. 27, 2010 Office Action in U.S. Appl. No. 12/379,171.
Aug. 3, 2010 Office Action in Japanese Application No. 2006-274332, with translation.
Aug. 10, 2010 Office Action in Japanese Application No. 2004-151714, with translation.
Aug. 10, 2010 Office Action in Japanese Application No. 2008-164527, with translation.
Aug. 10, 2010 Office Action in Japanese Application No. 2006-274330, with translation.
Aug. 3, 2010 Office Action in Japanese Application No. 2006-514514, with translation.
Sep. 23, 2010 Office Action in U.S. Appl. No. 11/808,230.
Nov. 29, 2010 Notice of Allowance in U.S. Appl. No. 11/704,241.
Nov. 9, 2010 Office Action in Taiwanese Application No. 093114406, with translation.
Dec. 14, 2010 Office Action in Japanese Application No. 2006-514514, with translation.
Mar. 25, 2011 Office Action in U.S. Appl. No. 12/003,038.
Mar. 25, 2011 Office Action in U.S. Appl. No. 12/379,171.
Mar. 25, 2011 Office Action in U.S. Appl. No. 12/382,078.
Mar. 25, 2011 Office Action in U.S. Appl. No. 12/382,162.
Jan. 20, 2011 Office Action in Chinese Application No. 201010113560.X, with translation.
Feb. 8, 2011 Office Action in Japanese Application No. 2006-274330, with translation.
Feb. 9, 2011 Office Action in Korean Application No. 2005-7019365, with translation.
Feb. 14, 2011 Office Action in Korean Application No. 2005-7022146, with translation.
Mar. 24, 2011 Notice of Allowance in U.S. Appl. No. 12/153,357.
Feb. 9, 2011 Office Action in Chinese Patent Application No. 201010127815.8, with translation.
Oct. 21, 2010 Office Action in U.S. Appl. No. 12/153,234.
Oct. 28, 2010 Office Action in U.S. Appl. No. 12/134,950.
Nov. 4, 2010 Office Action in U.S. Appl. No. 11/570,219.
Nov. 5, 2010 Notice of Allowance in U.S. Appl. No. 11/808,231.
Jun. 10, 2011 Office Action issued in U.S. Patent U.S. Appl. No. 11/570,219.
Oct. 24, 2011 Office Action in U.S. Appl. No. 12/003,038.
Oct. 24, 2011 Office Action in U.S. Appl. No. 12/379,171.
Oct. 24, 2011 Office Action in U.S. Appl. No. 12/382,162.
Oct. 25, 2011 Office Action in U.S. Appl. No. 12/382,078.
Jul. 8, 2011 Office Action issued in Korean Application No. 10-2007-7000539 (with translation).
Apr. 20, 2011 Office Action issued in Chinese Patent Application No. 201010127802.0 (with translation).
May 18, 2011 Office Action issued in U.S. Appl. No. 11/603,078.
Jun. 6, 2011 Office Action issued in U.S. Appl. No. 12/134,950.
Jul. 21, 2011 Office Action in European Patent Application No. 09 176 909.1.
Jul. 21, 2011 Office Action in European Patent Application No. 09 176 910.9.
Jul. 21, 2011 Office Action in European Patent Application No. 09 176 911.7.
Jul. 21, 2011 Office Action in European Patent Application No. 09 176 912.5.
Jul. 26, 2011 Office Action in European Patent Application No. 09 176 913.3.
Jun. 29, 2012 Office Action issued in U.S. Appl. No. 12/382,078.
Jun. 28, 2012 Office Action issued in U.S. Appl. No. 12/382,162.
Jun. 26, 2012 Office Action issued in U.S. Appl. No. 12/003,038.
Jan. 6, 2012 Office Action in U.S. Appl. No. 11/570,219.
Jan. 6, 2012 Office Action in U.S. Appl. No. 12/134,950.
Feb. 14, 2012 Office Action in U.S. Appl. No. 11/808,230.
Chinese Patent Office, Second Office Action mailed Mar. 7, 2012 in Chinese Patent Application No. 201010127815.8 w/English-language Translation.
Korean Patent Office, Notice of Grounds for Rejection mailed Mar. 30, 2012 in Korean Patent Application No. 10-2005-7022146 w/English-language Translation.
European Patent Office, Summons to Attend Oral Proceedings mailed Apr. 20, 2012 in European Patent Application No. 09176909.1.
Office Action issued Dec. 13, 2011 in counterpart Japanese Patent Application No. 2004-151714 (with English translation).
Oct. 25, 2012 European Office Action issued in European Patent Application No. 05 749 073.2.
Oct. 30, 2012 Korean Office Action issued in Korean Patent Application No. 10-2011-7019047 (with translation).
Oct. 31, 2012 Korean Office Action issued in Korean Patent Application No. 10-2011-7018576 (with translation).
Nov. 23, 2012 Chinese Office Action issued in Chinese Patent Application No. 201010127802.0 (with translation).
Nov. 27, 2012 Korean Office Action issued in Korean Patent Application No. 10-2012-7025016 (with translation).
Dec. 3, 2012 European Search Report issued in European Patent Application No. 12155100.6.
Dec. 5, 2012 European Search Report issued in European Patent Application No. 12155114.7.
Jul. 17, 2012 Office Action issued in Japanese Application No. 2010-026918 (with English translation).
Jul. 17, 2012 Office Action issued in Japanese Application No. 2011-089258 (with English translation).
Jul. 17, 2012 Office Action issued in Japanese Application No. 2011-089259 (with English translation).
Jul. 17, 2012 Office Action issued in Japanese Application No. 2011-089260 (with English translation).
Jul. 17, 2012 Office Action issued in Japanese Application No. 2011-089261 (with English translation).
Aug. 20, 2012 Office Action issued in Korean Patent Application No. 10-2012-7014420 (with translation).
Aug. 20, 2012 Office Action issued in European Patent Application No. 04734624.2.
Sep. 5, 2012 Search Report issued in European Patent Application No. 12155096.6.
Sep. 6, 2012 Search Report issued in European Patent Application No. 12155097.4.
Sep. 6, 2012 Search Report issued in European Patent Application No. 12155095.8.
Sep. 25, 2012 Minutes of the Oral Proceedings issued in the European Patent Application No. 09176909.1.
Aug. 8, 2012 Office Action issued in U.S. Appl. No. 12/134,950.
Sep. 28, 2012 Office Action issued in TW Application No. 098124949 (with English translation).
Oct. 11, 2012 Search Report issued in EP Application No. 12155098.2.
Oct. 12, 2012 Office Action issued in SG Application No. 200902712.9.
Oct. 23, 2012 Search Report issued in EP Application No. 12155099.0.
Aug. 16, 2012 Office Action issued in U.S. Appl. No. 11/570,219.
Jun. 5, 2012 Office Action issued in Japanese Patent Application No. 2004-151714 (with translation).
Feb. 27, 2013 Office Action issued in Taiwanese Patent Application No. 094118981 (with translation).
Mar. 18, 2013 Office Action issued in U.S Appl. No. 12/382,162.
Mar. 19, 2013 Office Action issued in Japanese Patent Application No. 2010-026918 (with translation).

Mar. 19, 2013 Office Action issued in Japanese Patent Application No. 2011-089259 (with translation).
Apr. 25, 2013 Office Action issued in U.S Appl. No. 12/134,950.
Mar. 19, 2013 Office Action issued in U.S Appl. No. 12/003,038.

May 28, 2013 Office Action issued in Korean Patent Application No. 10-2011-7024887 w/translation.

* cited by examiner

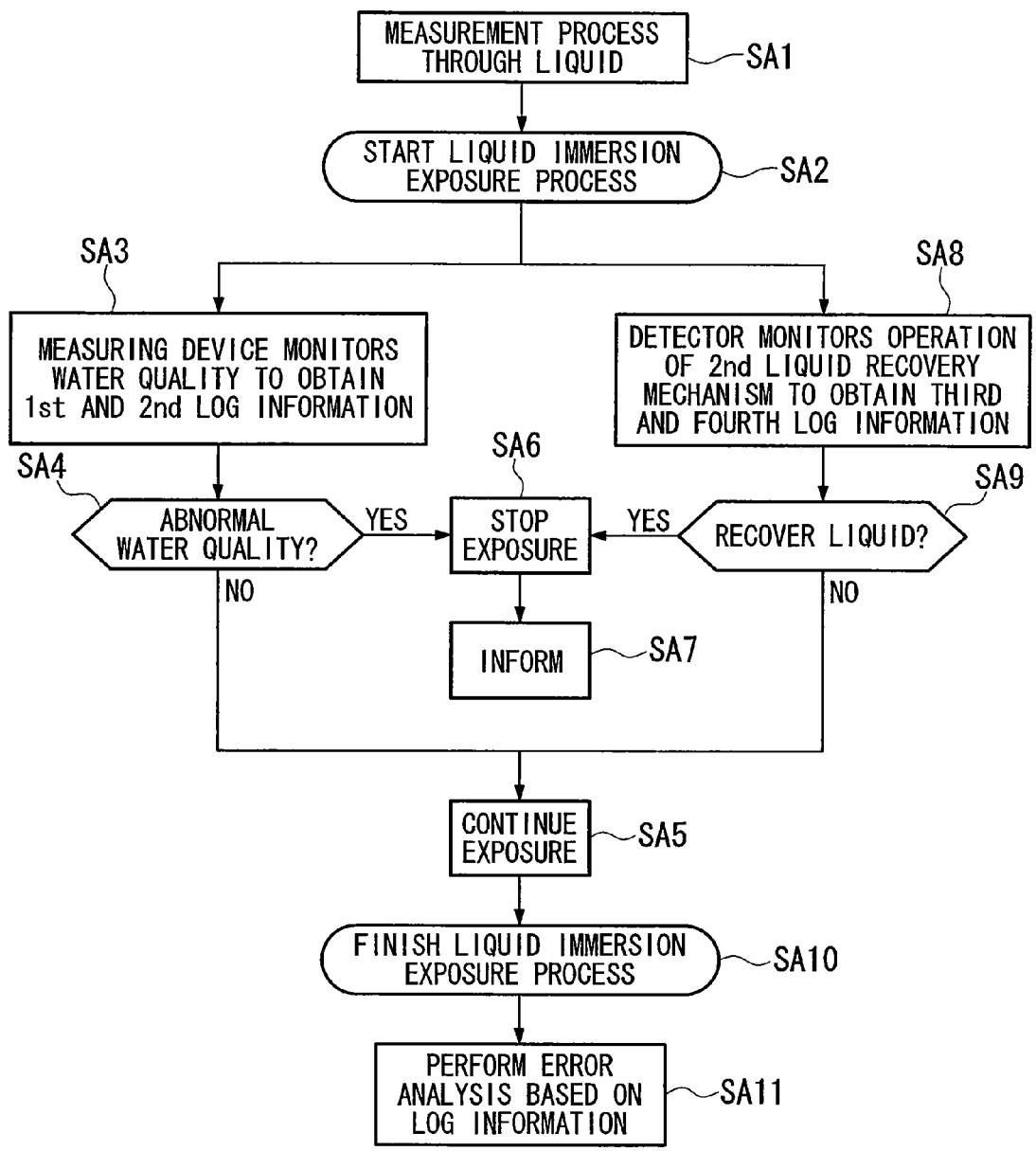

LITHOGRAPHIC APPARATUS WITH CLEANING OF SUBSTRATE TABLE

CROSS-REFERENCE TO RELATED APPLICATION

This application is a division of application Ser. No. 11/570,219 filed Jun. 22, 2007, which is a 371 of PCT/JP2005/010412 filed Jun. 7, 2005.

TECHNICAL FIELD

The present invention relates to an exposure apparatus that exposes a substrate via a projection optical system and a liquid, and to a device manufacturing method.

This application claims the right of priority based on Japanese Patent Application No. 2004-171115 filed on Jun. 9, 2004, the content of which is hereby incorporated by reference.

BACKGROUND ART

Semiconductor devices and liquid crystal display devices are manufactured by a so-called photolithographic method, in which a pattern formed on a mask is transferred onto a photosensitive substrate. An exposure apparatus used in the photolithographic process has a mask stage that supports a mask, and a substrate stage that supports a substrate, and it transfer a pattern on the mask onto the substrate via a projection optical system, while sequentially moving the mask stage and the substrate stage. Recently, higher resolution is desired for the projection optical system, in order to address higher integration of device patterns. The resolution of the projection optical system increases as an exposure wavelength to be used becomes shorter and a numerical aperture of the projection optical system becomes larger. Therefore, the exposure wavelength used in the exposure apparatus becomes shorter year after year, and the numerical aperture increases as well. The exposure wavelength, which is dominantly used at present, is 248 nm of a KrF excimer laser. However, the exposure wavelength of 193 nm of the ArF excimer laser, which is shorter than the above, is also practically used.

When the exposure is performed, depth of focus (DOF) is important as well as the resolution. The resolution R and the depth of focus δ are respectively expressed by the following expressions:

$$R = k_1 \cdot \lambda / NA \quad (1)$$

$$\delta = \pm k_2 \cdot \lambda / NA^2 \quad (2)$$

Here, λ represents the exposure wavelength, NA represents the numerical aperture of the projection optical system, and $k_1$ and $k_2$ represents process coefficients. From the expressions (1) and (2), it is seen that if the exposure wavelength λ is shortened and the numerical aperture NA is increased in order to enhance the resolution R, then the depth of focus δ becomes narrow.

If the depth of focus δ becomes too narrow, it is difficult to align the substrate with respect to the image surface of the projection optical system, and a focus margin during the exposure operation may be insufficient. Accordingly, the liquid immersion method has been suggested, which is disclosed, for example, in Patent Document 1 described below as a method for substantially shortening the exposure wavelength and widening the depth of focus. According to this liquid immersion method, the space between a bottom surface of the projection optical system and the substrate surface is filled with a liquid such as water or any organic solvent to form a liquid immersion area, to improve the resolution and, at the same time, enlarge the depth of focus by approximately n times by taking advantage of the fact that the wavelength of the exposure light in the liquid becomes 1/n times that in the air (n represents the refractive index of the liquid, and is generally about 1.2 to 1.6).

Patent Document 1: PCT International Publication No. WO99/49504

DISCLOSURE OF INVENTION

Problems Solved by the Invention

In the liquid immersion method, however, it is important to maintain the liquid in a desired state, in order to perform an exposure process and a measurement process via the liquid accurately. Therefore, when there is some deficiency in the liquid or in the exposure process and the measurement process via the liquid, it is important to take appropriate measures quickly addressing the problem.

In view of the above situation, it is an object of the present invention to provide an exposure apparatus that can accurately perform the exposure process and the measurement process based on the liquid immersion method, and a device manufacturing method.

Means for Solving the Problems

An exposure apparatus of the present invention is an exposure apparatus, which forms a liquid immersion area of a liquid on an image surface side of a projection optical system, and exposes a substrate via the projection optical system and the liquid of the liquid immersion area comprising a measuring device which measures at least one of a property and composition of the liquid for forming the liquid immersion area.

According to the present invention, since the measuring device measures at least one of the property and composition of the liquid, it can be determined whether the liquid is in a desired state based on the measurement result. When the liquid has a problem, an appropriate measure can be taken quickly addressing the problem. Accordingly, the exposure process and the measurement process via the liquid can be accurately performed.

Here, items of the property and composition of the liquid to be measured by the measuring device include a specific resistance value of the liquid, total organic carbon in the liquid, particles or foreign matter including bubbles contained in the liquid, dissolved gas containing dissolved oxygen and dissolved nitrogen, silica concentration in the liquid, and live bacteria in the liquid.

An exposure apparatus of the present invention is an exposure apparatus, which forms a liquid immersion area of a liquid on an image surface side of a projection optical system, and exposes a substrate via the projection optical system and the liquid of the liquid immersion area, comprising a functional liquid supply device which supplies a functional liquid having a predetermined function to a predetermined member in contact with the liquid.

According to the present invention, since the functional liquid supply device supplies the functional liquid to the predetermined member in contact with the liquid, the predetermined member can be made in the desired state relative to the liquid. Accordingly, even when there is a problem in the predetermined member or the liquid in contact with the predetermined member, the liquid in contact with the predetermined member can be maintained in or changed to the desired state by supplying the functional liquid addressing the problem. As a result, the exposure process and the measurement process via the liquid can be accurately performed.

An exposure apparatus of the present invention is an exposure apparatus, which forms a liquid immersion area of a liquid on an image surface side of a projection optical system and sequentially exposes a plurality of shot areas set on a substrate via the projection optical system and the liquid of the liquid immersion area, comprising a liquid supply mechanism for supplying a liquid, a first liquid recovery mechanism for recovering the liquid, a second liquid recovery mechanism for recovering the liquid, which is not recovered by the first liquid recovery mechanism, a detector which detects whether the second liquid recovery mechanism has recovered the liquid, and a storage device which stores a detection result of the detector in correspondence with the shot areas.

According to the present invention, the second liquid recovery mechanism detects whether the liquid has been recovered by using the detector, and the storage device stores the detection result in correspondence with the shot areas on the substrate. Accordingly, the cause of the problem generated on the shot area can be analyzed by using the storage device information in the storage device. In other words, in a shot area exposed when the second liquid recovery mechanism has recovered the liquid, there is concern that a problem may occur such that the exposure accuracy in the shot area deteriorates. In this case, the cause of the problem can be specified by using the memory information. Therefore, an appropriate measure can be taken quickly corresponding to the specified cause of the problem, thereby enabling to perform the exposure process and the measurement process via the liquid accurately.

A device manufacturing method according to the present invention uses the exposure apparatus described above.

According to the present invention, since devices can be manufactured in a state with the exposure accuracy and measurement accuracy being maintained well, devices exhibiting desired performance can be manufactured.

A maintenance method of the present invention is a maintenance method of an exposure apparatus which forms a liquid immersion area of a liquid on an image surface side of a projection optical system, and exposes a substrate via the projection optical system and the liquid in the liquid immersion area, and comprises a step for replacing the liquid forming the liquid immersion area with a functional liquid having a predetermined function. According to the present invention, a portion in contact with the liquid forming the liquid immersion area can be maintained based on the predetermined function of the functional liquid.

Advantageous Effect of the Invention

According to the present invention, the exposure process and the measurement process via the liquid can be performed accurately.

BRIEF DESCRIPTION OF THE DRAWINGS

FIG. 5 is a flowchart illustrating an exposure method according to the present invention.

DESCRIPTION OF THE REFERENCE SYMBOLS

| | |
|---|---|
| 2 | optical element |
| 2A | liquid contact face |
| 10 | liquid supply mechanism |
| 11 | liquid supply device |
| 12 | supply outlet |
| 13 | supply pipe (supply channel, channel forming member) |
| 13T | timer |
| 16 | pure water production device |
| 17 | temperature controller |
| 20 | first liquid recovery mechanism |
| 21 | first liquid recovery device |
| 22 | first collection inlet |
| 23 | recovery pipe (recovery channel, channel forming member) |
| 30 | second liquid recovery mechanism |
| 31 | second liquid recovery device |
| 32 | second collection inlet |
| 33 | recovery pipe (recovery channel, channel forming member) |
| 51 | upper face |
| 60 | measuring device |
| 61-64 | meters (measuring devices) |
| 61K-64K | branch pipes (branch channels) |
| 70 | first nozzle member |
| 70A | liquid contact face |
| 80 | second nozzle member |
| 80A | liquid contact face |
| 90 | detector |
| 120 | functional liquid supply device (cleaning device) |
| 161 | pure water production unit (adjusting device) |
| 162 | ultra-pure water production unit (adjusting device) |
| 173 | degasifier (adjusting device) |
| 174 | filter (adjusting device) |
| 300 | measuring member (reference member) |
| 400, 500, 600 | light-measuring devices |
| AR1 | projection area |
| AR2 | liquid immersion area |
| EX | exposure apparatus |
| INF | notifying device |
| MRY | storage device |
| LK | functional liquid |
| LQ | liquid |
| P | substrate |
| PL | projection optical system |
| PST | substrate stage |
| S1-S24 | shot areas |
| SB1-SB5 | steps. |

BEST MODE FOR CARRYING OUT THE INVENTION

Figure 1:
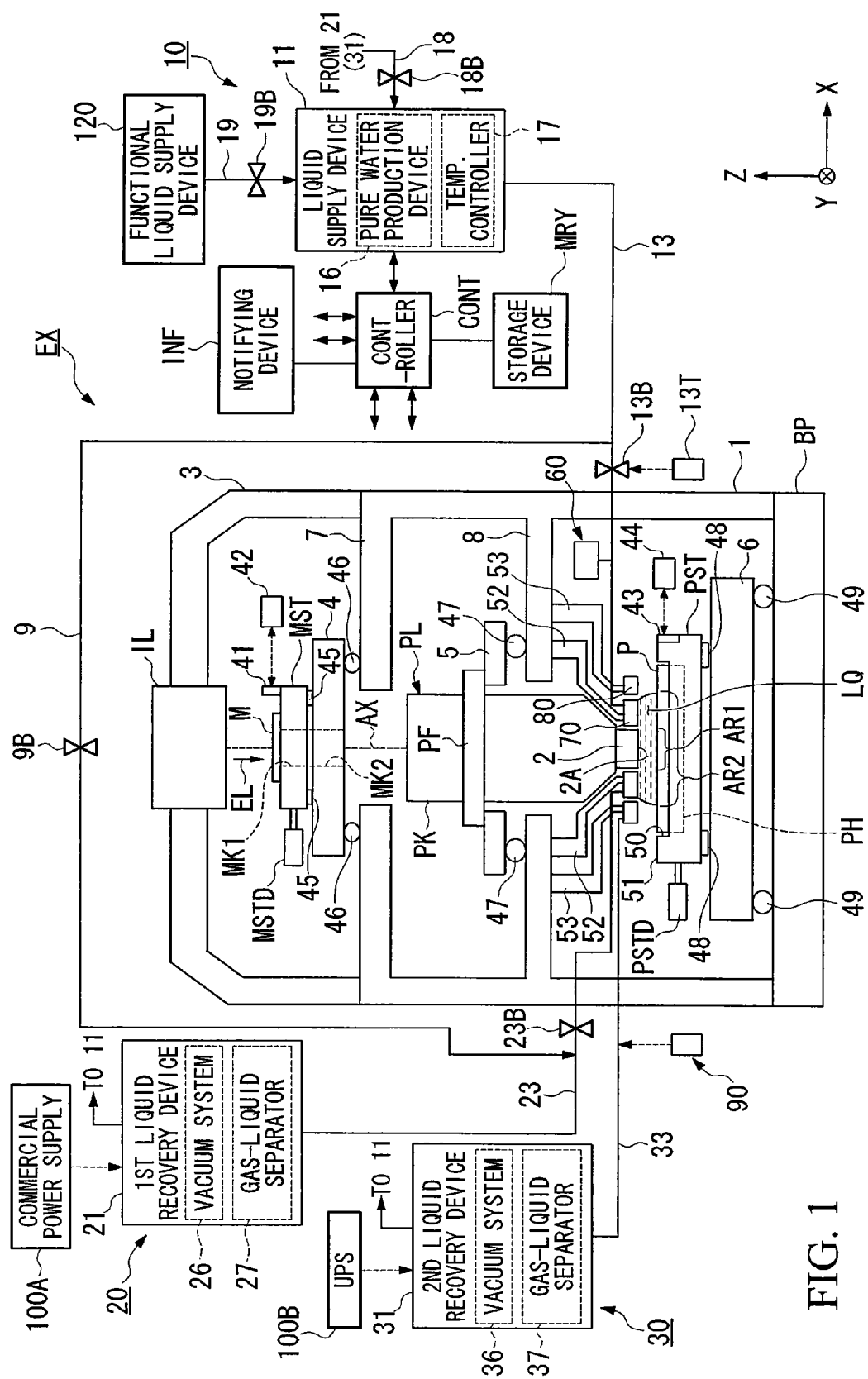
FIG. 1 is a schematic block diagram showing one embodiment of an exposure apparatus of the present invention.

The exposure apparatus of the present invention will be described with reference to the drawings. FIG. 1 is a schematic block diagram showing one embodiment of the exposure apparatus of the present invention.

In FIG. 1, the exposure apparatus EX comprises a mask stage MST movable while holding a mask M, a substrate stage PST movable while holding a substrate P, an illumination optical system IL which illuminates the mask M held on the mask stage MST with exposure light EL, a projection optical system PL which projection-exposes a pattern image of the mask M illuminated with the exposure light EL onto the substrate P held on the substrate stage PST, and a controller CONT which centrally controls the whole operation of the exposure apparatus EX. A notifying device INF for reporting information relating to the exposure process is connected to the controller CONT. The notifying device INF includes an alarm device which issues a signal (warning) by using a display device, or by means of sound or light. The notifying device INF is further connected to a storage device MRY for storing information relating the exposure process. The entire exposure apparatus EX is driven by power from a commercial power supply (first driving source) 100A supplied from a power company.

The exposure apparatus EX in this embodiment is a liquid immersion exposure apparatus applying the liquid immersion method in order to improve the resolution by substantially shortening the exposure wavelength, and to widen the depth of focus substantially, which comprises a liquid supply mechanism 10 for supplying a liquid LQ to an image surface side of the projection optical system PL, a first liquid recovery mechanism 20 and a second liquid recovery mechanism 30 for recovering the liquid LQ. The exposure apparatus EX locally forms a liquid immersion area AR2 larger than a projection area AR1 and smaller than the substrate P, on a part of the substrate P including the projection area AR1 of the projection optical system PL by the liquid LQ supplied from the liquid supply mechanism 10, at least while transferring the pattern image of the mask M to the substrate P. Specifically, the exposure apparatus EX adopts a local liquid immersion method in which the liquid LQ is filled in a space between the optical element 2 at the end of the image surface side of the projection optical system PL and the surface of the substrate P arranged on the image surface side, and the pattern on the mask M is projection-exposed on the substrate P by irradiating the exposure light EL having passed through the mask M to the substrate P via the liquid LQ between the projection optical system PL and the substrate P and the projection optical system PL. The controller CONT supplies the liquid LQ onto the substrate P in a predetermined amount by using the liquid supply mechanism 10, and recovers the liquid LQ on the substrate P in a predetermined amount by using the first liquid recovery mechanism 20, thereby locally forming the liquid immersion area AR2 of the liquid LQ on the substrate P. Moreover, the second liquid recovery mechanism 30 recovers the liquid LQ, which cannot be recovered by the first liquid recovery mechanism 20.

The exposure apparatus EX further comprises a measuring device 60 for measuring at least one of the property and composition of the liquid LQ for forming the liquid immersion area AR2. In the embodiment, the measuring device 60 measures the liquid LQ supplied by the liquid supply mechanism 10. The liquid supply mechanism 10 includes a functional liquid supply device 120 capable of supplying a functional liquid having a predetermined function separate from the liquid LQ for forming the liquid immersion area AR2. The exposure apparatus EX further comprises a detector 90 for detecting whether the second liquid recovery mechanism 30 has recovered the liquid LQ.

A first nozzle member 70 described later in detail is arranged near the image surface side of the projection optical system PL, more specifically, near the optical element 2 at the end of the image surface side of the projection optical system PL. The first nozzle member 70 is an annular member provided so as to surround the optical element 2 above the substrate P (the substrate stage PST). A second nozzle member 80 separate from the first nozzle member 70 is arranged outside of the first nozzle member 70, with respect to the projection area AR1 of the projection optical system PL. The second nozzle member 80 is an annular member provided so as to surround the first nozzle member 70 above the substrate P (the substrate stage PST). In the embodiment, the first nozzle member 70 constitutes a part of the liquid supply mechanism 10 and the first liquid recovery mechanism 20. On the other hand, the second nozzle member 80 constitutes a part of the second liquid recovery mechanism 30.

In the embodiment, a case in which a scanning type exposure apparatus (a so-called scanning stepper), which exposes a pattern formed on the mask M on the substrate P while synchronously moving the mask M and the substrate P in different directions (to opposite directions) in the scanning direction, is used as the exposure apparatus EX, is described as an example. In the following description, the direction that matches the optical axis AX of the projection optical system PL is designated as the Z-axis direction, the synchronous movement direction (scanning direction) of the mask M and the substrate P within a plane perpendicular to the Z-axis direction is designated as the X-axis direction, and the direction (non-scanning direction) perpendicular to the Z-axis direction and the X-axis direction is designated as the Y-axis direction. Moreover, rotation (inclination) directions about the X axis, Y axis, and Z axis are respectively designated as the $\theta X$, $\theta Y$, and $\theta Z$ directions.

The exposure apparatus EX includes a base BP provided on the floor, and a main column 1 installed on the base BP. On the main column 1 are formed an upper step 7 and a lower step 8 protruding inward. The illumination optical system IL is for illuminating the mask M supported on the mask stage MST with the exposure light EL, and is supported by a support frame 3 fixed to an upper part of the main column 1.

The illumination optical system IL has: an exposure light source, an optical integrator which equalizes illuminance of beams emitted from the exposure light source, a condenser lens which focuses the exposure light EL from the optical integrator, a relay lens system, and a variable field stop for setting an illumination area on the mask M by the exposure light EL in a slit shape. The predetermined illumination area on the mask M is illuminated with the exposure light EL having a uniform illumination distribution, from the illumination optical system IL. As the exposure light EL radiated from the illumination optical system IL, emission lines (g-ray, h-ray, i-ray) in the ultraviolet region radiated, for example, from a mercury lamp, deep ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm) are used. In this embodiment, the ArF excimer laser beam is used.

In the embodiment, pure water is used as the liquid LQ. The pure water can transmit not only the ArF excimer laser beam but also the emission lines (g-ray, h-ray, i-ray) in the ultraviolet region radiated, for example, from a mercury lamp, and the deep ultraviolet light (DUV light beams) such as the KrF excimer laser beam (wavelength: 248 nm).

The mask stage MST can move, while holding the mask M. The mask stage MST holds the mask M by vacuum suction (electrostatic attraction). A plurality of air bearings 45, being non-contact bearings, is provided on the bottom surface of the mask stage MST. The mask stage MST is supported in a non-contact manner relative to the upper face (guide face) of a mask board 4 by the air bearings 45. Openings MK 1 and MK2 for allowing the pattern image of the mask M to pass through are respectively formed in the center of the mask stage MST and the mask board 4. The mask board 4 is supported on the upper step 7 of the main column 1 via an isolator 46. In other words, the mask stage MST is supported by the main column 1 (the upper step 7) via the isolator 46 and the mask board 4. Moreover, the mask board 4 and the main column 1 are vibrationally separated by the isolator 46 so that vibrations of the main column 1 are not transmitted to the mask board 4 supporting the mask stage MST.

The mask stage MST can move two-dimensionally in a plane vertical to the optical axis AX of the projection optical system PL, that is, in an XY plane, and can slightly rotate in the θZ direction, on the mask board 4, in the state of holding the mask M, driven by a mask stage drive MSTD including a linear motor controlled by the controller CONT. The mask stage MST can move at a specified scanning speed in the X-axis direction, and has at least a movement stroke in the X-axis direction so that the whole face of the mask M can cross the optical axis AX of the projection optical system PL.

A movable mirror 41 is provided on the mask stage MST. A laser interferometer 42 is provided at a position opposite to the movable mirror 41. A two-dimensional position of the mask M on the mask stage MST and an angle of rotation in the θZ direction (including angles of rotation in the θX and θY directions according to circumstances) are measured by the laser interferometer 42 on a real time basis. A measurement result of the laser interferometer 42 is output to the controller CONT. The controller CONT drives the mask stage drive MSTD based on the measurement result of the laser interferometer 42, to control the position of the mask M held on the mask stage MST.

The projection optical system PL is for projection-exposing the pattern of the mask M on the substrate P at a predetermined projection magnification β, and is formed of a plurality of optical elements including the optical element 2 provided at the end on the substrate P side, and these optical elements are supported by a lens-barrel PK. In the embodiment, the projection optical system PL is a reduction system having the projection magnification β of, for example, ¼, ⅕, or ⅛. The projection optical system PL may be an equal magnification system or an enlarging system. The optical element 2 at the end of the projection optical system PL in the embodiment is exposed from the lens-barrel PK, and the liquid LQ in the liquid immersion area AR2 comes in contact with the optical element 2.

A flange PF is provided on the outer periphery of the lens-barrel PK holding the projection optical system PL, and the projection optical system PL is supported by a lens-barrel board 5 via the flange PF. The lens-barrel board 5 is supported by the lower step 8 of the main column 1 via an isolator 47. In other words, the projection optical system PL is supported by the main column 1 (the lower step 8) via the isolator 47 and the lens-barrel board 5. Moreover, the lens-barrel board 5 and the main column 1 are vibrationally separated by the isolator 47 so that vibrations of the main column 1 are not transmitted to the lens-barrel board 5 supporting the projection optical system PL.

The substrate stage PST can move while supporting a substrate holder PH for holding the substrate P. The substrate holder PH holds the substrate P by, for example, vacuum suction. A plurality of air bearings 48, being non-contact bearings, is provided on the bottom surface of the substrate stage PST. The substrate stage PST is supported in a non-contact manner relative to the upper face (guide face) of a substrate board 6 by the air bearings 48. The substrate board 6 is supported on the base BP via an isolator 49. Moreover, the substrate board 6 and the main column 1 and the base BP are vibrationally separated from each other by the isolator 49 so that vibrations of the base BP (the floor) and the main column 1 are not transmitted to the substrate board 6 supporting the substrate stage PST.

The substrate stage PST can move two-dimensionally in the XY plane, and can slightly rotate in the θZ direction, on the substrate board 6, in the state of holding the substrate P via the substrate holder PH, driven by a substrate stage drive PSTD including a linear motor controlled by the controller CONT. The substrate stage PST can further move in the Z-axis direction, the θX direction, and the θY direction.

A movable mirror 43 is provided on the substrate stage PST. A laser interferometer 44 is provided at a position opposite to the movable mirror 43. A two-dimensional position of the substrate P on the substrate stage PST and an angle of rotation are measured by the laser interferometer 44 on a real time basis. Though not shown, the exposure apparatus EX includes a grazing incidence focus/leveling detection system, which detects position information of the surface of the substrate P supported on the substrate stage PST, such as the one disclosed for example in Japanese Unexamined Patent Application, First Publication No. H08-37149. For the focus/leveling detection system, one using a capacitance type sensor can be adopted. The focus/leveling detection system detects the position information of the surface of the substrate P in the Z-axis direction and the inclination information of the substrate P in the θX and θY directions.

A measurement result of the laser interferometer 44 is output to the controller CONT. A detection result of the focus/leveling detection system is also output to the controller CONT. The controller CONT drives the substrate stage drive PSTD based on the detection result of the focus/leveling detection system, to control the focus position and the inclination angle of the substrate P, so that the surface of the substrate P is matched with the image surface of the projection optical system PL according to an auto-focus method and an auto-leveling method, and also controls the position of the substrate P in the X-axis direction and the Y-axis direction based on the measurement result of the laser interferometer 44.

A depression 50 is provided in the substrate stage PST, and the substrate holder PH for holding the substrate P is arranged in the depression 50. The upper face 51 of the substrate stage PST other than the depression 50 is a flat surface (flat portion) so as to be the same height as (to be flush with) the surface of the substrate P held in the substrate holder PH. In the embodiment, the upper face of the movable mirror 43 is also provided so as to be flush with the upper face 51 of the substrate stage PST.

Since the upper face 51 substantially flush with the surface of the substrate P is provided around the substrate P, even at the time of performing liquid immersion exposure of the edge area of the substrate P, there is actually no step portion outside of the edge of the substrate P. As a result, the liquid LQ is held on the image surface side of the projection optical system PL, to form the liquid immersion area AR2 excellently. There is a gap of about 0.1 to 2 mm between the edge of the substrate P and the flat surface (upper face) 51 provided around the substrate P. However, due to surface tension of the liquid LQ, the liquid LQ hardly flows into the gap, and even when the vicinity of the periphery of the substrate P is exposed, the liquid LQ can be held below the projection optical system PL by the upper face 51.

The liquid supply mechanism 10 is for supplying the liquid LQ to the image surface side of the projection optical system PL, and includes a liquid supply device 11 capable of feeding the liquid LQ and a supply pipe 13 connected to one end of the liquid supply device 11. The other end of the supply pipe 13 is connected to the first nozzle member 70.

In the embodiment, the liquid supply mechanism 10 is for supplying pure water, and the liquid supply device 11 includes a pure water production device 16 and a temperature controller 17 for controlling the temperature of the liquid (pure water) LQ to be supplied. As the pure water production device, a pure water production device in a factory in which the exposure apparatus EX is installed may be used, without providing the pure water production device in the exposure apparatus EX. In order to form the liquid immersion area AR2 on the substrate P, the liquid supply mechanism 10 supplies the liquid LQ in a predetermined amount onto the substrate P arranged on the image surface side of the projection optical system PL.

The measuring device 60, which measures at least one of the property and composition of the liquid LQ to be fed out from the liquid supply device 11 and supplied to the image surface side of the projection optical system PL, is provided somewhere in the supply pipe 13. As described above, the measuring device 60 comprises a device capable of measuring the water quality in order to supply water as the liquid LQ.

The first liquid recovery mechanism 20 is for recovering the liquid LQ on the image surface side of the projection optical system PL, and includes a first liquid recovery device 21 capable of recovering the liquid LQ and a recovery pipe 23, one end of which is connected to the first liquid recovery device 21. The other end of the recovery pipe 23 is connected to the first nozzle member 70. The first liquid recovery device 21 includes a vacuum system (suction device) 26 such as a vacuum pump, a gas-liquid separator 27 for separating the recovered liquid LQ from the gas, and the like. As the vacuum system, a vacuum system in the factory in which the exposure apparatus EX is installed may be used, without providing the vacuum pump in the exposure apparatus EX. In order to form the liquid immersion area AR2 on the substrate P, the first liquid recovery mechanism 20 recovers the liquid LQ on the substrate P supplied from the liquid supply mechanism 10 in a predetermined amount.

The second liquid recovery mechanism 30 is for recovering the liquid LQ on the image surface side of the projection optical system PL, and includes a second liquid recovery device 31 capable of recovering the liquid LQ and a recovery pipe 33, one end of which is connected to the second liquid recovery device 31. The other end of the recovery pipe 33 is connected to the second nozzle member 80. The second liquid recovery device 31 includes a vacuum system (suction device) 36 such as a vacuum pump, a gas-liquid separator 37 for separating the recovered liquid LQ from the gas, and the like. As the vacuum system, the vacuum system in the factory in which the exposure apparatus EX is installed may be used, without providing the vacuum pump in the exposure apparatus EX. The second liquid recovery mechanism 30 can recover the liquid LQ, which cannot be recovered by the first liquid recovery mechanism 20.

The second liquid recovery mechanism 30 has an uninterruptible power supply (second driving source) 100B separate from the commercial power supply 100A, which is a driving source of the entire exposure apparatus EX including the first liquid recovery mechanism 20. The uninterruptible power supply 100B supplies power (driving force) to a driving device of the second liquid recovery mechanism 30, for example, at the time of power failure of the commercial power supply 100A. For example, when the commercial power supply 100A has a power failure, the second liquid recovery device 31 in the second liquid recovery mechanism 30 is driven by the power supplied from the uninterruptible power supply 100B. In this case, the liquid recovery operation of the second liquid recovery mechanism 30 including the second liquid recovery device 31 is not controlled by the controller CONT, but is controlled based on a command signal from another controller built, for example, in the second liquid recovery mechanism 30.

At the time of power failure of the commercial power supply 100A, the uninterruptible power supply 100B can supply power also to the controller CONT in addition to the second liquid recovery mechanism 30. In this case, the controller CONT driven by the power from the uninterruptible power supply 100B can control the liquid recovery operation of the second liquid recovery mechanism 30. Moreover, the second liquid recovery mechanism 30 may be driven by the uninterruptible power supply 100B all the time. In this case, the first liquid recovery mechanism 20 and the second liquid recovery mechanism 30 are respectively driven by the separate power supplies 100A and 100B.

In the embodiment, the liquid LQ recovered by the first liquid recovery mechanism 20 and the second liquid recovery mechanism 30 is returned to the liquid supply device 11 in the liquid supply mechanism 10. In other words, the exposure apparatus EX in the embodiment includes a circulatory system, which circulates the liquid LQ between the liquid supply mechanism 10, the first liquid recovery mechanism 20, and the second liquid recovery mechanism 30. The liquid LQ returned to the liquid supply device 11 in the liquid supply mechanism 10 is purified by the pure water production device 16 and supplied again to the image surface side of the projection optical system PL (onto the substrate P). All or part of the liquid LQ recovered by the first and second liquid recovery mechanisms 20 and 30 may be returned to the liquid supply mechanism 10. Alternatively, the liquid LQ recovered by the first and second liquid recovery mechanisms 20 and 30 may not be returned to the liquid supply mechanism 10, but the liquid LQ supplied from another supply source may be supplied, or tap water may be purified by the pure water production device 16 and then supplied to the image surface side of the projection optical system PL. Moreover, the configuration may be such that a first mode in which the recovered liquid LQ is purified and returned to the liquid supply device 11 to be circulated, and a second mode in which the recovered liquid LQ is disposed of, and new liquid LQ is supplied from the liquid supply device 11, are changed over according to need.

The supply pipe 13 and the recovery pipe 23 are connected to each other via a connection pipe 9. One end of the connection pipe 9 is connected to a predetermined position somewhere along the supply pipe 13, and the other end thereof is connected to a predetermined position somewhere along the recovery pipe 23. A first valve 13B for opening and closing a flow channel of the supply pipe 13 is provided somewhere along the supply pipe 13, a second valve 23B for opening and closing a flow channel of the recovery pipe 23 is provided somewhere along the recovery pipe 23, and a third valve 9B for opening and closing a flow channel of the connection pipe 9 is provided somewhere along the connection pipe 9. The first valve 13B is provided in the supply pipe 13 on the first nozzle member 70 side from the connection position with the connection pipe 9, and the second valve 23B is provided in the recovery pipe 23 on the first nozzle member 70 side from the connection position with the connection pipe 9. The operation of the respective valves 13B, 23B, and 9B is controlled by the controller CONT. The flow channel of the liquid LQ fed from the liquid supply device 11 is changed by these valves 13B, 23B, and 9B.

A timer 13T is connected to the first valve 13B. The timer 13T can measure the time duration during which the first valve 13B is opened and the time duration during which the first valve 13B is closed. Moreover, the timer 13T can detect whether the first valve 13B is closing the flow channel of the supply pipe 13.

The timer 13T starts to measure the time, when the timer 13T detects that the first valve 13B has opened the flow channel of the supply pipe 13. Moreover, the timer 13T can also start to measure the time, when the timer 13T detects that the first valve 13B has closed the flow channel of the supply pipe 13.

The timer 13 can measure elapsed time since the first valve 13B opened the flow channel of the supply pipe 13, that is, the elapsed time since the start of liquid supply by the liquid supply mechanism 10. Information relating to the elapsed time measured by the timer 13T is output to the controller CONT. The timer 13T stops the time measuring operation when it detects that the first valve 13B has closed the flow channel of the supply pipe 13, and resets the measured time (returns the measured time to zero). Furthermore, the timer 13T can measure elapsed time since the first valve 13B closed the flow channel of the supply pipe 13, that is, the elapsed time since suspension of liquid supply by the liquid supply mechanism 10. Information relating to the elapsed time measured by the timer 13T is output to the controller CONT. The timer 13T stops the time measuring operation when it detects that the first valve 13B has opened the flow channel of the supply pipe 13, and resets the measured time (returns the measured time to zero).

The first nozzle member 70 constituting a part of the liquid supply mechanism 10 and the first liquid recovery mechanism 20 is held by a first nozzle holding member 52, and the first nozzle holding member 52 is connected to the lower step 8 of the main column 1. The second nozzle member 80 constituting a part of the second liquid recovery mechanism 30 is held by a second nozzle holding member 53, and the second nozzle holding member 53 is connected to the lower step 8 of the main column 1. The first nozzle holding member 52 and the second nozzle holding member 53 are members independent of each other.

Figure 2:
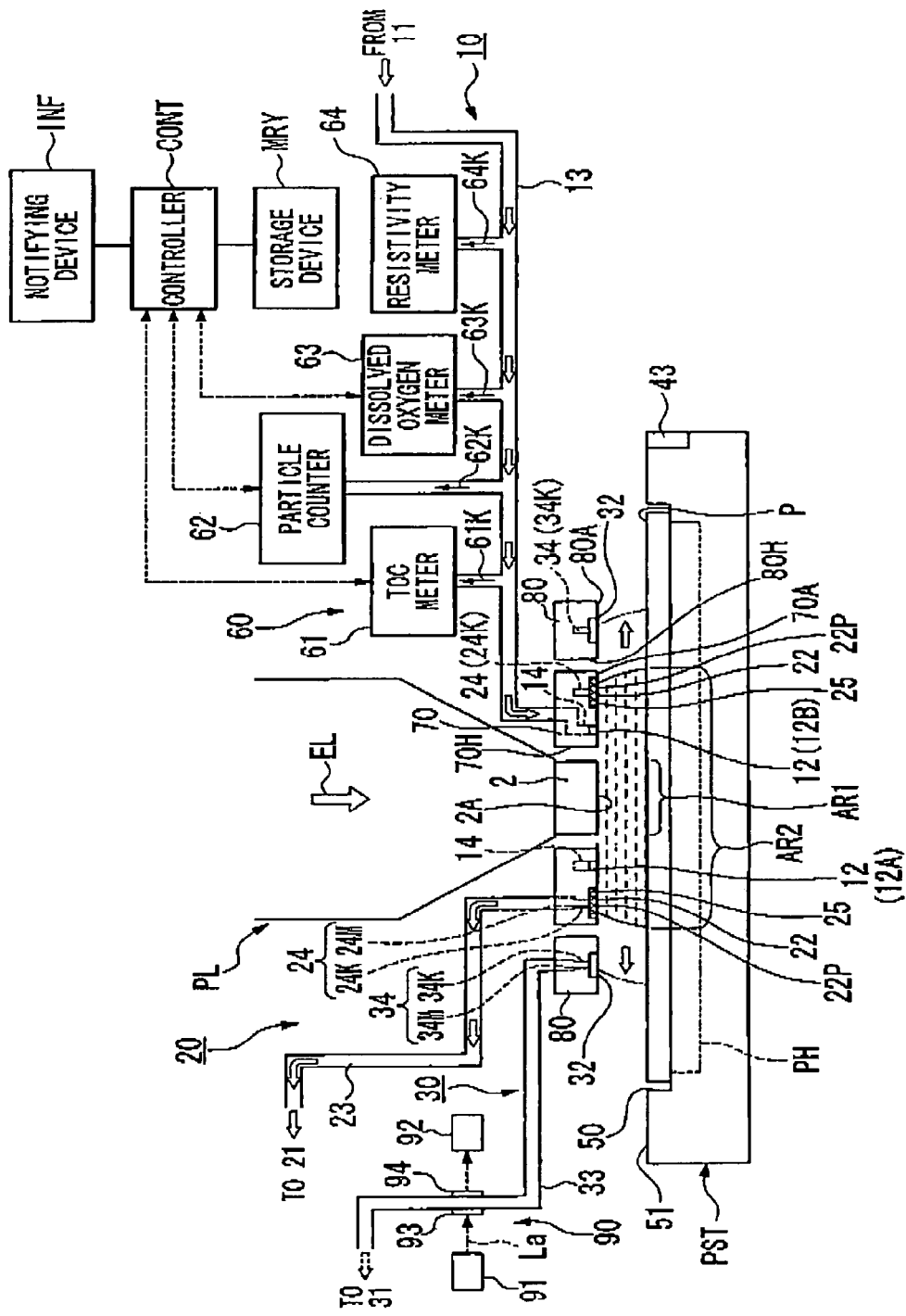
FIG. 2 is an enlarged diagram of the principal part of FIG. 1.

FIG. 2 is an enlarged diagram of the principal part, showing the vicinity of the image surface side of the projection optical system PL. In FIG. 2, the first nozzle member 70 is an annular member arranged near the optical element 2 at the end of the projection optical system PL so as to surround the optical element 2 above the substrate P (the substrate stage PST). The first nozzle member 70 has a hole 70H in which the projection optical system PL (the optical element 2) can be arranged in the middle thereof. A bottom surface 70A of the first nozzle member 70 is provided so as to face the substrate P held on the substrate stage PST. The first nozzle member 70 held by the first nozzle holding member 52 (see FIG. 1) is away from the projection optical system PL (the optical element 2). In other words, a gap is provided between the inner face of the first nozzle member 70, being an annular member, and the outer face of the optical element 2 of the projection optical system PL. The gap is provided for vibrationally separating the projection optical system PL and the first nozzle member 70 from each other. As a result, vibrations generated by the first nozzle member 70 can be prevented from being transmitted to the projection optical system PL side.

The second nozzle member 80 is an annular member provided so as to surround the first nozzle member 70 above the substrate P (the substrate stage PST). The second nozzle member 80 has a hole 80H in which a part of the first nozzle member 70 can be arranged in the middle thereof. A bottom surface 80A of the second nozzle member 80 is provided so as to face the substrate P held on the substrate stage PST. The first nozzle member 70 held by the first nozzle holding member 52 and the second nozzle member 80 held by the second nozzle holding member 53 (see FIG. 1) are away from each other. In other words, a gap is provided between the inner face of the second nozzle member 80, being an annular member, and the outer face of the first nozzle member 70. The gap is provided for vibrationally separating the first nozzle member 70 and the second nozzle member 80 from each other. As a result, vibrations generated by the second nozzle member 80 can be prevented from being transmitted to the first nozzle member 70 side.

The main column 1 supporting the first and the second nozzle members 70 and 80 via the first and the second nozzle holding members 52 and 53 and the lens-barrel board 5 supporting the lens-barrel PK of the projection optical system PL via the flange PF, are vibrationally separated from each other via the isolator 47. Accordingly, a situation where the vibrations generated by the first nozzle member 70 and the second nozzle member 80 are transmitted to the projection optical system PL is prevented. Moreover, the main column 1 supporting the first and the second nozzle members 70 and 80 via the first and the second nozzle holding members 52 and 53 and the substrate board 6 supporting the substrate stage PST are vibrationally separated from each other via the isolator 49. Accordingly, a situation where the vibrations generated by the first nozzle member 70 and the second nozzle member 80 are transmitted to the substrate stage PST via the main column 1 and the base BP is prevented. Furthermore, the main column 1 supporting the first and the second nozzle members 70 and 80 via the first and the second nozzle holding members 52 and 53 and the mask board 4 supporting the mask stage MST are vibrationally separated from each other via the isolator 46. Accordingly, a situation where the vibrations generated by the first nozzle member 70 and the second nozzle member 80 are transmitted to the mask stage MST via the main column 1 is prevented.

A supply outlet 12 (12A, 12B) constituting a part of the liquid supply mechanism 10 is provided in the bottom surface 70A of the first nozzle member 70. In the embodiment, there are two supply outlets 12 (12A, 12B), respectively provided in the opposite sides in the X-axis direction, with the optical element 2 of the projection optical system PL (projection area AR1) therebetween. In the embodiment, the supply outlets 12A and 12B are formed substantially in a circular shape, but may be formed in an optional shape such as an elliptic shape, a rectangular shape, or a slit shape. The supply outlets 12A and 12B may be substantially in the same size, or may be in different sizes.

On the bottom surface 70A of the first nozzle member 70, a first collection inlet 22 constituting a part of the first liquid recovery mechanism 20 is provided outside of the supply outlet 12, relative to the projection area AR1 of the projection optical system PL. The first collection inlet 22 is formed in an annular shape so as to surround the projection area AR1 and the supply outlets 12A and 12B. The first collection inlet 22 is provided with a porous body 22P.

The other end of the supply pipe 13 is connected to one end of a supply channel 14 formed in the first nozzle member 70.

On the other hand, the other end of the supply channel 14 of the first nozzle member 70 is connected to the supply outlet 12 formed in the bottom surface 70A of the first nozzle member 70. Here, the supply channel 14 formed in the first nozzle member 70 is branched somewhere so as to be connectable to the plurality of (two) supply outlets (12A and 12B) at the other ends thereof.

The liquid supply operation of the liquid supply device 11 is controlled by the controller CONT. In order to form the liquid immersion area AR2, the controller CONT feeds the liquid LQ I from the liquid supply device 11 of the liquid supply mechanism 10. The liquid LQ fed out from the liquid supply device 11 flows in the supply pipe 13, and then flows into the one end of the supply channel 14 formed in the first nozzle member 70. The liquid LQ flowing into the one end of the supply channel 14 is branched somewhere, and supplied to the space between the optical element 2 and the substrate P from the plurality of (two) supply outlets 12A and 12B formed in the bottom surface 70A of the first nozzle member 70.

The other end of the recovery pipe 23 is connected to one end of a manifold channel 24M constituting a part of the first recovery channel 24 formed in the first nozzle member 70. On the other hand, the other end of the manifold channel 24M is formed in an annular shape as seen in plan view so as to correspond to the first collection inlet 22, and is connected to a part of an annular channel 24K constituting a part of the first recovery channel 24 connected to the first collection inlet 22.

The liquid recovery operation of the first liquid recovery device 21 is controlled by the controller CONT. The controller CONT drives the first liquid recovery device 21 in the first liquid recovery mechanism 20 in order to recover the liquid LQ. Due to the drive of the first liquid recovery device 21 having the vacuum system 26, the liquid LQ on the substrate P flows into the annular channel 24K perpendicularly upward (in the +Z direction) via the first collection inlet 22 provided above the substrate P. The liquid LQ having flowed into the annular channel 24K in the +Z direction is collected in the manifold channel 24M, and then flows in the manifold channel 24M. Thereafter, the liquid LQ is sucked and recovered by the first liquid recovery device 21 via the recovery pipe 23.

On the bottom surface 80A of the second nozzle member 80, a second collection inlet 32 constituting a part of the second liquid recovery mechanism 30 is provided. The second collection inlet 32 is formed in the bottom surface 80A of the second nozzle member 80 opposite to the substrate P. The second nozzle member 80 is provided outside of the first nozzle member 70, and the second collection inlet 32 provided in the second nozzle member 80 is provided further outside than the first collection inlet 22 provided in the first nozzle member 70, relative to the projection area AR1 of the projection optical system PL. The second collection inlet 32 is formed in an annular shape so as to surround the first collection inlet 22.

The other end of the recovery pipe 33 is connected to one end of the manifold channel 34M constituting a part of the second recovery channel 34 formed in the second nozzle member 80. On the other hand, the other end of the manifold channel 34M is formed in an annular shape as seen in plan view so as to correspond to the second collection inlet 32, and is connected to a part of an annular channel 34K constituting a part of the second recovery channel 34 connected to the second collection inlet 32.

The liquid recovery operation of the second liquid recovery device 31 is controlled by the controller CONT. The controller CONT drives the second liquid recovery device 31 in the second liquid recovery mechanism 30 in order to recover the liquid LQ. Due to the drive of the second liquid recovery device 31 having the vacuum system 36, the liquid LQ on the substrate P flows into the annular channel 34K perpendicularly upward (in the +Z direction) via the second collection inlet 32 provided above the substrate P. The liquid LQ having flowed into the annular channel 34K in the +Z direction is collected in the manifold channel 34M, and then flows in the manifold channel 34M. Thereafter, the liquid LQ is sucked and recovered by the second liquid recovery device 31 via the recovery pipe 33. In the embodiment, the controller CONT performs the liquid recovery operation (suction operation) by the second liquid recovery mechanism 30 all the time during the liquid immersion exposure and before and after the exposure of the substrate P.

The measuring device 60 measures the property or composition (water quality) of the liquid LQ supplied by the liquid supply mechanism 10. The property or composition of the liquid LQ measured by the measuring device 60 is determined, taking into consideration an influence on the exposure accuracy of the exposure apparatus EX or an influence on the exposure apparatus EX itself. Table 1 shows one example of the property or composition of the liquid LQ and the influence on the exposure accuracy of the exposure apparatus EX or on the exposure apparatus EX itself. As shown in Table 1, the property or composition of the liquid LQ includes; specific resistance, metal ion, total organic carbon (TOC), particle bubbles, live bacteria, dissolved oxygen (DO), and dissolved nitrogen (DN). On the other hand, the items affecting the exposure accuracy of the exposure apparatus EX or the exposure apparatus EX itself include; cloudiness of the lens (particularly, the optical element 2), generation of a water mark (remaining attachment due to solidification of impurities in the liquid, resulting from evaporation of the liquid LQ), degradation of optical performance due to a change in refractive index or light scattering, influence on a resist process (resist pattern formation), and generation of rust in respective members. In Table 1, it is shown which property or composition affects which performance and how much, and a circle is given to an item, which is expected to be affected. The property or composition of the liquid LQ to be measured by the measuring device 60 is selected according to requirements from Table 1, based on the influence on the exposure accuracy of the exposure apparatus EX or the exposure apparatus EX itself. It is a matter of course that all items can be measured, or a property or composition not shown in Table 1 can be also measured.

In order to measure the items selected from the above viewpoint, the measuring device 60 has a plurality of meters. For example, the measuring device 60 can include, as the meter, a resistivity meter for measuring the specific resistance value, a TOC meter for measuring the total organic carbon, a particle counter for measuring foreign matter including fine particles and bubbles, a DO meter for measuring the dissolved oxygen (dissolved oxygen concentration), a DN meter for measuring the dissolved nitrogen (dissolved nitrogen concentration), a silica meter for measuring concentration of silica, and an analyzer capable of analyzing the type and amount of the live bacteria. In the embodiment, as one example, the total organic carbon, particle bubbles, dissolved oxygen, and specific resistance value are selected as the items to be measured, and as shown in FIG. 2, the measuring device 60 includes a TOC meter 61 for measuring the total organic carbon, a particle counter 62 for measuring foreign matter including fine particles and bubbles, a dissolved oxygen meter (DO meter) 63 for measuring the dissolved oxygen, and a resistivity meter 64 for measuring the specific resistance value.

TABLE 1

| | | Contents of influence | | | | | |
|---|---|---|---|---|---|---|---|
| | | Cloudiness of lens | Watermark | Optical performance | Effluent contamination | Resist process | Rust |
| Property/component of liquid | Resistivity | | ○ | ○ | ○ | ○ | ○ |
| | Metal ion | | ○ | | ○ | ○ | |
| | Total organic carbon (TOC) | | ○ | ○ | ○ | ○ | |
| | Particle bubbles | | ○ | ○ | ○ | ○ | |
| | Live bacteria | | ○ | ○ | ○ | ○ | |
| | Dissolved oxygen (DO) | | ○ | | ○ | ○ | |
| | Dissolved nitrogen (DN) | | | | | ○ | |
| | Silica | | ○ | | ○ | ○ | |
| | Organic Si | ○ | ○ | | ○ | ○ | |
| | Anions | | ○ | ○ | ○ | ○ | ○ |
| | Siloxane-based, CxHy-based | ○ | ○ | ○ | ○ | ○ | |
| | Phthalic acid ester | ○ | ○ | ○ | ○ | ○ | |
| | Cl | | ○ | ○ | ○ | ○ | ○ |
| | $PO_4$, $SO_4$, NOx (PAG); | | ○ | ○ | ○ | ○ | ○ |
| | Ammonia, amines | ○ | ○ | ○ | ○ | ○ | |
| | Base resin | ○ | ○ | ○ | ○ | ○ | |
| | Carboxylic acids (lactic acid, acetic acid, formic acid) | | ○ | ○ | ○ | ○ | ○ |

As shown in FIG. 2, the TOC meter 61 is connected to a branch pipe (branch channel) 61K branched somewhere along the supply pipe (supply channel) 13 connected to the supply outlet 12. A part of the liquid LQ fed out from the liquid supply device 11 and flowing in the supply pipe 13 is supplied onto the substrate P from the supply outlet 12 of the first nozzle member 70, and a part of the remaining liquid LQ flows in the branch pipe 61K and into the TOC meter 61. The TOC meter 61 measures the total organic carbon (TOC) of the liquid LQ flowing in the branch channel formed by the branch pipe 61K. Likewise, the particle counter 62, the dissolved oxygen meter 63, and the resistivity meter 64 are respectively connected to respective branch pipes 62K, 63K, and 64K branched somewhere along the supply pipe 13, to measure foreign matter (fine particles or bubbles), dissolved oxygen, and the specific resistance value of the liquid LQ flowing in the branch channels formed by these branch pipes 62K, 63K, and 64K. The silica meter and/or the live bacteria analyzer can be also connected to the branch pipe branched somewhere along the supply pipe 13.

In the embodiment, the branch pipes 61K to 64K respectively form an independent branch channel, and respective meters 61 to 64 are connected to respective branch channels independent of each other. In other words, a plurality of meters 61 to 64 is connected parallel with each other relative to the supply pipe 13 via the branch pipes 61K to 64K. According to the configuration of the meter, a plurality of meters may be serially connected relative to the supply pipe 13, such that the liquid LQ branched from the supply pipe 13 is measured by a first meter, and the liquid LQ having passed the first meter is measured by a second meter. Since the possibility of generation of foreign matter (fine particles) increases according to the number and position of the branch pipe (branch connection), the number and position of the branch pipe needs to be set, taking the possibility of generation of foreign matter into consideration. The same type of meters may be arranged at a plurality of positions along the supply pipe 13. According to such an arrangement, it can be specified at which position of the supply pipe 13 the property or composition of the liquid LQ has changed, thereby facilitating cause investigation of the change.

In the embodiment, the measuring device 60 measures the property or composition of the liquid LQ flowing in the branch channel branched somewhere along the supply channel formed by the supply pipe 13, according to an in-line method. By adopting the in-line method, the liquid LQ is supplied to the measuring device 60 all the time. Therefore, the measuring device 60 can measure the property or composition (water quality) of the liquid LQ all the time during exposure and before and after the exposure. In other words, the measuring device 60 can measure the liquid LQ, concurrently with the liquid immersion exposure operation to the substrate P. The measurement result of the measuring device 60 is output to the controller CONT. The controller CONT can monitor the property or composition (water quality) of the liquid LQ supplied onto the substrate P by the liquid supply mechanism 10 all the time.

In order to determine the type of metal ion contained in the liquid LQ, the liquid LQ is sampled, and by using an analyzer provided separately from the exposure apparatus EX, the type of the metal ion can be determined. As a result, an appropriate measure can be taken corresponding to the specified metal ion. Moreover, in order to measure the impurities contained in the liquid LQ, the liquid LQ is sampled, and by using a total evaporative residue meter provided separately from the exposure apparatus EX, the total evaporative residue amount in the liquid LQ can be measured. In this case, the analyzer and the total evaporative residue meter may automatically perform sampling of the liquid LQ regularly, and inform the type of the metal ion and the measurement result of the total evaporative residue meter to the exposure apparatus EX. The exposure apparatus EX can compare the informed measurement result with a reference value stored beforehand, and when the measurement result exceeds the reference value, can issue a warning.

The detector 90 detects whether the second liquid recovery mechanism 30 has recovered the liquid LQ. In the embodiment, the detector 90 detects optically whether the liquid LQ is flowing in the recovery pipe 33 of the second liquid recovery mechanism 30, to thereby detect whether the liquid LQ has been recovered via the second collection inlet 32 of the second liquid recovery mechanism 30. The detector 90 includes a floodlight device 91 for emitting a detection beam La, and a light receiving device 92 for receiving the detection beam La. Transmission windows 93 and 94 capable of transmitting the detection beam La are provided somewhere along the recovery pipe 33. The detector 90 irradiates the detection beam La to the transmission window 93 from the floodlight device 91. The detection beam La having transmitted through the transmission window 93 passes inside of the recovery pipe 33, and is then received by the light receiving device 92 via the transmission window 94. The light reception result of the light receiving device 92 is output to the controller CONT. The light receiving amount by the light receiving device 92 is different in a case where there is the liquid LQ in the recovery pipe 33 (on the optical path of the detection beams La) and in a case where there is no liquid LQ therein. Accordingly, the controller CONT can determine whether there is the liquid LQ (whether the liquid LQ is flowing) in the recovery pipe 33, that is, whether the second liquid recovery mechanism 30 has recovered the liquid LQ, based on the light reception result by the light receiving device 92.

The detector 90 needs only to detect whether the liquid LQ has been recovered via the second collection inlet 32, and for example, may be a liquid presence sensor provided inside of the recovery pipe 33. The installation position of the liquid presence sensor is not limited to somewhere along the recovery pipe 33, but may be near the second collection inlet 32 of the second nozzle member 80 or inside of the second recovery channel 34. Moreover, as the detector 90, for example, a flow rate controller (flow element) referred to as a mass flow controller may be provided somewhere along the recovery pipe 33, to determine whether the liquid LQ has been recovered via the second collection inlet 32 based on the detection result of the mass flow controller.

Moreover, the detector 90 including the floodlight device and the light receiving device and the detector including the mass flow controller can detect the liquid recovery amount per unit time by the second liquid recovery mechanism 30.

Figure 3:
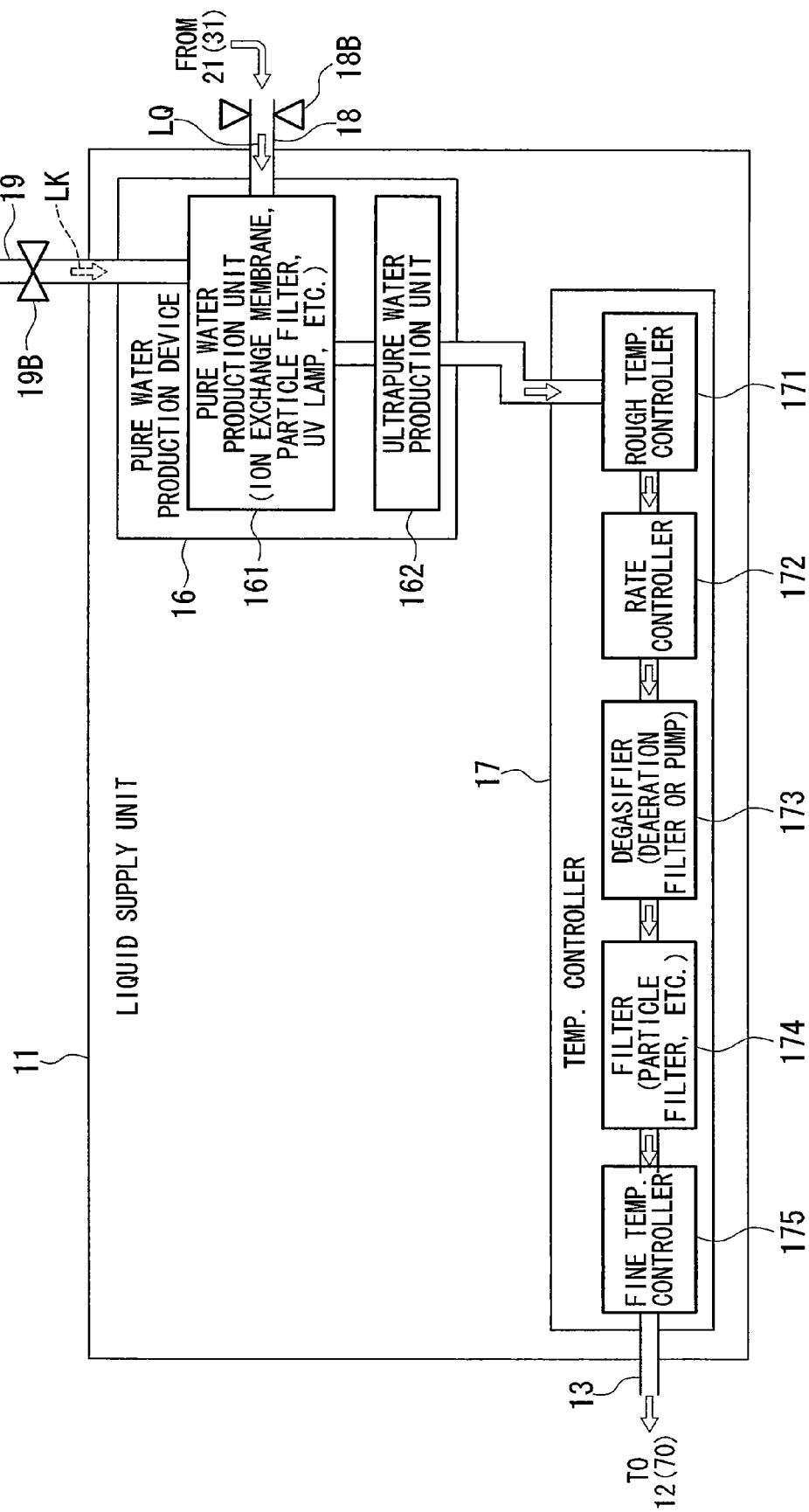
FIG. 3 is a schematic block diagram showing a liquid supply device.

FIG. 3 shows the configuration of the liquid supply device 11 in detail. The liquid supply device 11 includes the pure water production device 16 and the temperature controller 17 which controls the temperature of the liquid produced by the pure water production device 16. The pure water production device 16 includes a pure water production unit 161 which produces pure water of predetermined purity by purifying water including, for example, suspended matter and impurities, and an ultra-pure water production unit 162 which produces pure water of high purity (ultra-pure water) by removing impurities from the pure water produced by the pure water production unit 161. The pure water production unit 161 (or the ultra-pure water production unit 162) includes a liquid reforming member such as an ion exchange membrane or a particle filter, and a liquid reformer such as an ultraviolet irradiation device (UV lamp), to control the specific resistance value of the liquid, the amount of foreign matter (fine particles and bubbles), the total organic carbon, and the amount of live bacteria, to desired values by using the liquid reforming member and the liquid reformer.

As described above, the liquid LQ recovered by the first liquid recovery mechanism 20 and the second liquid recovery mechanism 30 is returned to the liquid supply device 11 of the liquid supply mechanism 10. Specifically, the liquid LQ recovered by the first liquid recovery mechanism 20 and the second liquid recovery mechanism 30 is supplied to the pure water production device 16 (the pure water production unit 161) in the liquid supply device 11 via a return pipe 18. The return pipe 18 is provided with a valve 18B for opening and closing the flow channel of the return pipe 18. The pure water production device 16 purifies the liquid returned via the return pipe 18 by using the liquid reforming member and the liquid reformer, and supplies the liquid to the temperature controller 17. The functional liquid supply device 120 is connected to the pure water production device 16 (the pure water production unit 161) in the liquid supply device 11 via a supply pipe 19. The functional liquid supply device 120 can supply a functional liquid LK having a predetermined function separate from the liquid LQ for forming the liquid immersion area AR2. In the embodiment, the functional liquid supply device 120 supplies a liquid (functional liquid) LK having a germicidal action. The supply pipe 19 is provided with a valve 19B for opening and closing the flow channel of the supply pipe 19. The controller CONT operates the valve 19B to close the flow channel of the supply pipe 19, to thereby suspend the supply of the functional liquid LK, when the valve 18B is operated to open the flow channel of the return pipe 18 so as to supply the liquid LQ. On the other hand, when the valve 19B is operated to open the flow channel of the supply pipe 19, so as to supply the functional liquid LK, the controller CONT operates the valve 18B to close the flow channel of the return pipe 18, to thereby suspend the supply of the liquid LQ.

The temperature controller 17 controls the temperature of the liquid (pure water) LQ produced by the pure water production device 16 and supplied to the supply pipe 13, and one end thereof is connected to the pure water production device 16 (the ultra-pure water production unit 162), and the other end thereof is connected to the supply pipe 13. After controlling the temperature of the liquid LQ produced by the pure water production device 16, the temperature controller 17 feeds the temperature-controlled liquid LQ to the supply pipe 13. The temperature controller 17 includes a rough temperature controller 171 which roughly controls the temperature of the liquid LQ supplied from the ultra-pure water production unit 162 in the pure water production device 16, a flow rate controller 172 referred to as a mass flow controller and provided on the downstream side (supply pipe 13 side) of the flow channel of the rough temperature controller 171 for controlling the amount of the liquid LQ per unit time to be allowed to flow to the supply pipe 13, a degasifier 173 for decreasing the concentration of the dissolved gas (dissolved oxygen concentration, dissolved nitrogen concentration) in the liquid LQ having passed the flow rate controller 172, a filter 174 for removing foreign matter (fine particles and bubbles) in the liquid LQ degasified by the degasifier 173, and a fine temperature controller 175 for finely controlling the temperature of the liquid LQ having passed the filter 174.

The rough temperature controller 171 is for controlling the temperature of the liquid LQ fed from the ultra-pure water production unit 162 with rough accuracy of about ±0.1° C. with respect to a target temperature (for example, 23° C.). The flow rate controller 172 is arranged between the rough temperature controller 171 and the degasifier 173, and controls the flow rate per unit time of the liquid LQ temperature-controlled by the rough temperature controller 171 with respect to the degasifier 173 side.

The degasifier 173 is arranged between the rough temperature controller 171 and the fine temperature controller 175, specifically between the flow rate controller 172 and the filter 174, and degasifies the liquid LQ fed from the flow rate controller 172 to decrease the concentration of the dissolved gas in the liquid LQ. For the degasifier 173, a known degasifier such as a decompressor, which degasifies by decompressing the supplied liquid LQ, can be used. Moreover, an apparatus including a deaeration filter, which performs gas-liquid separation of the liquid LQ by using a filter such as a hollow fiber membrane filter and removes the separated gas component by using solid fibers, or an apparatus including a deaeration pump, which performs gas-liquid separation of the liquid LQ by using a centrifugal force and removes the separated gas component by using solid fibers can be used as well. The degasifier 173 adjusts the concentration of the dissolved gas to a desired value, by the liquid reforming member including the deaeration filter and the liquid reformer including the deaeration pump.

The filter 174 is arranged between the rough temperature controller 171 and the fine temperature controller 175, specifically between the degasifier 173 and the fine temperature controller 175, and removes foreign matter in the liquid LQ fed from the degasifier 173. There is a possibility that foreign matter (particles) is slightly mixed in the liquid LQ when the liquid LQ passes the flow rate controller 172 and the degasifier 173, but by providing the filter 174 on the downstream side (the supply pipe 13 side) of the flow rate controller 172 and the degasifier 173, the foreign matter can be removed by the filter 174. For the filter 174, a known filter such as the hollow fiber membrane filter and the particle filter can be used. The filter 174 including the liquid reforming member such as the particle filter adjusts the amount of foreign matter (fine particles and bubbles) in the liquid LQ to a tolerance or below.

The fine temperature controller 175 is arranged between the rough temperature controller 171 and the supply pipe 13, specifically between the filter 174 and the supply pipe 13, and performs fine temperature control of the liquid LQ with high accuracy. For example, the fine temperature controller 175 finely adjusts the temperature (temperature stability, temperature uniformity) of the liquid LQ fed from the filter 174 with high accuracy of about ±0.01° C. to ±0.001° C. relative to a target temperature. In the embodiment, of a plurality of equipment constituting the temperature controller 17, the fine temperature controller 175 is arranged at a position closest to the substrate P, which is an object to which the liquid LQ is supplied, and hence, the liquid LQ temperature-controlled with high accuracy can be supplied to the substrate P.

It is desired that the filter 174 is arranged between the rough temperature controller 171 and the fine temperature controller 175 in the temperature controller 17, but may be arranged at a different position in the temperature controller 17, or may be arranged outside the temperature controller 17.

As described above, the pure water production unit 161, the ultra-pure water production unit 162, the degasifier 173, and the filter 174 respectively include the liquid reforming member and the liquid reformer, to constitute an adjusting device for regulating the water quality (property or composition) of the liquid LQ. These respective devices 161, 162, and 174 are respectively provided at a plurality of predetermined positions of the flow channel, in which the liquid LQ flows, of the liquid supply mechanism 10. In the embodiment, one liquid supply device 11 is arranged with respect to one exposure apparatus EX (see FIG. 1), but the present invention is not limited thereto, and one liquid supply device 11 may be shared by a plurality of exposure apparatuses EX. By having such a configuration, an area (footprint) occupied by the liquid supply device 11 can be reduced. Alternatively, the pure water production device 16 and the temperature controller 17 constituting the liquid supply device 11 may be separated to share the pure water production device 16 by the plurality of exposure apparatuses EX, and the temperature controller 17 may be arranged for each exposure apparatus EX. According to this configuration, the footprint can be reduced, and temperature control for each exposure apparatus can be realized. In the above case, if the liquid supply device 11 or the pure water production device 16 shared by the plurality of exposure apparatuses EX is arranged on a floor (for example, under the floor) separate from the floor where the exposure apparatus EX is arranged, the space of the clean room where the exposure apparatus EX is installed can be used more effectively.

A method for exposing the pattern image of the mask M on the substrate P by using the exposure apparatus EX having the above configuration will be described with reference to the flowcharts in FIGS. 4 and 5.

Figure 4:
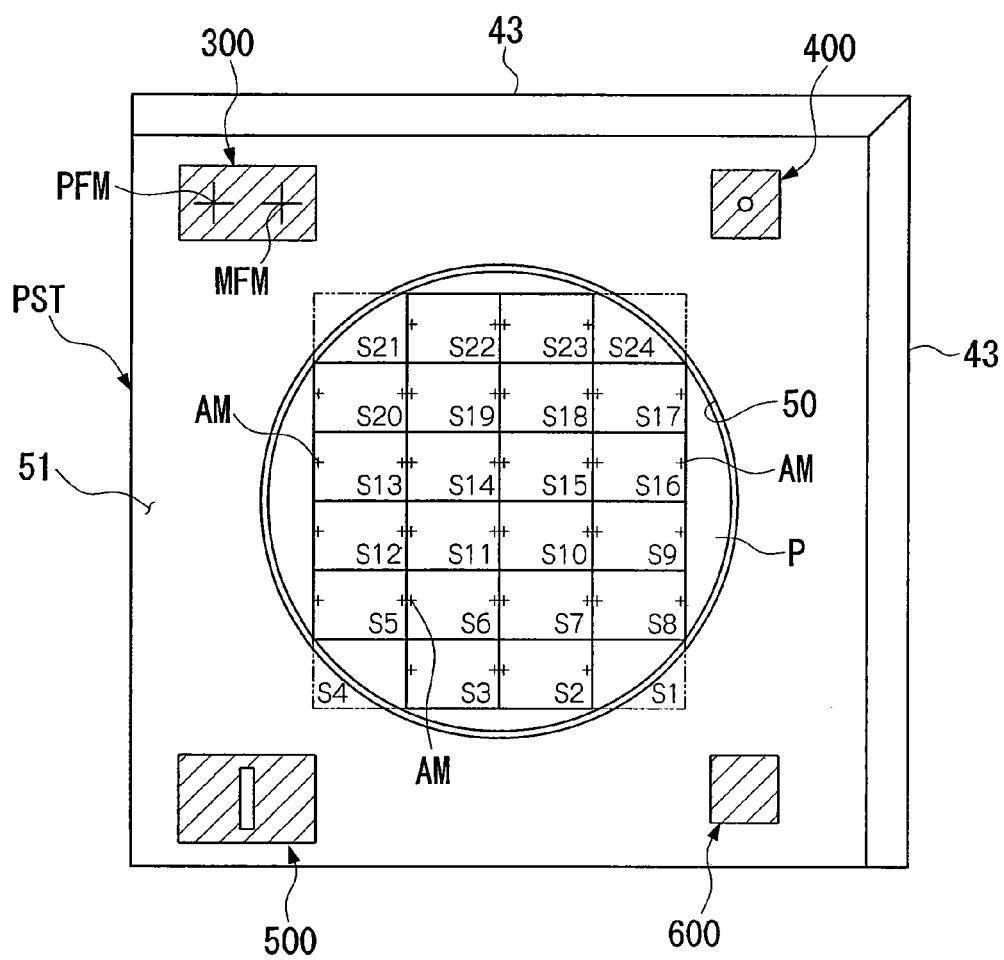
FIG. 4 is a view of a substrate stage PST as viewed from the top.

FIG. 4 is a plan view of the substrate stage PST as viewed from the top. In FIG. 4, a plurality of shot areas S1 to S24 is set on the substrate P carried (loaded) onto the substrate stage PST by an unillustrated carrier system (loader). An alignment mark AM is respectively added to each of the shot areas S1 to S24 on the substrate P. A reference member (measuring member) 300 having a reference mark PFM to be measured by a substrate alignment system, for example, disclosed in Japanese Unexamined Patent Application, First Publication No. H04-65603, and a reference mark MFM to be measured by a mask alignment system, for example, disclosed in Japanese Unexamined Patent Application, First Publication No. H07-176468 is arranged at a predetermined position on the substrate stage PST. Moreover, an illuminance unevenness sensor 400 as disclosed in Japanese Unexamined Patent Application, First Publication No. S57-117238, a space image measuring sensor 500, as disclosed in Japanese Unexamined Patent Application, First Publication No. 2002-14005, and an illuminance sensor 600, as disclosed in Japanese Unexamined Patent Application, First Publication No. H11-16816, are provided at predetermined positions on the substrate stage PST as light measuring devices. The upper faces of the measuring member 300 and the light measuring devices 400, 500, and 600 are substantially flush with the upper face 51 of the substrate stage PST.

Before starting exposure of the substrate P, the controller CONT measures the position relation (baseline amount) between a detection reference position of the substrate alignment system and a projection position of the pattern image of the mask M by using the substrate alignment system, the mask alignment system, and the reference member 300. The position of the substrate stage PST when the reference marks MFM and PFM on the reference member 300 are measured is measured by the laser interferometer 44. Moreover, before starting exposure of the substrate P, the controller CONT performs a measurement process using the respective light measuring devices 400, 500, and 600 provided on the substrate stage PST, to perform various correction processes such as lens calibration and the like based on the measurement results.

For example, when a measurement process using the mask alignment system is to be performed, the controller CONT performs position control of the substrate stage PST to make the projection optical system PL face the reference member 300, to thereby perform a liquid supply operation and a liquid recovery operation by the liquid supply mechanism 10 and the first liquid recovery mechanism 20, and measures the reference mark MFM on the reference member 300 via the projection optical system PL and the liquid LQ, in a state with the liquid immersion area AR2 of the liquid LQ being formed on the reference member 300. Likewise, when a measurement process using respective light measuring devices 400, 500, and 600 is to be performed, the controller CONT performs a measurement process via the liquid LQ in a state with the liquid immersion area AR2 of the liquid LQ being formed on the respective light measuring devices 400, 500, and 600. When the liquid LQ is supplied onto the substrate stage PST including the measuring member and the light measuring devices from the liquid supply mechanism 10, the controller CONT drives the first valve 13B to open the flow channel of the supply pipe 13, in a state with the flow channel of the connection pipe 9 being closed by the third valve 9B. When the liquid immersion area AR2 is formed, the controller CONT drives the second valve 23B to open the flow channel of the recovery pipe 23. Thus, in the measuring operation before the exposure, measurement via the liquid LQ is performed. When the liquid immersion area AR2 is formed, the liquid LQ in the liquid immersion area AR2 comes in contact with the bottom surface (liquid contact face) 2A of the optical element 2 of the projection optical system PL closest to the image surface and the bottom surfaces (liquid contact faces) 70A and 80A of the nozzle members 70 and 80. Furthermore, the liquid LQ comes in contact with the upper face 51 of the substrate stage PST including the measuring member 300 and the light measuring devices 400, 500, and 600.

The controller CONT measures the alignment mark AM formed on each of the shot areas S1 to S24 on the substrate P by using the substrate alignment system, in order to perform superposition exposure with respect to the substrate P. The position of the substrate stage PST when the substrate alignment system measures the alignment mark AM is measured by the laser interferometer 44. The controller CONT obtains position information of the shot areas S1 to S24 relative to the detection reference position of the substrate alignment system in a coordinate system specified by the laser interferometer 44, based on the detection result of the alignment mark AM, and moves the substrate stage PST based on the position information and the baseline amount measured previously, to thereby adjust positions of the shot areas S1 and S24 with respect to the projection position of the pattern image of the mask M. Here, in the embodiment, when the alignment mark AM and the reference mark PFM are to be measured, the liquid immersion area AR2 is not formed on the substrate P (substrate stage PST), and the substrate alignment system measures the alignment mark AM in a non-liquid immersion state (in a dry state). When the liquid immersion area AR2 is not formed on the substrate P (substrate stage PST), the controller CONT drives the third valve 9B to open the flow channel of the connection pipe 9, in a state with the flow channel of the supply pipe 13 being closed by the first valve 13B. As a result, the liquid LQ flowing from the liquid supply device 11 including the temperature controller 17 to the supply pipe 13 flows to the recovery pipe 23 via the connection pipe 9.

That is, in the embodiment, the liquid supply device 11 including the temperature controller 17 is driven all the time, and at the time of supplying the liquid to the image surface side of the projection optical system PL, the controller CONT drives the first valve 13B to open the flow channel of the supply pipe 13, and closes the flow channel of the connection pipe 9 by the third valve 9B, to thereby supply the liquid LQ fed from the liquid supply device 11 to the image surface side of the projection optical system PL. On the other hand, when it is not necessary to supply the liquid to the image surface side of the projection optical system PL, the controller CONT drives the third valve 9B to open the flow channel of the connection pipe 9, and closes the flow channel of the supply pipe 13 by the first valve 13B, so that the liquid LQ fed from the liquid supply device 11 is not supplied to the image surface side of the projection optical system PL, but is recovered by the liquid recovery device 21 via the recovery pipe 23.

The controller CONT outputs a command signal to start liquid immersion exposure (step SA2). The controller CONT closes the flow channel of the connection pipe 9 by the third valve 9B, in a state that the optical element 2 of the projection optical system PL faces the predetermined area on the substrate stage PST including the substrate P, and drives the first valve 13B to open the supply pipe 13, to thereby start supply of the liquid LQ to the substrate P by the liquid supply mechanism 10. Moreover, the controller CONT starts liquid recovery by the first liquid recovery mechanism 20, substantially simultaneously with the start of supply of the liquid LQ by the liquid supply mechanism 10. Here, the liquid supply amount per unit time by the liquid supply mechanism 10 and the liquid recovery amount per unit time by the first liquid recovery mechanism 20 are approximately constant. The liquid LQ in the liquid immersion area AR2 formed so as to perform liquid immersion exposure with respect to the substrate P comes in contact with the bottom surface 2A of the optical element 2 and the bottom surface 70A of the first nozzle member 70. The liquid recovery operation (suction operation) by the first liquid recovery mechanism 20 can be performed before starting the liquid supply by the liquid supply mechanism 10 (even in the state with liquid supply being suspended). As described above, the second liquid recovery mechanism 30 is driven all the time, and the suction operation via the second collection inlet 32 by the second liquid recovery mechanism 30 is performed all the time.

After a predetermined time has passed since the release of the first valve 13B and the liquid immersion area AR2 has been formed, the controller CONT irradiates the exposure light EL onto the substrate P in a state with the projection optical system PL facing the substrate P, so that the pattern image of the mask M is exposed on the substrate P via the projection optical system PL and the liquid LQ. Here, the reason why exposure is not performed until the predetermined time has passed since the release of the first valve 13B is that there is concern that bubbles generated due to the operation of the valve may be left in the liquid immersion area AR2 immediately after the release of the valve. When the substrate P is to be exposed, the controller CONT projection-exposes the pattern image of the mask M on the substrate P via the liquid LQ between the projection optical system PL and the substrate P and the projection optical system PL, while performing recovery of the liquid LQ by the first liquid recovery mechanism 20 and moving the substrate stage PST supporting the substrate P in the X-axis direction (in the scanning direction), concurrently with supply of the liquid LQ by the liquid supply mechanism 10.

The exposure apparatus EX in the embodiment is for projection-exposing the pattern image of the mask M, while moving the mask M and the substrate P in the X-axis direction (in the scanning direction). At the time of scanning exposure, a part of the pattern image of the mask M is projected in the projection area AR1 via the liquid LQ in the liquid immersion area AR2 and the projection optical system PL, and the substrate P moves in the +X direction (or −X direction) relative to the projection area AR1 at a speed of $\beta \cdot V$ ($\beta$ is projection magnification), synchronously with the movement of the mask M in the −X direction (or +X direction) at a speed of V. After finishing exposure on one shot area of a plurality of shot areas S1 to S24 set on the substrate P, the next shot area moves to a scanning start position by stepping movement of the substrate P, and thereafter, the scanning exposure process with respect to respective shot areas S1 to S24 is sequentially performed, while moving the substrate P according to the step and scan method. When a shot area set in the boundary area of the substrate P (for example, shot area S1, S4, S21, S24, or the like) is to be subjected to the liquid immersion exposure, the liquid LQ in the liquid immersion area AR2 larger than the projection area AR1 comes in contact with the upper face 51 of the substrate stage PST.

During the liquid immersion exposure, the property or composition (water quality) of the liquid LQ supplied on the substrate P by the liquid supply mechanism 10 is measured (monitored) by the measuring device 60 all the time. The measurement result of the measuring device 60 is output to the controller CONT, and the controller CONT stores the measurement result (monitor information) of the measuring device 60 in the storage device MRY (step SA3).

The controller CONT stores the measurement result of the measuring device 60 in correspondence with the time course, in the storage device MRY. The controller CONT can store the measurement result of the measuring device 60 in correspondence with the time course in the storage device MRY, for example, based on the output of the timer 13T, designating the time when the first valve 13B opens the flow channel of the supply pipe 13 as a measurement starting point (reference) of the time course. In the description below, information in which the measurement result of the measuring device 60 is stored in correspondence with the time course is referred to as "first log information".

The controller CONT further stores the measurement result of the measuring device 60 in correspondence with the shot areas S1 to S24 to be exposed, in the storage device MRY. The controller CONT can obtain position information of the shot areas S1 to S24 in the coordinate system specified by the laser interferometer 44, for example, based on the output of the laser interferometer 44, which measures the position of the substrate stage PST, and store the measurement result of the measuring device 60 at the time of exposing the shot area, whose position information has been obtained, in correspondence with the shot area in the storage device MRY. A timewise deviation corresponding to a distance between a sampling port (branch pipe) of the measuring device 60 and the supply outlet 12 occurs, between a point in time when the measuring device 60 measures the liquid LQ and a point in time when the measured liquid LQ is supplied onto the substrate P (shot area). Accordingly, the information to be stored in the storage device MRY needs to be corrected, taking the distance into consideration. In the description below, the information in which the measurement result of the measuring device 60 is stored in correspondence with the shot area is referred to as "second log information".

The controller CONT determines whether the measurement result of the measuring device 60 is abnormal (step SA4). The controller CONT then controls the exposure operation based on the determination result.

Here, the measurement result of the measuring device 60 being abnormal indicates a situation in which a measurement of respective items (specific resistance value, TOC, foreign matter, dissolved gas concentration, silica concentration, live bacteria, and the like) to be measured by the measuring device 60 is outside the tolerance, and the exposure process and the measurement process via the liquid LQ cannot be performed in a desired state. For example, when the specific resistance value of the liquid LQ is smaller than a tolerance (abnormal) (as one example, 18.2 MΩ·cm at 25° C.), there is a possibility that metal ions such as sodium ions may be contained in a large amount in the liquid LQ. If the liquid immersion area AR2 is formed on the substrate P with the liquid LQ containing metal ions in a large amount, there is a possibility that the metal ions in the liquid LQ infiltrate into a photosensitive material on the substrate P, and adhere on a device pattern (wiring pattern) already formed below the photosensitive material, thereby causing malfunction of the device. If the ions in the liquid LQ are seen individually, when the metal ions are contained larger than a tolerance (as one example, 3 ppt, more preferably, 1 ppt), when boron is contained larger than a tolerance (as one example, 3 ppt, more preferably, 1 ppt), when silica is contained larger than a tolerance (as one example, 1 ppt, more preferably, 0.75 ppt), or when anions are contained larger than a tolerance (as one example, 400 ppt), similar contamination occurs, and malfunction of the device may be caused. When the value of total organic carbon in the liquid LQ is larger than a tolerance (as one example, 5.0 ppb, more preferably, 1.0 ppb), there is a possibility that light transmittance of the liquid LQ might be decreased. In this case, the exposure accuracy via the liquid LQ and the measurement accuracy by the light measuring device via the liquid LQ deteriorate. Specifically, when the light transmittance of the liquid LQ decreases, the exposure amount on the substrate P changes, thereby causing a difference in an exposure line width to be formed on the substrate P. Moreover, due to a decrease in the light transmittance, the liquid LQ absorbs more optical energy by the decrease of the light transmittance, and hence, the liquid temperature increases. A difference is generated in the focal length of the projection optical system PL, resulting from the temperature increase. Thus, a decrease of the light transmittance of the liquid LQ causes a deterioration of the exposure accuracy. Therefore, taking these circumstances into consideration, a predetermined light transmittance is required for the liquid LQ, and the value of the total organic carbon (TOC) is specified corresponding thereto. As one example, the light transmittance required for the liquid LQ is equal to or higher than 99% per 1 mm of thickness of the liquid LQ, and the TOC required for the liquid LQ corresponding thereto is equal to or lower than 1.0 ppb. Moreover, when the amount of foreign matter including fine particles and bubbles in the liquid LQ is larger than a tolerance (abnormal) (as one example, 0.1 or more preferably 0.02 particles and bubbles having a size of 0.1 μm or larger are included in 1 milliliter), the possibility that a defect is caused in the pattern transferred to the substrate P via the liquid LQ increases. Furthermore, when the value of the dissolved gas including dissolved oxygen and dissolved nitrogen in the liquid LQ (dissolved gas concentration) is larger than a tolerance (abnormal) (as one example, 3 ppb or more preferably 1 ppb in the case of dissolved oxygen, and 3 ppm in the case of dissolved nitrogen), for example when the liquid LQ supplied onto the substrate P via the supply outlet 12 is released to the air, the possibility that bubbles are generated in the liquid LQ due to the dissolved gas in the liquid LQ increases. If bubbles are generated in the liquid LQ, the possibility that a defect is caused in the pattern transferred to the substrate P via the liquid LQ increases as well. When the amount of live bacteria is larger than a tolerance (abnormal) (as one example, 1.0 cfu/L, more preferably, 0.1 cfu/L), the liquid LQ is contaminated to deteriorate the light transmittance. Moreover, when the amount of live bacteria is large, the members coming in contact with the liquid LQ (nozzle member 70, optical element 2, substrate stage PST, supply pipe 13, recovery pipes 23 and 33, and the like) are also contaminated. When a photo acid generator (PAG) eluted from the resist is larger than a tolerance (as one example, $7.4 \times 10^{-13}$ mol/cm$^2$), and when amines are larger than a tolerance (as one example, $3.1 \times 10^{-13}$ mol/cm$^2$), a water mark may adhere to the optical element 2 of the projection optical system PL or cloudiness may be generated.

During the liquid immersion exposure (during supply of the liquid LQ), when determined that the measurement result of the measuring device 60 is normal, the controller CONT continues the liquid immersion operation (step SA5). On the other hand, during the liquid immersion exposure (during supply of the liquid LQ), when determined that the measurement result of the measuring device 60 is abnormal, the controller CONT stops the exposure operation (step SA6). At this time, the controller CONT can drive the first valve 13B to close the flow channel of the supply pipe 13, so as to suspend the supply of the liquid LQ. After suspending the exposure operation, the controller CONT may recover the liquid LQ remaining on the substrate P by using the first nozzle member 70 and the first liquid recovery mechanism 20. In this case, the recovered liquid LQ may be disposed of without being returned to the liquid supply device 11, and new liquid LQ may be injected to the liquid supply device 11 so as to replace the whole liquid LQ. Moreover, after the liquid LQ remaining on the substrate P is recovered, the substrate P may be carried out (unloaded) from the substrate stage PST. This can prevent an undesirable situation such as where defective shots (defective substrates) are formed in a large quantity resulting from continuance of the exposure process via the abnormal liquid LQ.

Furthermore, the controller CONT informs the measurement result (monitoring result) of the measuring device 60 by the notifying device INF (step SA7). For example, information relating to a variation amount of the TOC and the dissolved gas concentration in the liquid LQ with the lapse of time, and information relating to the TOC and the dissolved gas concentration in the liquid LQ at the time of exposing a shot area (for example, shot area S15) of the plurality of shot areas SI to S24 can be displayed by the notifying device INF including a display device. Moreover, when determining that the measurement result of the measuring device 60 is abnormal, the controller CONT can inform that the measurement result is abnormal by the notifying device INF, for example, by issuing an alarm (a warning) from the notifying device INF. Moreover, when the measuring device 60 has the same type of meters at a plurality of positions along the supply pipe 13, the controller CONT can specify in which section an abnormality has occurred based on the measurement results of these meters. The controller CONT then can inform that an abnormality has occurred in a certain section by the notifying device INF, to urge an investigation of the section, thereby enabling early recovery from the problem.

As described above, the liquid supply device 11 has the liquid reforming member and the liquid reformer, and includes a plurality of adjusting devices (pure water production unit 161, ultra-pure water production unit 162, degasifier 173, and filter 174 for regulating the water quality (property or composition) of the liquid LQ. The controller CONT can specify at least one adjusting device from these adjusting devices based on the measurement result of the measuring device 60, and inform information relating to the specified adjusting device by the notifying device INF. For example, when determining that the dissolved gas concentration is abnormal based on the measurement result of the DO meter or the DN meter of the measuring device 60, the controller CONT displays (informs) a display of a content urging maintenance (inspection and replacement) of, for example, the deaeration filter or the deaeration pump of the degasifier 173, of the plurality of adjusting devices by the notifying device INF. Moreover, when determining that the specific resistance value of the liquid LQ is abnormal based on the measurement result of the resistivity meter of the measuring device 60, the controller CONT displays (informs) a display of a content urging maintenance (inspection and replacement) of, for example, the pure water production device of the plurality of adjusting devices. When determining that the total organic carbon in the liquid LQ is abnormal based on the measurement result of the TOC meter of the measuring device 60, the controller CONT displays (informs) a display of a content urging maintenance (inspection and replacement) of, for example, the UV lamp of the pure water production device 16 of the plurality of adjusting devices. When determining that the amount of foreign matter (fine particles and bubbles) in the liquid LQ is abnormal based on the measurement result of the particle counter of the measuring device 60, the controller CONT displays (informs) a display of a content urging maintenance (inspection and replacement) of, for example, the filter 174 or the particle filter of the pure water production device 16 of the plurality of adjusting devices. When determining that the amount of live bacteria in the liquid LQ is abnormal based on the measurement result of the live bacteria analyzer of the measuring device 60, the controller CONT displays (informs) a display of a content urging maintenance (inspection and replacement) of, for example, the UV lamp of the pure water production device 16 of the plurality of adjusting devices. When determining that the concentration of silica in the liquid LQ is abnormal based on the measurement result of the silica meter of the measuring device 60, the controller CONT displays (informs) a display of a content urging maintenance (inspection and replacement) of, for example, the filter for removing silica of the pure water production device 16 of the plurality of adjusting devices. Furthermore, the controller CONT can control the valve 18B corresponding to the water quality (property or composition) of the liquid LQ, to suspend circulation of the liquid LQ. In this case, the controller CONT can control so as to recover and dispose of the whole contaminated liquid LQ, and inject new liquid LQ to the liquid supply device 11 so as to replace the liquid LQ in the system by the new liquid LQ.

The controller CONT can continue the exposure operation even when it determines that the liquid LQ has an abnormality. When the controller CONT determines that the measurement result of the particle counter of the measuring device 60 is abnormal at the time of exposing, for example, the shot area S15, the controller CONT stores the abnormal measurement result of the particle counter in correspondence with the shot area S15 as second log information in the storage device MRY. After all the shot areas S1 to S24 have been exposed, the controller CONT can remove the shot area S15 in which defective pattern transfer may have occurred due to the abnormality (existence of foreign matter) of the liquid LQ, or can control so that the shot area S15 is not exposed at the time of the next superposition exposure. When the shot area S15 is inspected and if there is no abnormality in the formed pattern, the controller CONT continues device formation using the shot area S15, without removing the shot area S15. Alternatively, the controller CONT can inform that the measurement result of the particle counter is abnormal, in correspondence with the shot area S15, by the notifying device INF. Thus, the controller CONT can display the log information by the notifying device INF, other than the configuration in which the measurement result of the measuring device 60 is displayed by the notifying device INF as the monitoring information on a real time basis.

Moreover, the controller CONT can control the exposure operation based on the measurement result of the measuring device 60. For example, as described above, before exposure of the substrate P, an exposure dose (illuminance) of the exposure light EL is measured by the light-measuring device 600 (step SA1), and after the exposure dose (illuminance) of the exposure light EL is optimally set (corrected) based on the measurement result, the exposure operation is started. However, during the exposure of the substrate P, the light transmittance of the liquid LQ may vary due to variations of the TOC in the liquid LQ. If the light transmittance of the liquid LQ changes, the exposure amount (accumulated exposure amount) on the substrate P changes, and as a result, there may be a problem such that there is a difference in the exposure line width of the device pattern to be formed in the shot areas. Therefore, a relation between the TOC in the liquid LQ and the light transmittance of the liquid LQ at that time is obtained and stored in advance in the storage device MRY, and the controller CONT controls the exposure amount based on the stored information and the measurement result of the measuring device 60 (the TOC meter 61), thereby enabling prevention of the problem. In other words, the controller CONT derives the light transmittance corresponding to the change of the TOC in the liquid LQ based on the stored information, and controls so as to keep the exposure amount on the substrate P constant. By controlling the exposure amount on the substrate P corresponding to the change of the TOC measured by the TOC meter 61, the exposure amount in the substrate (between shots) or between the substrates becomes constant, and hence, a difference in the exposure line width can be reduced.

The relation between the TOC and the light transmittance of the liquid LQ can be obtained by the measurement process via the liquid LQ using the light-measuring device 600. In the embodiment, since the laser is used as a light source of the exposure light EL, the exposure amount on the substrate P can be controlled by using a method for controlling the energy (luminous energy) per pulse or controlling the number of pulses. Alternatively, by controlling the scanning rate of the substrate P, the exposure amount on the substrate P can be controlled. The measuring operation using the light-measuring device 600 (step SA1) is performed during the exposure sequence, for every predetermined time interval, or for every predetermined number of substrates to be processed, and correction control of the exposure amount described above is performed between the measuring operations during the exposure sequence, and is reset for each measuring operation.

As described above, since the measuring device 60 for measuring at least one of the property and composition of the liquid LQ is provided, it can be determined whether the liquid LQ for forming the liquid immersion area AR2 is in a desired state (abnormal or not) based on the measurement result. When the measurement result of the measuring device 60 is abnormal, an appropriate measure for turning the liquid LQ into the desired state can be taken quickly, or by controlling the exposure operation, deterioration of the exposure accuracy can be prevented. Moreover, by turning the liquid LQ into the desired state based on the measurement result of the measuring device 60, the accuracy of the measurement process using the measuring member via the liquid LQ and the light-measuring device can be maintained.

For example, when it is determined that the specific resistance value of the liquid LQ is abnormal based on the measurement result of the resistivity meter 64, by promptly taking an appropriate measure (maintenance of the ion-exchange membrane or the like) for setting the specific resistance value to a desired value, a problem such as defective operation of the device can be prevented. Likewise, when it is determined that the value of total organic carbon in the liquid LQ is abnormal based on the measurement result of the TOC meter 61, by promptly taking an appropriate measure (maintenance of the UV lamp or the like) for setting the value of total organic carbon to a desired value, excellent exposure accuracy and measurement accuracy can be maintained. Moreover, when it is determined that the amount of foreign matter in the liquid LQ is abnormal based on the measurement result of the particle counter 62, by promptly taking an appropriate measure (maintenance of the particle filter or the like) for setting the amount of foreign matter to a desired value, occurrence of a problem such as where a defect occurs in the transferred pattern can be prevented. When it is determined that the value of the dissolved oxygen (dissolved nitrogen) in the liquid LQ is abnormal based on the measurement result of the DO meter 63 (or the DN meter), by promptly taking an appropriate measure (maintenance of the deaeration pump or the like) for setting the value of the dissolved oxygen (dissolved nitrogen) to a desired value, generation of bubbles can be prevented and occurrence of a problem such as where a defect occurs in the transferred pattern can be prevented. Likewise, by promptly taking an appropriate measure for setting the value of live bacteria to a desired value based on the analysis result of the live bacteria analyzer, or by promptly taking an appropriate measure for setting the value of silica concentration to a desired value based on the measurement result of the silica meter, the water quality of the liquid (pure water) can be maintained, and excellent exposure accuracy and measurement accuracy via the liquid LQ can be maintained.

Figure 6A:
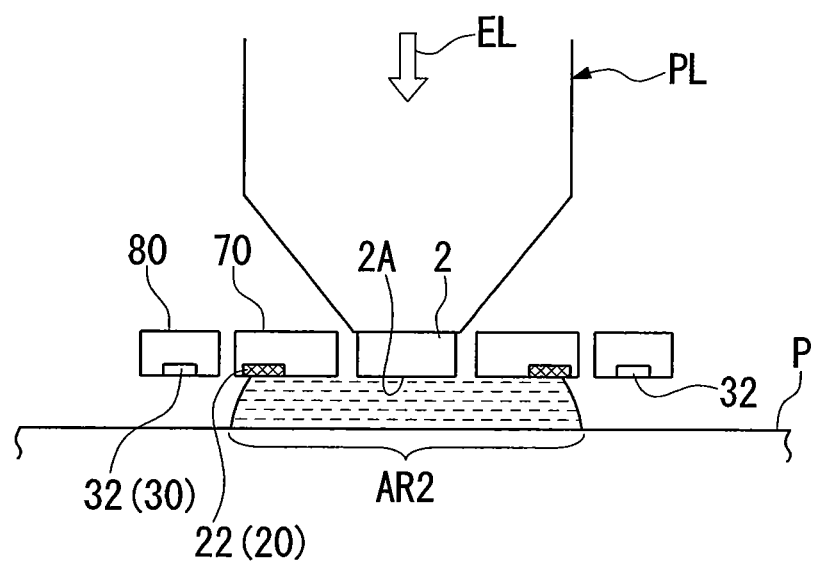
FIG. 6A is a diagram illustrating a liquid recovery operation by first and second liquid recovery mechanisms.
Figure 6B:
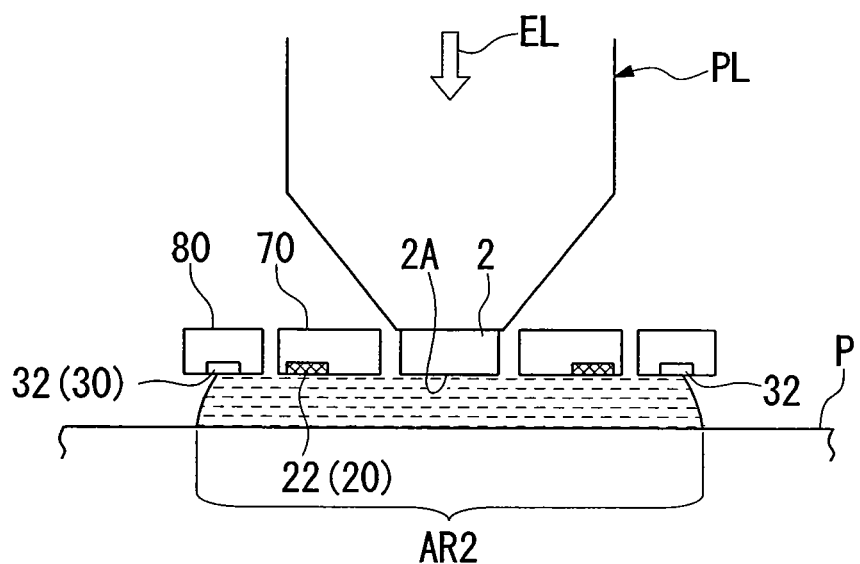
FIG. 6B is a diagram illustrating a liquid recovery operation by first and second liquid recovery mechanisms.

There is a possibility that the first liquid recovery mechanism 20 cannot recover all of the liquid LQ during the liquid immersion exposure of the substrate P, and the liquid LQ flows outside of the first collection inlet 22. Moreover, there is a possibility that the first liquid recovery mechanism 20 may have some abnormality and cannot perform the liquid recovery operation, or such a situation may occur that the liquid supply mechanism 10 has some abnormality and has a malfunction, thereby supplying the liquid LQ in a large amount and the liquid LQ cannot be recovered only by the first liquid recovery mechanism 20. In this case, the second liquid recovery mechanism 30 recovers the liquid LQ, which cannot be recovered by the first liquid recovery mechanism 20 and flows outside of the first collection inlet 22, via the second collection inlet 32. As shown in the diagram of FIG. 6A, when the first liquid recovery mechanism 20 can recover all of the liquid LQ, the liquid LQ is not recovered from the second collection inlet 32 of the second nozzle member 80, and only the gas (air) is recovered. On the other hand, as shown in the diagram of FIG. 6B, when the first liquid recovery mechanism 20 cannot recover all of the liquid LQ, and the liquid LQ flows outside of the first collection inlet 22, the liquid LQ is recovered together with the ambient gas from the second collection inlet 32 of the second nozzle member 80. By providing the second liquid recovery mechanism 30, outflow of the liquid LQ from on the substrate P (on the substrate stage PST) can be prevented. Therefore, generation of rust of the mechanical parts (members) and short circuit of the drive system (peripheral device) due to the effluent liquid LQ, or environmental change (humidity change and the like) of the environment where the substrate P is placed due to evaporation of the effluent liquid LQ can be prevented, thereby enabling prevention of deterioration of the exposure accuracy and measurement accuracy. Moreover, since the second liquid recovery mechanism 30 is driven all the time and is performing the recovery operation (suction operation) all the time, the liquid LQ can be reliably recovered.

In the embodiment, the first liquid recovery mechanism 20 has such a configuration that large vibrations do not occur at the time of recovering the liquid LQ, since it recovers only the liquid LQ. On the other hand, the second liquid recovery mechanism 30 has such a configuration that the liquid LQ is recovered together with the ambient gas, and hence, when the liquid LQ is recovered together with the ambient gas at the time of recovering the liquid LQ from the second collection inlet 32 of the second liquid recovery mechanism 30, there is a possibility that the recovered liquid LQ strikes against the recovery channel and the inner wall of the recovery pipe in a droplet form, thereby causing vibrations in the second nozzle member 80. If vibrations occur in the second nozzle member 80, there is a possibility that the vibrations are transmitted to the first nozzle member 70 via the lower step 8 of the main column 1, to vibrate the liquid immersion area AR2 of the liquid LQ coming in contact with the first nozzle member 70, thereby vibrating the substrate P and the substrate stage PST coming in contact with the liquid immersion area AR2.

As described above, though the second nozzle member 80 and the projection optical system PL are vibrationally separated from each other via the isolator 47, there is still a possibility that the vibrations occurring in the second nozzle member 80 may vibrate the projection optical system PL, to deteriorate the imaging characteristics via the projection optical system PL and the liquid LQ. Moreover, there is a possibility that the liquid LQ in the liquid immersion area AR2 vibrates due to the vibrations occurring in the second nozzle member 80, to thereby deteriorate the imaging characteristics due to the vibrations.

In the embodiment, the detector 90 detects (monitors) all the time whether the second liquid recovery mechanism 30 has recovered the liquid LQ, during the liquid immersion exposure and during the measuring operation via the liquid LQ (step SA1). The detection result of the detector 90 is output to the controller CONT, and the controller CONT stores the detection result of the detector 90 (monitoring information) in the storage device MRY (step SA8).

The controller CONT stores the detection result of the detector 90 in correspondence with the time course, in the storage device MRY. The controller CONT can store the detection result of the detector 90 in correspondence with the time course in the storage device MRY, for example, based on the output of the timer 13T, designating the time when the first valve 13B opens the flow channel of the supply pipe 13 as the measurement starting point (reference) of the time course. In the description below, information in which the detection result of the detector 90 is stored in correspondence with the time course is referred to as "third log information".

The controller CONT further stores the detection result of the detector 90 in correspondence with the shot areas S1 to S24 to be exposed, in the storage device MRY. The controller CONT can obtain position information of the shot areas S1 to S24 in the coordinate system specified by the laser interferometer 44, for example, based on the output of the laser interferometer 44, which measures the position of the substrate stage PST, and store the detection result of the detector 90 at the time of exposing the shot area, whose position information has been obtained, in correspondence with the shot area in the storage device MRY. A timewise deviation corresponding to a distance between a detection area of the detector 90 (corresponding to the transmission windows 93 and 94) and the second collection inlet 32 occurs, between a point in time when the liquid LQ on the substrate P (shot area) is recovered via the second collection inlet 32 and a point in time when the recovered liquid LQ flows in the recovery pipe 23 and is detected by the detector 90. Accordingly, the information to be stored in the storage device MRY needs to be corrected, taking the distance into consideration. In the description below, the information in which the detection result of the detector 90 is stored in correspondence with the shot area is referred to as "fourth log information".

Moreover, the detector 90 can detect a liquid recovery amount per unit time by the second liquid recovery mechanism 30. The controller CONT stores the information relating to the liquid recovery amount per unit time detected by the detector 90 in the storage device MRY. The information relating to the liquid recovery amount per unit time can be stored in correspondence with the time course as the third log information, or in correspondence with the shot area as the fourth log information.

Since the detector 90 which detects whether the second liquid recovery mechanism 30 has recovered the liquid LQ is provided, it can be determined whether the state at the time of performing the liquid immersion exposure is a desired state, based on the measurement result thereof. In other words, the controller CONT can determine whether vibrations have occurred accompanying the liquid recovery operation of the second liquid recovery mechanism 30 at the time of exposing the substrate P (shot area), based on the detection result of the detector 90. There is a high possibility that the pattern transfer accuracy may deteriorate in a shot area where the pattern image of the mask M is exposed in the state that vibrations are occurring. Accordingly, the controller CONT can take an appropriate measure so as not to produce a defective shot (defective substrate) or in order to maintain excellent exposure accuracy and measurement accuracy, based on the detection result of the detector 90.

The controller CONT determines whether the second liquid recovery mechanism 30 has recovered the liquid LQ based on the detection result of the detector 90 (step SA9). The controller CONT then controls the exposure operation based on the determination result. Specifically, when determining that the second liquid recovery mechanism 30 has not recovered the liquid LQ during the liquid immersion exposure (during supply of the liquid LQ), the controller CONT continues the liquid immersion exposure operation (step SA5). On the other hand, when determining that the second liquid recovery mechanism 30 has recovered the liquid LQ during the liquid immersion exposure (during supply of the liquid LQ), the controller CONT suspends the exposure operation (step SA6). The substrate P may be carried out (unloaded) from the substrate stage PST after suspension of the exposure operation. This can prevent an undesirable situation such as where defective shots (defective substrates) are formed in a large quantity resulting from continuance of the exposure process in the state that vibrations are occurring accompanying the liquid recovery operation of the second liquid recovery mechanism 30.

Alternatively, for example, when determining that the second liquid recovery mechanism 30 has recovered the liquid LQ based on the detection result of the detector 90, the controller CONT may suspend liquid supply from the liquid supply mechanism 10. When the second liquid recovery mechanism 30 has recovered the liquid LQ, there is a high possibility that the liquid LQ is flowing out. In this case, therefore, by suspending the liquid supply from the liquid supply mechanism 10, outflow of the liquid LQ can be prevented. Alternatively, when determining that the second liquid recovery mechanism 30 has recovered the liquid LQ, the controller CONT can suspend power supply, for example, to electrical equipment including an actuator (a linear motor) for driving the substrate stage PST. When the second liquid recovery mechanism 30 has recovered the liquid LQ, there is a high possibility that the liquid LQ is flowing out. In this case, therefore, by suspending power supply to the electrical equipment, occurrence of short circuit can be prevented, even if the effluent liquid LQ splashes onto the electrical equipment.

The controller CONT also informs the detection result (monitoring information) of the detector 90 by the notifying device INF (step SA7). For example, the controller CONT may issue an alarm (a warning) indicating that the second liquid recovery mechanism 30 has recovered the liquid LQ from the notifying device INF including an alarm system. Alternatively, the controller CONT can display the information relating to the liquid recovery amount per unit time by the second liquid recovery mechanism 30, or information relating to whether the second liquid recovery mechanism 30 has recovered the liquid LQ at the time of exposing a certain shot area (for example, the shot area S15) of the plurality of shot areas S1 to S24, by the notifying device INF including the display device.

Moreover, since the detector 90 can detect the liquid recovery amount per unit time by the second liquid recovery mechanism 30, the notifying device INF can also display the liquid recovery amount.

Furthermore, even when the controller CONT determines that the second liquid recovery mechanism 30 has recovered the liquid LQ, the controller CONT can continue the exposure operation. When determining that the second liquid recovery mechanism 30 has recovered the liquid LQ, for example, at the time of exposing the shot area S15, the controller CONT stores the information that the second liquid recovery mechanism 30 has recovered the liquid LQ in correspondence with the shot area S15 as the fourth log information in the storage device MRY. After all the shot areas S1 to S24 have been exposed, the controller CONT can remove the shot area S15, in which defective pattern transfer may have occurred due to liquid recovery by the second liquid recovery mechanism 30 (occurrence of vibrations), or can take a measure so that the shot area S15 is not exposed at the time of the next superposition exposure. When the shot area S15 is inspected and if there is no abnormality in the formed pattern, the controller CONT continues device formation using the shot area S15, without removing the shot area S15. Alternatively, the controller CONT can inform that the second liquid recovery mechanism 30 has recovered the liquid LQ at the time of exposing the shot area S15, in correspondence with the shot area S15 by the notifying device INF. Thus, the controller CONT can display the log information by the notifying device INF, other than the configuration in which the detection result of the detector 90 is displayed by the notifying device INF as the monitoring information on a real time basis.

In the case in which the exposure operation is continued even when the second liquid recovery mechanism 30 has recovered the liquid LQ, when the detector 90 detects that the second liquid recovery mechanism 30 has recovered the liquid LQ during exposure of the first shot area of the plurality of shot areas S1 to S24 set on the substrate P (for example, the shot area S15), the second shot area (S16) next to the first shot area (S15) may be exposed, after waiting until the detector 90 cannot detect the liquid anymore LQ. When the time while the second liquid recovery mechanism 30 is recovering the liquid LQ, that is, the time when vibrations are occurring is long (for example, several seconds) relative to the irradiation time (for example, several hundred milliseconds) of the exposure light EL with respect to one shot area, if a plurality of shot areas is continuously exposed, these shot areas are exposed in the state that vibrations are occurring. Therefore, waiting time is provided after the exposure of the first shot area, and after waiting until the detector 90 does not detect the liquid recovered by the second liquid recovery mechanism 30 (after waiting until the vibrations subside), the exposure operation with respect to the shot area is resumed, thereby suppressing the occurrence of a defective shot. For example, an acceleration sensor (vibration sensor) may be provided in the second nozzle member 80, and after the first shot area is exposed, the second shot area can be exposed after waiting until a detection value of the vibration sensor becomes equal to or lower than a tolerance.

After finishing the liquid immersion exposure with respect to the substrate P, the controller CONT stops the supply of the liquid LQ via the supply outlet 12 by the liquid supply mechanism 10. The controller CONT then recovers the liquid LQ remaining on the substrate P and the substrate stage PST via the first collection inlet 22 of the first liquid recovery mechanism 20 and the second collection inlet 32 of the second liquid recovery mechanism 30. After the recovery operation of the liquid LQ on the substrate P has finished, the substrate P subjected to the exposure process is unloaded from the substrate stage PST (step SA10).

After finishing the liquid immersion exposure, the controller CONT drives the third valve 9B to open the flow channel of the connection pipe 9, in the state with the flow channel of the supply pipe 13 being closed by the first valve 13B. This allows the liquid LQ flowing from the liquid supply device 11 including the temperature controller 17 to the supply pipe 13 to flow to the recovery pipe 23 via the connection pipe 9, and when it is not necessary to supply the liquid, the liquid LQ fed from the liquid supply device 11 is not supplied onto the substrate P, but is recovered by the liquid recovery device 21 via the recovery pipe 23.

After the exposed substrate P is unloaded from the substrate stage PST, a new substrate P to be exposed is loaded on the substrate stage PST. Then, the above described exposure sequence is repeated. The first to the fourth log information is accumulated and stored in the storage device MRY.

As described above, the first and the second log information relating to the property or composition (water quality) of the liquid LQ, and the third and the fourth log information relating to the liquid recovery operation (recovery situation) by the second liquid recovery mechanism 30 are stored in the storage device MRY. By using these pieces of log information, analysis of defective exposure (error) and control of the exposure apparatus EX can be performed (step SA11).

For example, based on the first and the second log information, respective adjusting devices constituting the liquid supply device 11 (the liquid reforming member and the liquid reformer) can be maintained (inspected and replaced) at an optimum timing. Moreover, based on the first and the second log information, the frequency of inspection and replacement can be set optimally corresponding to the respective adjusting devices. For example, when it is found from the first log information that the measurement value of the particle counter deteriorates with the lapse of time, optimal replacement timing (replacement frequency) of the particle filter can be predicted and optimally set based on the degree of changes of the measurement value with the lapse of time. Furthermore, the performance of the particle filter to be used can be optimally set based on the first log information. For example, when the measurement value of the particle counter deteriorates rapidly with the lapse of time, a high-performance particle filter is used, and when the measurement value of the particle counter does not change largely, a relatively low-performance (low price) particle filter can be used to reduce the cost.

Thus, by controlling the exposure apparatus EX based on the first and the second log information, the occurrence of a problem such as where excessive (unnecessary) maintenance is performed, thereby decreasing the operating ratio of the exposure apparatus, or on the contrary, maintenance is neglected, and the liquid LQ in the desired state cannot be supplied, can be prevented.

Since the first log information is water quality information associated with the time course, it can be specified from which point in time the water quality has deteriorated. Accordingly, the cause of generation of defective exposure can be analyzed in correspondence with the time course.

Moreover, the cause of problems (errors) such as defective exposure (pattern defect) can be analyzed by using the first and the second log information. Specifically, after the exposure of the substrate P, when the substrate P is inspected in a certain inspection process, which is post-processing thereof, the cause of the problem can be analyzed and specified by collating the inspection result with the first and the second log information, to perform analysis. For example, when defective exposure (pattern defect) has occurred in a large amount in a particular lot or in a particular shot area, the second log information is referred to, and when the measurement value of the particle counter at the time of exposing the lot (or the shot area) shows an abnormal value, it can be analyzed that the cause of the pattern defect is foreign matter (fine particles and bubbles). Thus, by analyzing the correlation between the pattern defect and the foreign matter based on the first and the second log information, the cause of the problem (pattern defect) can be specified. Based on the analysis result, an appropriate measure can be taken, such as replacing the particle filter or the deaeration filter so as not to generate a pattern defect. Likewise, by analyzing the correlation between defective device operation and the specific resistance value, and the correlation between the measurement value of light transmittance of the liquid LQ by the light measuring device and the TOC, by referring to the log information, the cause of various problems can be specified.

The controller CONT also controls the exposure operation and the measurement operation based on the first and the second log information. For example, when it is determined that the value of TOC deteriorates with the lapse of time based on the first log information, the exposure apparatus EX controls the exposure amount corresponding to the time course based on a value (variation) corresponding to the time course of the TOC stored as the first log information, thereby making the exposure amount constant between substrates P, to reduce a difference in the exposure line width. When the exposure amount is to be controlled, a method for controlling the energy (luminous energy) per pulse, a method for controlling the number of pulses, or a method for controlling the scanning speed of the substrate P can be employed.

The cause of problems (errors) such as defective exposure (a difference in line width) can be also analyzed by using the third and the fourth log information. If vibrations are generated accompanying the liquid recovery by the second liquid recovery mechanism 30, a difference (including a difference in line width in the substrate and a difference in line width in the shot) likely occurs in the exposure line width of the pattern. Specifically, after the exposure of the substrate P, when the substrate P is inspected in a certain inspection process, which is post-processing thereof, the cause of the problem can be analyzed and specified by collating the inspection result with the third and the fourth log information, to perform analysis. For example, when defective exposure (a difference in line width) has occurred in a large amount in a particular lot or in a particular shot area, the fourth log information is referred to, and when the second liquid recovery mechanism 30 recovers the liquid LQ at the time of exposing the lot (or the shot area), it can be analyzed that the cause of the pattern defect is vibrations generated accompanying the liquid recovery operation by the second liquid recovery mechanism 30. Thus, by analyzing the correlation between the detection result of the detector 90 (liquid recovery state of the second liquid recovery mechanism 30) stored as the third and the fourth log information and the changes in the line width, the influence of the liquid recovery operation by the second liquid recovery mechanism 30 on the exposure accuracy is determined, and the cause of the problem (difference in line width) can be specified.

If vibrations occur accompanying the liquid recovery by the second liquid recovery mechanism 30, accuracy of synchronous movement of the mask M (the mask stage MST) and the substrate P (the substrate stage PST) or registration accuracy between the image surface of the projection optical system PL via the liquid LQ and the surface of the substrate P (focus accuracy) deteriorates. Therefore, the information relating to the liquid recovery operation (recovery situation) of the second liquid recovery mechanism 30 is stored as the third and the fourth log information, and by analyzing the correlation between the detection result of the detector 90 (the liquid recovery situation of the second liquid recovery mechanism 30) and the accuracy of synchronous movement and the focus accuracy, the influence of the liquid recovery operation by the second liquid recovery mechanism 30 on the exposure accuracy is determined, whereby the cause of the problem (deterioration of the accuracy of synchronous movement and the focus accuracy) can be specified.

Based on the analysis result, an appropriate measure can be taken such that the liquid supply amount per unit time by the liquid supply mechanism 10 is changed, the liquid recovery amount per unit time by the first liquid recovery mechanism 20 is changed, or the moving speed (scanning speed) of the substrate P is changed, so as not to generate a difference in the line width or the like, more specifically, so that the second liquid recovery mechanism 30 does not recover the liquid LQ.

Since the third log information is the information relating to the liquid recovery operation of the second liquid recovery mechanism 30 associated with the time course, it can be specified at which point in time the liquid LQ has been recovered by the second liquid recovery mechanism 30. Therefore, the cause of generation of defective exposure can be analyzed associated with the time course.

As described above, when it is determined that the liquid LQ is abnormal or the second liquid recovery mechanism 30 is recovering the liquid during exposure of a particular shot area, based on the second log information or the fourth log information, the controller CONT can take a measure such that the particular shot area is removed, or the shot area is not exposed at the time of next superposition exposure. Alternatively, the controller CONT can output an instruction to perform more detailed inspection of the particular shot area than usual, to an inspection device which performs the inspection process.

As described above, the influence of the liquid recovery operation by the second liquid recovery mechanism 30 on the exposure accuracy (pattern transfer accuracy) can be determined by analyzing the correlation between the liquid recovery situation of the second liquid recovery mechanism 30 and changes in the line width, or the correlation between the accuracy of synchronous movement and the focus accuracy. As a result, the pattern transfer accuracy onto the substrate P when the second liquid recovery mechanism 30 recovers the liquid LQ can be obtained beforehand. Moreover, since the degree of deterioration of the pattern transfer accuracy changes corresponding to the liquid recovery amount per unit time by the second liquid recovery mechanism 30, pattern transfer accuracy corresponding to the liquid recovery amount can be obtained beforehand. By storing the information relating to the pattern transfer accuracy when the second liquid recovery mechanism 30 recovers the liquid LQ in the storage device MRY beforehand, the controller CONT can predict the pattern transfer accuracy in a shot area on the substrate P, to which the pattern of the mask M has been transferred when the second liquid recovery mechanism 30 recovers the liquid LQ, based on the detection result of the detector 90 and the memory information stored in the storage device MRY. Then the controller CONT can inform the predicted result by the notifying device INF. As a result, after the substrate P has been exposed, when it is predicted that the predicted pattern transfer accuracy is equal to or higher than the tolerance, thereby causing a defective shot, the controller CONT can take a measure such as removing the defective shot without going through the inspection process.

In the embodiment, for example, when it is desired to measure the constituents of the live bacteria in the liquid LQ, the supplied liquid LQ may be sampled at a predetermined timing, and the liquid LQ may be measured (analyzed) by using a measuring device (analyzer) provided separately from the exposure apparatus EX. Moreover, when fine particles, bubbles, or dissolved oxygen are to be measured, the liquid LQ may be sampled at a predetermined timing, and the liquid LQ may be measured by using the measuring device provided separately from the exposure apparatus EX. Alternatively, in the embodiment shown in FIG. 2, for example, a valve may be provided for each of the branch pipes 61K to 63K, and the valve may be operated to allow the liquid LQ flowing in the supply pipe 13 to flow into the measuring device 60 at a predetermined timing, so as to measure the liquid LQ intermittently. On the other hand, measurement by the measuring device 60 can be stabilized by supplying the liquid LQ flowing in the supply pipe 13 to the measuring device 60 all the time to measure the liquid continuously.

In the embodiment, the branch pipes 61K, 62K, 63K, and 64K are connected to the connection pipe 13 between the liquid supply device 11 and the first nozzle member 70, and the measuring device 60 measures the liquid LQ branched from the supply pipe 13. In this case, it is desired that the branch pipes are provided as close as possible to the first nozzle member 70 (the supply outlet 12).

In the embodiment, the branch pipes 61K, 62K, 63K, and 64K function as sampling ports for sampling the liquid LQ flowing in the supply pipe 13, and the measuring device 60 measures the liquid LQ sampled by using the branch channel provided somewhere in the supply pipe 13 between the temperature controller 17 and the first nozzle member 70. However, the sampling port may be fitted to, for example, near the supply outlet 12 of the first nozzle member 70, so that the measuring device 60 measures the liquid LQ flowing near the supply outlet 12. The sampling port may be provided between the pure water production device 16 and the temperature controller 17, immediately after the temperature controller 17 on the downstream side, or the sampling port may be provided in the connection pipe 9, so that the measuring device 60 measures the liquid LQ flowing in the connection pipe 9.

Figure 7:
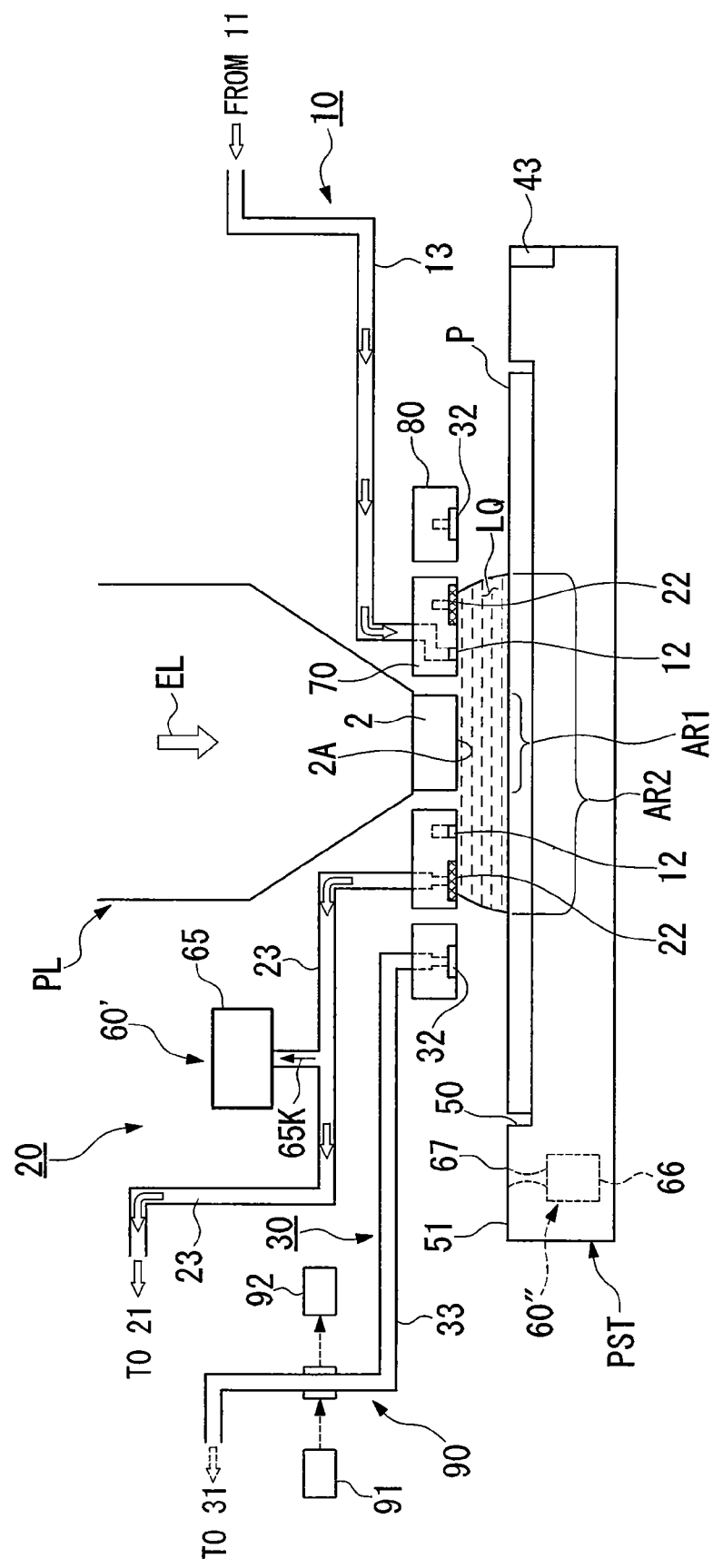
FIG. 7 is an enlarged diagram of the principal part of another embodiment of the exposure apparatus of the present invention.

Moreover, as shown in FIG. 7, the measuring device 60' may measure the liquid LQ recovered by the first liquid recovery mechanism 20. In FIG. 7, a meter 65 of the measuring device 60' is connected to a branch pipe 65K branched from somewhere along the recovery pipe 23 of the first liquid recovery mechanism 20. That is, in the example shown in FIG. 7, the sampling port of the measuring device 60' is provided in the recovery pipe 23. The meter 65 measures the liquid LQ coming in contact with the substrate P. There is a possibility that the liquid LQ coming in contact with the substrate P may contain eluates from a protection film referred to as a photoresist of a top coat provided on the substrate P. The meter 65 can measure the property and composition of the liquid LQ containing these eluates. Furthermore, the controller CONT can store the measurement result of the meter 65 in correspondence with the time course or the shot area in the storage device MRY as log information.

For example, the controller CONT can determine a change amount of the eluates with the lapse of time based on the log information. When the change amount considerably increases with the lapse of time, it can be determined that the photoresist is soluble relative to the liquid LQ. Furthermore, the controller CONT can determine acidity of the recovered liquid LQ. The liquid LQ having high acidity causes corrosion (rust) of members coming in contact with the liquid LQ, such as the recovery pipe 23. Therefore, the controller CONT informs a measurement result (log information) of the property or composition of the recovered liquid LQ, for example, by the notifying device INF, so as to take a measure such as urging review (change) of the type of the photoresist to be used.

Since the meter 65 measures the liquid LQ via the porous body 22P provided in the first collection inlet 22, impurities (live bacteria and the like) adhering to the porous body 22P and the recovery pipe 23 can be measured. When the liquid immersion exposure process is performed in a state with the impurities adhering to the porous body 22P or the like, the impurities adhering to the porous body 22P are mixed in the liquid immersion area AR2 formed on the substrate P, whereby the exposure accuracy may deteriorate. Therefore, the controller CONT informs the measurement result (log information) of the property or composition of the recovered liquid LQ, for example, by the notifying device INF, so as to take a measure such as urging replacement or cleaning of the porous body 22P.

As shown in FIG. 7, a measuring device 60" may be provided on the substrate stage PST. In FIG. 7, the measuring device 60" includes a meter 66 embedded in the substrate stage PST, and a sampling port (hole) 67 provided on the upper face 51 of the substrate stage PST. When the meter 66 measures the liquid LQ, the liquid immersion area AR2 of the liquid LQ is formed on the image surface side of the projection optical system PL, the liquid immersion area AR2 and the substrate stage PST are relatively moved so as to arrange the liquid immersion area AR2 above the sampling port 67, and the liquid LQ is allowed to flow to the sampling port 67. The meter 66 measures the liquid LQ obtained via the sampling port 67.

The controller CONT can supply a functional liquid LK from the liquid supply mechanism 10 to respective members coming in contact with the liquid LQ forming the liquid immersion area AR2, to clean these members. For example, if the liquid LQ is not in a desired state but is contaminated, for example, lots of live bacteria are contained in the liquid LQ, there is a possibility of contaminating the respective members coming in contact with the liquid LQ, specifically, the liquid contact face 70A of the first nozzle member 70, the liquid contact face 80A of the second nozzle member 80, the supply channel 14 and the first recovery channel 24 as inner channels of the first nozzle member 70, the second recovery channel 34 as the inner channel of the second nozzle member 80, the supply pipe 13 as a channel forming member coming in contact with the first nozzle member 70, the recovery pipe 33 connected to the second nozzle member 80, the liquid contact face 2A of the optical element 2, the upper face 51 of the substrate stage PST, and the measuring member 300 and the light measuring devices 400, 500, and 600 on the substrate stage PST. If these members are contaminated, even if the clean liquid LQ is supplied from the liquid supply device 11, the liquid LQ is contaminated due to the contact with these members, and if the liquid immersion area AR2 is formed by the contaminated liquid LQ, the exposure accuracy and the measurement accuracy via the liquid LQ deteriorate.

Therefore, for example, when the quantity of the live bacteria is larger than the tolerance based on the measurement result of the measuring device 60, the controller CONT supplies a functional liquid LK having a bactericidal action to the above described respective members from the functional liquid supply device (cleaning device) 120 constituting a part of the liquid supply mechanism 10, to thereby clean the respective members.

In the embodiment, in order to remove the live bacteria of the members coming in contact with the liquid, the functional liquid supply device 120 supplies the functional liquid LK having the bactericidal action. As the functional liquid LK having the bactericidal action, for example, hydrogen peroxide solution or liquid containing ozone can be mentioned.

Figure 8:
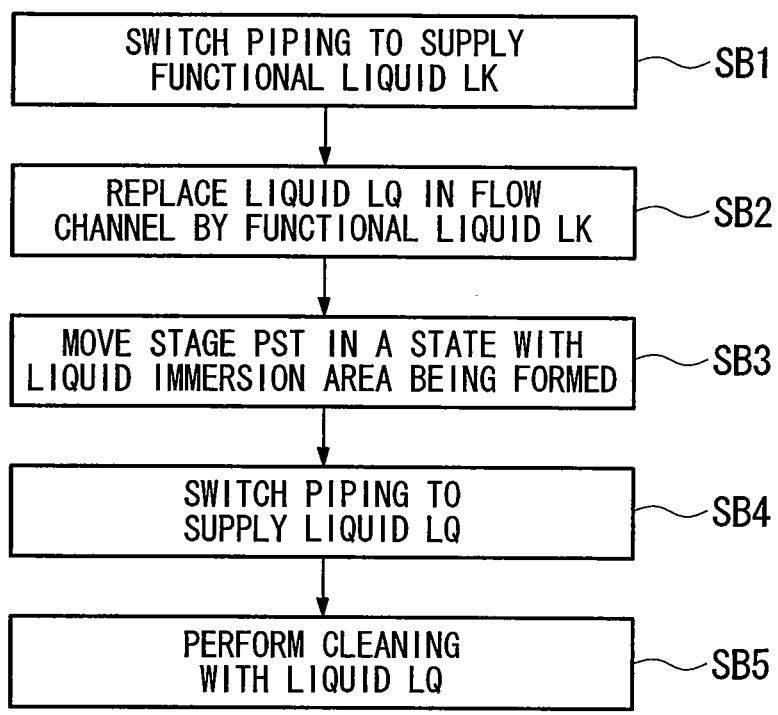
FIG. 8 is a flowchart showing one example of a maintenance method using a functional liquid.

A maintenance method using the functional liquid LK will be described below with reference to FIG. 8. At the time of cleaning the members, the controller CONT drives the valve 19B provided in the supply pipe 19 connecting the functional liquid supply device 120 and the liquid supply device 11, to open the flow channel of the supply pipe 19, and closes the flow channel of the return pipe 18 by the valve 18B. By this action, the functional liquid LK having the bactericidal action is supplied from the functional liquid supply device 120 to the liquid supply device 11 (step SB1). The functional liquid LK supplied from the functional liquid supply device 120 flows in the liquid supply device 11 including the pure water production device 16 and the temperature controller 17, then flows in the supply pipe 13 and the supply channel 14 of the first nozzle member 70, and is supplied to the image surface side of the projection optical system PL via the supply outlet 12. The functional liquid supply device 120 supplies the functional liquid LK to the flow channels (the supply pipe 13, the supply channel 14, and the like) constituting the liquid supply mechanism 10, through which the liquid LQ flows, to thereby clean these flow channels. However, when there is a member, which cannot allow the functional liquid LK to flow, in the flow channel, the member needs to be removed beforehand. Specifically, since the ion exchange membrane mounted on the pure water production unit 161 will be broken if the hydrogen peroxide solution passes therethrough, the ion exchange membrane is removed beforehand. The controller CONT instructs to remove the ion exchange membrane by the notifying device INF before driving the valve 19B.

When the functional liquid supply device 120 is supplying the functional liquid LK to the image surface side of the projection optical system PL, a dummy substrate DS is held on the substrate stage PST (the substrate holder PH). The dummy substrate DS has substantially the same size and shape as those of the substrate P for device production. In the embodiment, the dummy substrate DS has liquid repellency with respect to the functional liquid LK. The dummy substrate DS need not have liquid repellency with respect to the functional liquid LK. The functional liquid LK fed from the functional liquid supply device 120 is supplied onto the dummy substrate DS from the supply outlet 12, to form the liquid immersion area on the image surface side of the projection optical system PL. When the functional liquid supply device 120 is supplying the functional liquid LK, the first liquid recovery mechanism 20 and the second liquid recovery mechanism 30 are performing the liquid recovery operation (suction operation), similar to at the time of the liquid immersion exposure operation. Therefore, the functional liquid LK in the liquid immersion area formed on the image surface side of the projection optical system PL is recovered via the first collection inlet 22, flows in the first recovery channel 24 and the recovery pipe 23, and is then recovered by the first liquid recovery device 21. The controller CONT increases the supply amount of the functional liquid per unit time from the functional liquid supply device 120, or decreases the recovery amount of the functional liquid per unit time by the first liquid recovery mechanism 20, to thereby increase the liquid immersion area of the functional liquid LK, and the functional liquid LK in the liquid immersion area is recovered via the second collection inlet 32 of the second liquid recovery mechanism 30. By doing this, the functional liquid LK recovered via the second collection inlet 32 flows in the second recovery channel 34 and the recovery pipe 33, and is recovered by the second liquid recovery device 31. Thus, since the functional liquid LK flows in the flow channels of the first and the second liquid recovery mechanisms 20 and 30, these flow channels are cleaned. Moreover, the functional liquid LK recovered via the first and the second collection inlets 22 and 33 may be recovered by another recovery device separate from the first and the second liquid recovery devices 21 and 31, instead of being recovered by the first and the second liquid recovery devices 21 and 31. The be disposed of. Thus, the liquid LQ is replaced by the functional liquid LK (step SB2).

The functional liquid LK in the liquid immersion area formed on the image surface side of the projection optical system PL also comes in contact with the liquid contact face 2A of the optical element 2 and the liquid contact faces 70A and 80A of the nozzle members 70 and 80, and hence, these liquid contact faces 2A, 70A and 80A can be cleaned. Moreover, by two-dimensionally moving the substrate stage PST in the XY directions relative to the liquid immersion area, in a state with the liquid immersion area of the functional liquid LK being formed, the upper face 51 of the substrate stage PST, the measuring member 300, and the light measuring devices 400, 500, and 600 provided on the substrate stage PST can be cleaned (step SB3).

Thus, by performing the liquid immersion area-forming operation of the functional liquid LK in the same procedure as at the time of the liquid immersion exposure operation, the respective members can be efficiently cleaned simultaneously.

As the cleaning procedure using the functional liquid LK, after the functional liquid LK is supplied from the functional liquid supply device 120, supply and recovery operations of the functional liquid LK are continued for a predetermined time in the same procedure as at the time of the liquid immersion exposure operation, to thereby form the liquid immersion area of the functional liquid LK on the image surface side of the projection optical system PL. After heating the functional liquid LK, the functional liquid LK may be allowed to flow to the liquid supply mechanism 10 and the flow channels of the first and the second liquid recovery mechanisms 20 and 30. After a predetermined time has passed, the supply and recovery operations of the functional liquid LK are stopped. In this state, the functional liquid LK is held on the image surface side of the projection optical system PL, to form an immersion state. After the immersion state is maintained for a predetermined time, the controller CONT operates the valves 19B and 18B again to switch the piping channels, so as to supply the liquid LQ from the liquid supply device 11 to the supply pipe 13 (step SB4). The supply and recovery operations of the liquid LQ (for example, pure water) are performed for a predetermined time by the liquid supply mechanism 10 and the first and the second liquid recovery mechanisms 20 and 30, to thereby form the liquid immersion area of the liquid LQ on the image surface side of the projection optical system PL. As a result, the liquid LQ flows in respective flow channels of the liquid supply mechanism 10, the first liquid recovery mechanism 20, and the second liquid recovery mechanism 30, and the functional liquid LK remaining in the flow channels is washed away by the liquid LQ (step SB5). Moreover, the liquid contact face 2A of the optical element 2 and the liquid contact faces 70A and 80A of the nozzle members 70 and the second nozzle member 80 are also cleaned by the liquid immersion area of the pure water. At this time, since the substrate stage PST moves in the state with the liquid immersion area of the liquid LQ being formed, the functional liquid LK remaining on the upper face 51 of the substrate stage PST, the measuring member 300, and the light measuring devices 400, 500, and 600, with which the functional liquid LK has come in contact, are washed away by the liquid LQ.

After the cleaning process has finished, the liquid LQ is measured by the measuring device 60, whereby it can be confirmed whether the cleaning process has been performed satisfactorily, that is, whether the liquid LQ is in the desired state.

In the embodiment, the upper face 51 of the substrate stage PST has liquid repellency in order to suppress the outflow of the liquid LQ to the outside of the substrate P (outside of the upper face 51) during liquid immersion exposure, and to prevent an undesirable situation where the liquid LQ can be smoothly recovered after the liquid immersion exposure and the liquid LQ remains on the upper face 51. The upper face 51 is formed of a material having liquid repellency such as polytetrafluoroethylene (Teflon (registered trademark)). The upper face 51 may be made liquid-repellent by performing liquid-repellent processing, for example, applying a liquid-repellent material, such as a fluororesin material such as polytetrafluoroethylene, an acrylic resin material, or a silicon resin material, or by affixing a thin film formed of the above liquid-repellent materials.

The optical element 2 is formed of fluorite or quartz and the liquid contact face 2A of the optical element 2 has a lyophilic property. Moreover, the liquid contact face 70A of the first nozzle member 70 (and the liquid contact face 80A of the second nozzle member 80 according to circumstances) also has the lyophilic property. Since these liquid contact faces have the lyophilic property, the liquid can be satisfactorily held on the image surface side of the projection optical system PL, thereby forming the liquid immersion area. When lyophilic processing is performed with respect to the liquid contact faces 2A and 70A to make these faces lyophilic, for example, lyophilic materials such as $MgF_2$, $Al_2O_3$, or $SiO_2$ can be adhered (applied) thereto. Since the liquid LQ in the embodiment is water having large polarity, by forming a thin film with a material having a large molecular structure such as alcohol as the lyophilic processing (hydrophilic processing), a hydrophilic property can be given. It is desired that the functional liquid LK is formed of a material, which does not affect these liquid contact faces.

It is also desired that the functional liquid LK is formed of a material which does not affect the upper face 51 of the substrate stage PST and the liquid contact faces 2A, 70A, and 80A. When the upper face 51 of the substrate stage PST and the like are formed of a material having no tolerance with respect to the functional liquid LK having the bactericidal action, the liquid immersion area of the functional liquid LK can be formed on the image surface side of the projection optical system PL, in a state with the dummy substrate DS covering the whole area of the upper face 51 of the substrate stage PST, mounted on the substrate stage PST.

In the above embodiments, it is described that the operation of the liquid supply mechanism 10 including the functional liquid supply device 120 is controlled based on the measurement result of the measuring device 60, to perform the cleaning process. However, it is of course possible to have such a configuration that the cleaning process is performed, for example, at intervals of predetermined time (for example, every month, or every year), without depending on the measurement result of the measuring device 60. As a contamination source which contaminates the members coming in contact with the liquid LQ (the first nozzle member 70, the optical element 2, and the like), not only the contaminated liquid LQ, but also impurities floating in the air may adhere to these members, thereby contaminating the members. Even in such a case, by performing the cleaning process at intervals of predetermined time without depending on the measurement result of the measuring device 60, contamination of the members, and contamination of the liquid LQ coming contact with the members can be prevented.

In the above embodiments, a cleaning liquid having a bactericidal action (sterilizing function) is supplied as the functional liquid LK, however, foreign matter adhering to the members including the supply pipe 13 and the recovery pipe 23 can be removed by flushing hydrogen water as the functional liquid LK. By flushing the functional liquid (hydrogen water) having a foreign matter-removing function to remove the foreign matter at the time of the cleaning process, an undesirable situation where the foreign matter is mixed in the liquid immersion area AR2 can be prevented at the time of liquid immersion exposure. Moreover, by flushing carbon dioxide water as the functional liquid, electrical conductivity of the member including the supply pipe 13 and the recovery pipe 23 can be controlled. By flushing the functional liquid (carbon dioxide water) having a function of controlling the electrical conductivity, generation of static electricity from the members can be prevented, and charged members can be discharged. As a result, occurrence of defective exposure operation due to generation of static electricity (electrical noise) and breakdown due to static electricity of the pattern resulting from electrical discharge can be prevented.

In the above embodiments, the process for flushing the functional liquid LK (cleaning process) and the liquid immersion exposure process are executed separately. However, if the functional liquid LK can be used as the liquid for the liquid immersion exposure, the liquid immersion area AR2 for performing liquid immersion exposure can be formed by the functional liquid LK. In this case, the cleaning process and the liquid immersion exposure process are performed simultaneously.

In the above embodiments, the functional liquid supply device 120 supplies the functional liquid LK to the pure water production device 16. However, the configuration may be such that the functional liquid supply device 120 is connected to between the pure water production device 16 and the temperature controller 17, and a valve for preventing the functional liquid LK from flowing backward to the pure water production device 16 is provided, so as to supply the functional liquid LK to the downstream of the temperature controller 17. According to this configuration, at the time of supplying the functional liquid LK, the ion exchange membrane of the pure water production device 16 need not be removed.

The liquid LQ in the above embodiments is constituted by pure water. Pure water has the advantage that it is easily available in bulk in, e.g., semiconductor manufacturing factories and also the advantage that it does not adversely affect photoresist on the substrate P, optical elements (lenses), etc.

Further, pure water does not adversely affect the environment and contains scarcely any impurities; thus, the effect that it cleans the surface of the substrate P and the surface of the optical element provided at the end portion of projection optical system PL can be expected. When the purity of the pure water supplied from the factories or the like is low, the exposure apparatus may include an ultra-pure water production device.

It is generally said that the refractive index n of pure water (water) relative to the exposure light EL having a wavelength of about 193 nm is approximately 1.44, and thus when the ArF excimer laser light (wavelength of 193 nm) is used as the light source of the exposure light EL, the wavelength of the exposure light is effectively shortened, on the substrate P, as if multiplied by 1/n, i.e., effectively becomes approximately 134 nm, and thus, a high resolution can be obtained. Further, since the depth of focus increases by approximately n times, i.e., approximately by 1.44 times, compared with that in the air, when securing of the depth of focus on par with the depth of focus realized when the projection optical system is used in the air suffices, the numerical aperture of the projection optical system PL can be further increased; which also improves the resolution.

When the liquid immersion method is used as described above, the numerical aperture NA of the projection optical system PL may become 0.9 to 1.3. When the numerical aperture NA of the projection optical system PL becomes large, random-polarized light conventionally used as the exposure light may, because of its polarization effect, adversely affect the imaging performance; thus, a polarized light illumination method is preferably used. In this case, it is preferable that by performing linearly polarized light illumination in which the longitudinal direction of the line pattern of the line-and-space pattern on the mask (reticle) is aligned with the polarization direction, S polarization components (TE polarization components), that is, diffracted lights of the polarization components having the polarization direction in line with the longitudinal direction of the line pattern are emitted in large quantities from the pattern of the mask (reticle). When the space between the projection optical system PL and the resist applied to the surface of the substrate P is filled with the liquid, the transmittance at the resist surface of the diffracted lights from S polarization components (TE polarization components), which contribute to the improvement of the contrast, is higher compared with the case where the space between the projection optical system PL and the resist applied to the surface of the substrate P is filled with the air (gas). Therefore a high imaging performance can be obtained even in the case where the numerical aperture NA of the projection optical system is over 1.0. When a phase shift mask and an oblique-incidence illumination system (particularly, a dipole illumination system) matched with the longitudinal direction of the line pattern, as disclosed in Japanese Unexamined Patent Application, First Publication No. H06-188169, and the like are appropriately combined, it works more effectively. The combination of the linearly polarized light illumination system and the dipole illumination system is particularly effective, when the periodic direction of the line-and-space pattern is limited to a predetermined one direction, or when the hole patterns are overcrowded along a predetermined one direction. For example, when a halftone-type phase shift mask (a pattern having a half pitch of about 45 nm) having a transmittance of 6% is illuminated by using both the linearly polarized light illumination system and the dipole illumination system, if it is assumed that illumination a regulated by a two-beam circumcircle forming a dipole on a pupil plane of the illumination system is 0.95, a radius of respective beams on the pupil plane is 0.125σ, and the numerical aperture NA of the projection optical system PL is 1.2, the depth of focus (DOF) can be increased by about 150 nm, more than for a case of using random-polarized light.

For example, when the ArF excimer laser light is used as the exposure light, and a fine line-and-space pattern (for example, line-and-space of about 25 to 50 nm) is exposed on the substrate P by using the projection optical system PL having a reduction magnification of about ¼, the mask M acts as a polarizing plate due to a wave guide effect depending on the structure of the mask M (for example, fineness of the pattern and thickness of chrome), and hence, the diffracted lights from the S polarization components (TE polarization components) are emitted from the mask M in larger quantities than the diffracted light from P polarization components (TM polarization components), which decreases contrast. In this case, it is desired to use the linearly polarized light illumination, however, even by illuminating the mask M by the random-polarized light, high resolution performance can be obtained, even when the numerical aperture NA of the projection optical system PL is as large as 0.9 to 1.3.

When an extra fine line-and-space pattern on the mask M is exposed on the substrate P, there is a possibility that the P polarization components (TM polarization components) increases more than the S polarization components (TE polarization components) due to a wire grid effect. However, for example, when the ArF excimer laser light is used as the exposure light, and a line-and-space pattern larger than 25 nm is exposed on the substrate P by using the projection optical system PL having a reduction magnification of about ¼, the diffracted lights from the S polarization components (TE polarization components) are emitted from the mask M in larger quantities than the diffracted light from P polarization components (TM polarization components). As a result, high resolution performance can be obtained, even when the numerical aperture NA of the projection optical system PL is as large as 0.9 to 1.3.

Moreover, not only the linearly polarized light illumination (S polarized light illumination) matched with the longitudinal direction of the line pattern of the mask (reticle), but also as disclosed in Japanese Unexamined Patent Application, First Publication No. H06-53120, a combination of a polarized light illumination system which linearly polarizes in a tangential (circumferential) direction of a circle centering on the optical axis and the oblique-incidence illumination system are effective. Particularly, when a line pattern in which the pattern of the mask (reticle) extends in a predetermined one direction and a line pattern extending in a plurality of different directions are intermingled (a line-and-space pattern having a different periodic direction is intermingled), then as disclosed in Japanese Unexamined Patent Application, First Publication No. H06-53120, by using the polarized light illumination system which linearly polarizes in the tangential direction of the circle centering on the optical axis and an annular illumination system together, high imaging performance can be obtained, even when the numerical aperture NA of the projection optical system is large. For example, when the halftone-type phase shift mask (a pattern having a half pitch of about 63 nm) having a transmittance of 6% is illuminated by using both the polarized light illumination system which linearly polarizes in the tangential direction of the circle centering on the optical axis and the annular illumination system (zone ratio: ¾), if it is assumed that illumination σ is 0.95 and the numerical aperture NA of the projection optical system PL is 1.0, the depth of focus (DOF) can be increased by about 250 nm, more than for a case of using the random-polarized light. In the case of a pattern having a half pitch of about 55 nm and the numerical aperture NA of the projection optical system PL being 1.2, the depth of focus (DOF) can be increased by about 100 nm.

In the above embodiments, the optical element (lens) 2 is attached to the end of the projection optical system PL, and with the aid of this lens, the optical characteristics of the projection optical system PL, for example, aberration (spherical aberration, coma aberration, etc.) can be adjusted. In the above respective embodiments, the configuration is such that the optical path space on the emission side of the optical element 2 of the projection optical system PL is filled with the liquid LQ to expose the substrate P. However, as disclosed in PCT International Publication No. WO 2004/019128, both of the optical path space on the incident side and the optical path space on the emission side of optical element 2 of the projection optical system PL may be filled with the liquid LQ. In this case, a part or all of the matters described in the above embodiments may be applied to the liquid LQ to be filled in the optical path space on the incident side of the optical element 2. For example, the property or composition of the liquid LQ to be supplied to the incident side of the optical element 2 can be controlled as in the liquid LQ to be supplied to the emission side. Alternatively, a control value of the property or composition of the liquid LQ is made different between the incident side and the emission side of the optical element 2, taking into consideration a difference of influence on the exposure performance, so as to control the property or composition of the liquid LQ independently. The functional liquid LK may be introduced also to the incident side of the optical element 2, so as to perform cleaning and discharge. As the optical element to be attached to the end of the projection optical system PL, an optical plate used for the adjustment of the optical characteristics of the projection optical system PL may be utilized. Alternatively, a plane parallel plate that can transmit exposure light EL may be utilized.

If the pressure, caused by the flow of the liquid LQ, of the space between the optical element located at the end of the projection optical system PL and the substrate P is high, the optical element may be rigidly fixed so as not to move due to the pressure, instead of making the optical element replaceable.

In the embodiments, the configuration is such that the space between the projection optical system PL and the surface of the substrate P is filled with the liquid LQ, however the configuration may also be, for example, such that the space is filled with the liquid LQ in the state that a cover glass constituted by a plane parallel plate is attached to the surface of the substrate P In the embodiments, the liquid LQ is water, but the liquid LQ may be a liquid other than water. For example, when the light source of the exposure light EL is an $F_2$ laser, the $F_2$ laser light does not transmit through water, and thus, as the liquid LQ, a fluorofluid that can transmit the $F_2$ laser light, such as perfluoropolyether (PFPE) or fluorochemical oil, may be used. In this case, a thin film is formed on a portion coming in contact with liquid LQ with a material having a molecular structure having small polarity, for example, containing fluorine, to perform lyophilic processing. Further, as the liquid LQ, a material (e.g., cedar oil) that can transmit the exposure light EL, has a high refractive index as high as practicable, and does not affect the projection optical system PL and the photoresist applied to the surface of substrate P can also be used. Also in this case, the surface treatment is applied in accordance with the polarity of the liquid LQ to be used.

As for the substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer), etc. used in the exposure apparatus can be used.

As for the exposure apparatus EX, in addition to a scan type exposure apparatus (scanning stepper) of a step-and-scan method in which while synchronously moving the mask M and the substrate P, the pattern of the mask M is scan-exposed, a step-and-repeat type projection exposure apparatus (stepper) in which the pattern of the mask M is exposed in a batch in the state with the mask M and the substrate P being stationary, and the substrate P is successively moved stepwise can be used.

Moreover, as for the exposure apparatus EX, the present invention can be applied to an exposure apparatus EX of a method in which a reduced image of a first pattern is exposed in a batch on the substrate P by using the projection optical system (for example, a refractive projection optical system having, for example, a reduction magnification of ⅛, which does not include a reflecting element), in the state with the first pattern and the substrate P being substantially stationary. In this case, the present invention can be also applied to a stitch type batch exposure apparatus in which after the reduced image of the first pattern is exposed in a batch, a reduced image of a second pattern is exposed in a batch on the substrate P, partially overlapped on the first pattern by using the projection optical system, in the state with the second pattern and the substrate P being substantially stationary. As the stitch type exposure apparatus, a step-and-stitch type exposure apparatus in which at least two patterns are transferred onto the substrate P in a partially overlapping manner, and the substrate P is sequentially moved, can be used.

Further, the present invention can be applied to a twin stage type exposure apparatus as disclosed in Japanese Unexamined Patent Application, First Publication No. H10-163099, Japanese Unexamined Patent Application, First Publication No. H10-214783, and Published Japanese Translation No. 2000-505958 of PCT International Application.

In the above embodiments, an exposure apparatus in which the liquid is locally filled in the space between the projection optical system PL and the substrate P is used. However, the present invention can be also applied to a liquid immersion exposure apparatus in which a stage holding a substrate to be exposed is moved in a liquid tank, as disclosed in Japanese Unexamined Patent Application, First Publication No. H06-124873.

As the type of the exposure apparatus EX, the present invention is not limited to an exposure apparatus which exposes a semiconductor pattern onto the substrate P, for manufacturing semiconductor devices, but can also be applied to a variety of exposure apparatuses, e.g., an exposure apparatus for manufacturing liquid crystal display devices or displays, an exposure apparatus for manufacturing thin film magnetic heads, and an exposure apparatus for manufacturing image pickup devices (CCD), reticles or masks.

When using a linear motor (see U.S. Pat. Nos. 5,623,853 or 5,528,118) for the substrate stage PST and/or the mask stage MST, either air-floating type linear motor using an air bearing, or a magnetic levitation type linear motor using a Lorentz force or reactance force may be used. Further, each of the substrate stage PST and the mask stage MST may be either of a type moving along a guide, or of a guideless type having no guide.

As for the driving mechanism for each of the substrate stage PST and the mask stage MST, a planar motor in which by making a magnet unit in which magnets are two-dimensionally arranged and an armature unit in which coils are two-dimensionally arranged face each other, each of the substrate stage PST and the mask stage MST is driven by an electromagnetic force, may be used. In this case, either one of the magnet unit and the armature unit is attached to the stage PST and the stage MST, and the other unit is attached to the moving surface side of the stage PST or the stage MST A reaction force generated by the movement of the substrate stage PST may be, as described in Japanese Unexamined Patent Application, First Publication No. H08-166475 (U.S. Pat. No. 5,528,118), mechanically released to the floor (earth) by use of a frame member so that the force does not transmit to the projection optical system PL.

A reaction force generated by the movement of the mask stage MST may be, as described in Japanese Unexamined Patent Application, First Publication No. H08-330224 (U.S. patent application Ser. No. 08/416,558), mechanically released to the floor (earth) by use of a frame member so that the force does not transmit to the projection optical system PL.

The exposure apparatus EX according to the embodiments of the present application is built by assembling various subsystems, including each element listed in the claims of the present application, in such a manner that prescribed mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy.

The process of assembling each subsystem into the exposure apparatus includes mechanical interfaces, electrical circuit wiring connections, and air pressure plumbing connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that the above accuracies are maintained in the complete exposure apparatus. Additionally, it is desirable to manufacture the exposure apparatus in a clean room, in which the temperature, purity, etc. are controlled.

Figure 9:
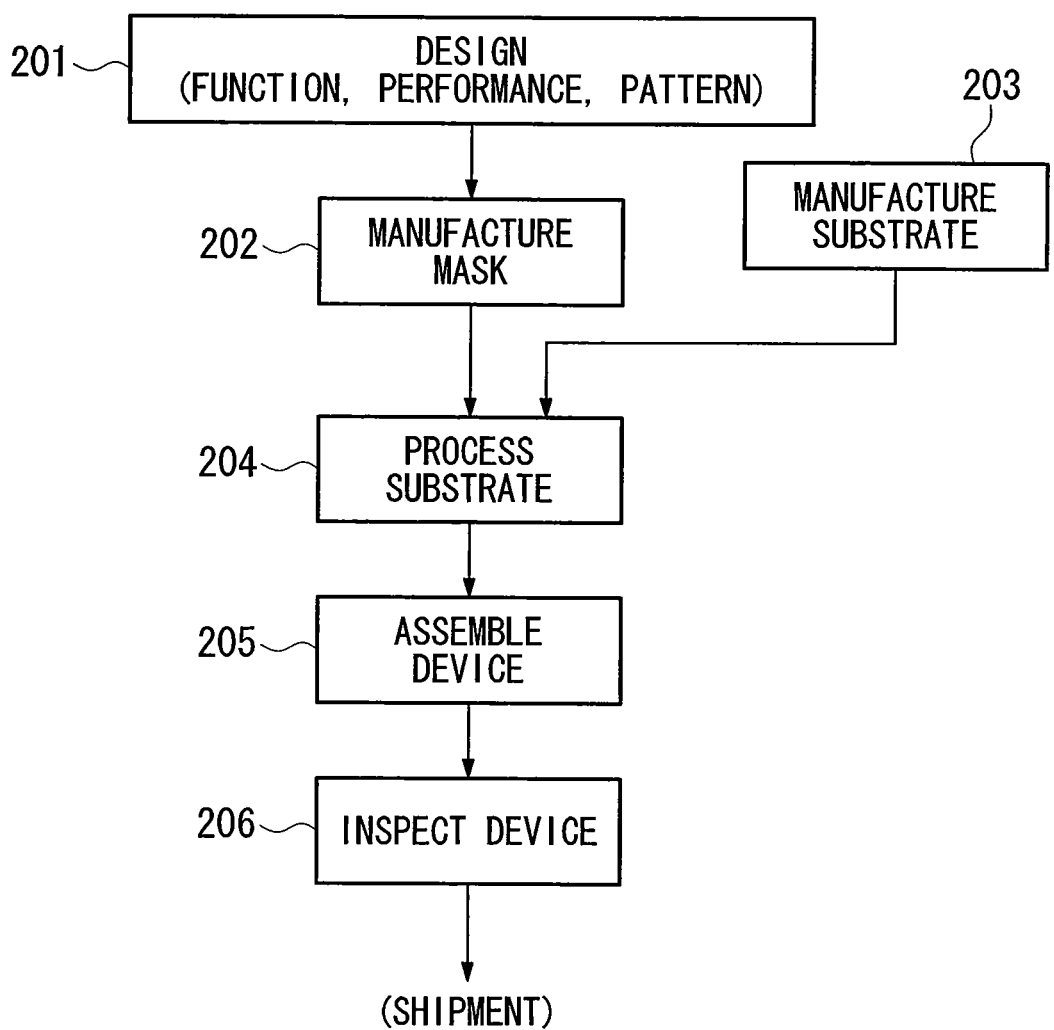
FIG. 9 is a flowchart showing one example of a manufacturing process of semiconductor devices.
Figure 10:
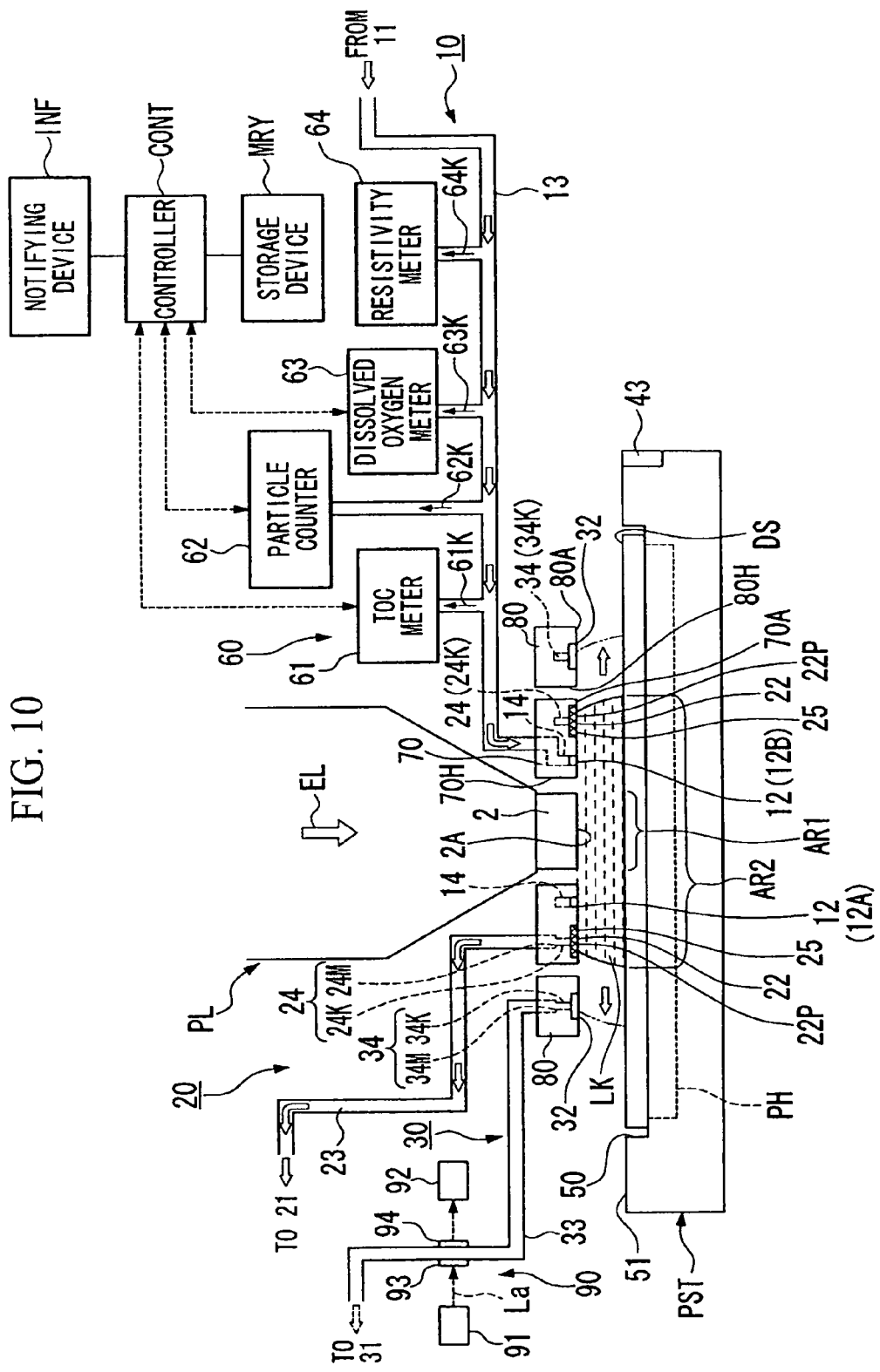
FIG. 10 is an enlarged diagram showing a dummy substrate held on the substrate stage during a cleaning operation.

As shown in FIG. 9, micro devices such as semiconductor devices are manufactured by a series of steps, including: a step 201 in which the micro device's function and performance design is performed; a step 202 in which a mask (reticle) is manufactured based on the design step; a step 203 in which a substrate, the device's base material, is manufactured; a substrate process step 204 in which the mask pattern is exposed onto the substrate by the exposure apparatus EX according to the above-described embodiments; a device assembly step 205 (including the dicing process, bonding process, and packaging process); and an inspection step 206.

The invention claimed is:

1. A cleaning method used in a lithographic apparatus in which a substrate held on a holding portion of a substrate table is exposed by projecting a patterned beam of radiation from a projection system onto the substrate through an immersion liquid that is supplied by a supply unit and that covers a portion of a surface of the substrate during the exposure, the method comprising:
    moving the substrate table in a state in which the substrate is not held on the holding portion of the substrate table and in which an object, that is not subjected to an exposure for device-manufacturing, is held on the holding portion in place of the substrate; and
    cleaning a measurement portion of the substrate table using a cleaning liquid, that is different from the immersion liquid, supplied by the supply unit onto the substrate table when the substrate table is in the state in which the substrate is not held on the holding portion and in which the object is held on the holding portion in place of the substrate, the measurement portion being used for a measurement and the measurement portion being different from the holding portion,
    wherein the cleaning liquid removes foreign matter from the measurement portion.

2. The method according to claim 1, further comprising cleaning an upper surface of the substrate table using the cleaning liquid.

3. The method according to claim 1, wherein the measurement portion includes a measurement member of the substrate table.

4. The method according to claim 1, wherein the measurement portion includes a light-measuring portion of the substrate table.

5. The method according to claim 1, wherein the cleaning of the measurement portion of the substrate table includes moving the substrate table.

6. The method according to claim 1, further comprising performing a further cleaning process by supplying the immersion liquid to a space between the projection system and the substrate table, after cleaning the measurement portion of the substrate table using the cleaning liquid.

7. The method according to claim 1, further comprising cleaning the substrate table using the immersion liquid, after cleaning the measurement portion of the substrate table using the cleaning liquid.

8. The method according to claim 7, wherein the cleaning of the substrate table with the immersion liquid includes moving the substrate table.

9. The method according to claim 1, wherein the cleaning liquid comprises a dissolved gas.

10. The method according to claim 9, wherein the gas includes oxygen, ozone, hydrogen, or carbon dioxide.

11. The method according to claim 1, wherein the cleaning liquid includes hydrogen peroxide solution, a liquid including ozone, hydrogen water, or carbon dioxide water.

12. The method according to claim 1, wherein the cleaning liquid has a bactericidal action.

13. The method according to claim 1, further comprising:
    unloading the exposed substrate from the holding portion of the substrate table; and
    holding the object on the holding portion of the substrate table when the measurement portion of the substrate table is cleaned using the cleaning liquid, the object being shaped like the substrate and the object having liquid-repellancy for the cleaning liquid.

14. The method according to claim 1, wherein the object includes a dummy substrate.

15. The method according to claim 1, wherein the cleaning of the substrate table is performed at intervals of predetermined time.

16. The method according to claim 1, wherein the cleaning liquid is supplied to a space between a final optical element of the projection system and the substrate table.

17. The method according to claim 1, wherein the cleaning liquid is supplied from a supply opening that supplies the immersion liquid.

18. The method according to claim 1, further comprising:
    unloading the exposed substrate from the holding portion of the substrate table; and holding the object on the holding portion of the substrate table when the measurement portion of the substrate table is cleaned using the cleaning liquid,
wherein the measurement portion of the substrate table is not covered by the object held on the holding portion during the cleaning.

19. The method according to claim 1, wherein the immersion liquid and the cleaning liquid are supplied at different times.

20. The method according to claim 19, wherein the supply unit has a supply opening from which the immersion liquid and the cleaning liquid are supplied.

21. The method according to claim 1, wherein the cleaning liquid removes organisms.

22. The method according to claim 1, wherein the supply unit includes a nozzle member having an aperture through which the patterned beam is projected during the exposure.

23. The method according to claim 22, wherein the nozzle member has a supply opening from which the cleaning liquid is supplied and which faces downwardly.

24. The method according to claim 23, wherein the cleaning liquid and the immersion liquid are supplied from the supply opening at different times.

25. A method for making a lithographic apparatus, the method comprising:

providing a substrate table having a holding portion on which a substrate is held;

providing a supply unit;

providing a projection system having a final optical element, a patterned beam of radiation being projected onto the substrate through an immersion liquid, the immersion liquid being supplied by the supply unit between the final optical element of the projection system and the substrate and covering a portion of a surface of the substrate; and providing a cleaning device, which cleans a measurement portion of the substrate table using a cleaning liquid supplied by the supply unit, that is different from the immersion liquid, onto the substrate table in a state in which the substrate is not held on the holding portion of the substrate table and in which an object, that is not subjected to an exposure for device-manufacturing, is held on the holding portion in place of the substrate, the measurement portion of the substrate table being used for a measurement and the measurement portion being different from the holding portion, wherein the cleaning liquid removes foreign matter from the measurement portion.

* * * * *